(12) United States Patent
Nakamura

(10) Patent No.: US 7,417,206 B2
(45) Date of Patent: Aug. 26, 2008

(54) HEATER, WAFER HEATING APPARATUS AND METHOD FOR MANUFACTURING HEATER

(75) Inventor: Tsunehiko Nakamura, Kokubu (JP)

(73) Assignee: Kyocera Corporation, Kyoto (JP)

( * ) Notice: Subject to any disclaimer, the term of this patent is extended or adjusted under 35 U.S.C. 154(b) by 29 days.

(21) Appl. No.: 11/238,641

(22) Filed: Sep. 29, 2005

(65) Prior Publication Data

US 2006/0096972 A1    May 11, 2006

(30) Foreign Application Priority Data

Oct. 28, 2004  (JP) ............................ P2004-313838
Mar. 28, 2005  (JP) ............................ P2005-092184

(51) Int. Cl.
*H05B 3/68* (2006.01)
*H05B 3/50* (2006.01)

(52) U.S. Cl. .................................... 219/444.1; 219/544

(58) Field of Classification Search ... 219/443.1–468.2, 219/538–548; 118/724, 725
See application file for complete search history.

(56) References Cited

U.S. PATENT DOCUMENTS

| | | | | |
|---|---|---|---|---|
| 2,409,244 | A | * | 10/1946 | Bilan ....................... 219/468.1 |
| 5,490,228 | A | | 2/1996 | Soma et al. |
| 5,616,024 | A | | 4/1997 | Nobori et al. |
| 6,080,970 | A | | 6/2000 | Yoshida et al. |
| 6,437,296 | B1 | * | 8/2002 | Choi ....................... 219/444.1 |
| 6,465,763 | B1 | * | 10/2002 | Ito et al. .................. 219/444.1 |
| 6,653,603 | B2 | | 11/2003 | Yamaguchi |
| 6,686,570 | B2 | | 2/2004 | Furukawa et al. |
| 6,746,972 | B1 | | 6/2004 | Kim et al. |
| 6,753,507 | B2 | * | 6/2004 | Fure et al. ................. 219/444.1 |
| 6,849,938 | B2 | | 2/2005 | Ito |
| 6,960,743 | B2 | | 11/2005 | Hiramatsu et al. |
| 7,071,551 | B2 | * | 7/2006 | Hiramatsu et al. .......... 257/710 |
| 2002/0043528 | A1 | | 4/2002 | Ito |

(Continued)

FOREIGN PATENT DOCUMENTS

CN          1662105 A          8/2005

(Continued)

OTHER PUBLICATIONS

Chinese language office action and its English translation for corresponding Chinese application No. 200510107141.4 lists the references above.

*Primary Examiner*—Sang Paik
(74) *Attorney, Agent, or Firm*—Hogan & Hartson LLP

(57) ABSTRACT

A heater that is capable of heating an object to a desired temperature in a short period while minimizing the temperature difference the surface of the object is provided. The heater comprising a plate having a first surface and a second surface, the first surface being a mount surface whereon an object is placed and having a resistive heating member; wherein the resistive heating member is formed in a continuous band having arc bands located on one of two concentric circles of different radii, at least one arc band located on the other circle, and linkage arc band that connects the arc band located on the one circle and the arc band located on the other circle; while the distance between the adjacent linkage arc bands is smaller than the distance between the arc band located on the one circle and the arc band located on the other circle.

10 Claims, 21 Drawing Sheets

U.S. PATENT DOCUMENTS

| | | |
|---|---|---|
| 2003/0183816 A1 | 10/2003 | Goto |
| 2004/0108308 A1 | 6/2004 | Okajima |
| 2004/0149718 A1 | 8/2004 | Ito et al. |
| 2006/0000822 A1 | 1/2006 | Nakamura |

FOREIGN PATENT DOCUMENTS

| | | |
|---|---|---|
| EP | 1 089 593 | 4/2001 |
| EP | 1 109 423 | 6/2001 |
| JP | 04-101381 | 4/1992 |
| JP | 07-065935 | 3/1995 |
| JP | 07-220862 | 8/1995 |
| JP | 10-223642 | 8/1998 |
| JP | 10-229114 | 8/1998 |
| JP | 11-121385 | 4/1999 |
| JP | 11-191535 | 7/1999 |
| JP | 11-339939 | 12/1999 |
| JP | 11-354528 | 12/1999 |
| JP | 2000340343 A | 12/2000 |
| JP | 2001-006852 | 1/2001 |
| JP | 2001-068407 | 3/2001 |
| JP | 2001-102157 | 4/2001 |
| JP | 2001-203156 | 7/2001 |
| JP | 2001-223257 | 8/2001 |
| JP | 2001-257200 | 9/2001 |
| JP | 2001-267043 | 9/2001 |
| JP | 2001-313249 | 11/2001 |
| JP | 2002-076102 | 3/2002 |
| JP | 2002-170655 | 6/2002 |
| JP | 2002-184683 | 6/2002 |
| JP | 2002-231421 | 8/2002 |
| JP | 2002-231793 | 8/2002 |
| JP | 2002-237375 | 8/2002 |
| JP | 2003077779 A | 3/2003 |
| JP | 2004-006242 | 1/2004 |
| JP | 2004-111107 | 4/2004 |

\* cited by examiner

405

HEATER, WAFER HEATING APPARATUS AND METHOD FOR MANUFACTURING HEATER

BACKGROUND OF THE INVENTION

1. Field of the Invention

The present invention relates mainly to a heater used in heating a wafer, a wafer heating apparatus and a method for manufacturing the heater.

2. Description of the Related Art

In a manufacturing process of semiconductor devices, a heater is used to heat a semiconductor wafer (hereinafter referred to simply as a wafer) during formation of thin semiconductor film, etching, baking of resist film and other steps.

For such heating purposes, for example, Patent Document 1, Patent Document 2 and Patent Document 3 disclose wafer heating apparatus as shown in FIG. 16.

A heater 771 comprises a plate-shaped ceramic member 772 and a metal casing 779 as major components, and is constituted by securing the plate-shaped ceramic member 772 made of a ceramic material of nitride or carbide on an opening of the bottomed metal casing 779, that is made of a metal such as aluminum, via an insulating contact member 774 made of a resin by means of bolts 780. The heater 771 uses the top surface of the plate-shaped ceramic member 772 as a heating surface 773 whereon a wafer W is to be mounted, so that the wafer W is heated by a resistive heating member 775 that is formed, for example, in concentric configuration as shown in FIG. 20, on the bottom surface of the plate-shaped ceramic member 772.

Power terminals 777 are connected by brazing to power feeder sections of the resistive heating member 775, with the power terminals 777 electrically connected to lead wires 778 that are passed through wiring holes 776 provided at a bottom 779a of the metal casing 779.

In order to form a uniform film over the entire surface of the wafer W or cause a resist film to react uniformly in heating reaction by using the heater 771, it is important to make uniform temperature distribution over the wafer. Accordingly, various measures have been employed as described below to keep the temperature difference across the wafer surface small.

One of the measures is to divide the resistive heating member 775 and independently control the temperatures of the divided sections.

Patent Document 4 discloses a heater that has a plurality of resistive heating member blocks. The resistive heating member of this heater is radially divided into four equal sections of fan-shaped block as shown in FIG. 17. A heater such as shown in FIG. 18 is also known that comprises four blocks of resistive heating member located along the periphery and a circular block of resistive heating member located at the center.

Patent Document 5 discloses a heater comprising a resistive heating member that is divided into identical rectangular regions 711 through 718 that can be controlled either independently or in groups each consisting of a plurality of regions, as shown in FIG. 19. In this heater, as shown in FIG. 19, four regions 715 through 718, among the regions 711 through 718, are located at positions that correspond to the arcs formed by dividing the peripheral portion of the wafer into four equal parts, and other four regions 711 through 714 are disposed inside of the four regions 715 through 718 in parallel thereto.

As to configuration of the resistive heating member, such a heater 500 (Patent Document 6) that comprises a plurality of resistive heatin members of which one located at the outermost position is formed in a sine curve, and heater 500 having outermost resistive heating member 750 formed in rectangular shape (Patent Document 7 and Patent Document 8) is also disclosed (FIGS. 21, 22, 23). In these heaters, a power feeder section 760 is disposed adjacent to the resistive heating member.

Patent Document 8 discloses a heater having a spiral-shaped resistive heating member.

Patent Document 9 discloses a heater where wafer W support pins (not shown) are provided on a mount surface 773 is provided so as to lift the wafer W from the mount surface 773 by a small distance, in order to achieve uniform temperature distribution over the wafer.

Patent Document 10 discloses a heater where a wall is provided along the periphery of the plate-shaped ceramic member 772 to surround the wafer W, so as to prevent the wafer W from moving laterally.

Patent Document 11 discloses a heater where a protrusion that engages with the wafer W is formed along the periphery of the plate-shaped ceramic member 772, and a multitude of projections that contact with the wafer W are formed inside of the protrusion, in order to achieve uniform temperature distribution.

Patent Document 12 discloses a heater where guide pins that locate the wafer W are provided around the plate-shaped ceramic member, thereby to achieve uniform temperature distribution over the wafer W.

Patent Document 13 discloses a heater where temperature distribution over the wafer W can be controlled by adjusting the height of support pins of the wafer W. A heater having guide pins engaged with the support pins is also disclosed.

Patent Document 14, Patent Document 15 and Patent Document 16 also disclose heater 850 made of ceramics where a coil-shaped resistive heating member 853 is embedded as shown in FIG. 24. The heater 850 consists of a plate-shaped ceramic member 851 made of a nitride ceramic material such as silicon nitride or aluminum nitride in which a coil-shaped resistive heating member 853 formed in spiral configuration is embedded, while the power feeder terminals 855 are connected to both ends of the resistive heating member 853. In order to decrease the temperature difference across the wafer surface, such measures are disclosed as increasing the density of the resistive heating member 853 in a region of 10% of the mount surface on the outside, restricting the variation in the number of windings per unit length of the coil-shaped resistive heating member 853 and 3-dimensional arrangement of the resistive heating member 853.

Patent Document 17 and Patent Document 18 also describe attempts to decrease the temperature difference across the wafer surface by connecting and embedding a resistive heating member having different coil diameter, or by providing a swelling portion at a turn-back portion of the resistive heating member.

Moreover, in a CVD film forming process, for example, such a wafer holding member is employed that supports a ceramic heater comprising a plate-shaped ceramic member by means of a cylindrical support member made of ceramics. Such a heater 850 made of ceramics is also known as one principal surface of the plate-shaped ceramic member 851 having resistive heating members 853, 854 embedded therein is used as mount surface 851a and a cylindrical support member 860 made of ceramics is joined onto the other principal surface, as shown in FIG. 25. In the heater 850, the power terminals 856, 857 are connected by brazing to the terminals of the resistive heating members 853, 854, and power terminals 856, 857 are lead through inside of the cylindrical support member 860 to the outside for connection.

In recent years, increasing number of semiconductor devices are manufactured with circuits having line width of 90 nm or 45 nm. Manufacturing such semiconductor devices requires a heater that can heat a wafer with more uniform temperature distribution.

[Patent Document 1]
Japanese Unexamined Patent Publication No. 2001-203156

[Patent Document 2]
Japanese Unexamined Patent Publication No. 2001-313249

[Patent Document 3]
Japanese Unexamined Patent Publication No. 2002-76102

[Patent Document 4]
Japanese Unexamined Patent Publication No. 11-121385

[Patent Document 5]
Japanese Unexamined Patent Publication No. 11-354528

[Patent Document 6]
Japanese Unexamined Patent Publication No. 2001-6852

[Patent Document 7]
Japanese Unexamined Patent Publication No. 2001-223257

[Patent Document 8]
Japanese Unexamined Patent Publication No. 2001-257200

[Patent Document 9]
Japanese Unexamined Patent Publication No. 10-223642

[Patent Document 10]
Japanese Unexamined Patent Publication No. 10-229114

[Patent Document 11]
Japanese Unexamined Patent Publication No. 2002-237375

[Patent Document 12]
Japanese Unexamined Patent Publication No. 2002-184683

[Patent Document 13]
Japanese Unexamined Patent Publication No. 2001-68407

[Patent Document 14]
Japanese Unexamined Patent Publication No. 4-101381

[Patent Document 15]
Japanese Unexamined Patent Publication No. 7-220862

[Patent Document 16]
Japanese Unexamined Patent Publication No. 7-65935

[Patent Document 17]
Japanese Unexamined Patent Publication No. 2004-6242

[Patent Document 18]
Japanese Unexamined Patent Publication No. 2004-111107

[Patent Document 19]
Japanese Unexamined Patent Publication No. 11-339939

[Patent Document 20]
Japanese Unexamined Patent Publication No. 2001-102157

[Patent Document 21]
Japanese Unexamined Patent Publication No. 2002-170655

There has been a demand for a heater that can heat a wafer with more uniform temperature distribution with a simpler structure, since it is difficult to achieve uniform temperature distribution with the conventional heater and it is necessary to carry out very complex and delicate control procedure to achieve a uniform temperature distribution.

In the case of the technology of chemically amplified resist that is being employed along with the trend toward smaller circuit line width of the semiconductor devices, emphasis is placed not only on the uniform temperature distribution over the wafer, but also on the temperature changes throughout the period from the time when the wafer is set in a heat treatment apparatus to the time when the heat treatment is completed and the wafer is taken out. Thus it is desired to stabilize the wafer temperature in uniform temperature distribution with about 60 seconds after placing the wafer on a heater, but the conventional heater cannot satisfy this requirement because it takes a long period of time to stabilize the temperature.

There has also been such a problem that a heater comprising a coil-shaped resistive heating member embedded therein has a tendency of the density of the heating member changing significantly between the outside and inside at a bending portion of the resistive heating member, which makes it difficult to decrease the radius of curvature. Accordingly, the methods described in Patent Document 17 and Patent Document 18 require it to connect the resistive heating members of different coil diameters within the plate-shaped ceramic member, or to form a swelling portion at a turn-back section of the resistive heating member. This results in a complex process that is not suitable for volume production, and it is very difficult to mass-produce products with stabilized quality and high level in the yield of production.

In addition, there has been such a problem that the heater having the cylindrical support member attached thereto allows heat to dissipate through the cylindrical support member, thus resulting in significant temperature difference across the wafer surface.

To counter this problem, Patent Document 19 discloses a heater having increased resistance density on the inside of the cylindrical support member 860 so as to keep the temperature difference across the wafer surface small even when the temperature is raised quickly and prevent the plate-shaped ceramic member 851 from breaking.

Patent Document 20 discloses a heater made of ceramics having a cylindrical support member attached thereto wherein temperature difference across the surface is decreased to prevent breakage, by increasing the resistance of a middle portion and an independent resistive heating member 854 is embedded at a position near the joint surface of the support member 860. Furthermore, Patent Document 21 discloses a heater having a resistive heating member embedded therein so as to heat the cylindrical support member 860.

Recently, it has been called for to decrease the time taken to raise the temperature to a very short period. However, there is a possibility that the heater made of ceramics having the coil-shaped resistive heating member breaks when heated at a high rate. Particularly, heaters made of ceramics having cylindrical support members attached thereto designed for increasing wafer size of 300 mm in diameter were often broken due to the high thermal stress generated by quick heating.

SUMMARY OF THE INVENTION

Accordingly, an object of the present invention is to provide a heater that is capable of heating a wafer or other object to a desired temperature in a shorter period of time while minimizing the temperature difference across the surface of the object, and a wafer heating apparatus that uses the heater.

Another object of the present invention is to provide a heater comprising a plate-shaped ceramic member with a coil-shaped heating member embedded therein that is capable of quickly heating an object while minimizing the temperature difference across the surface of the object with high reliability, and a method for manufacturing the same.

In order to achieve the object described above, the present invention provides a first heater comprising a plate-shaped member having a first principal surface which is a mount surface whereon an object to be heated is placed, a second principal surface and a resistive heating member provided therein or on the second principal surface; wherein the resistive heating member is formed in a continuous band having at least two arc bands located on one of two concentric circles of different radii, at least one arc band located on the other circle, and linkage arc bands each of which connects the arc band located on the one circle and the arc band located on the other circle, said linkage arc bands being located adjacent to each other;

while the distance between the adjacent linkage arc bands is smaller than the distance between the arc band located on the one circle described above and the arc band located on the other circle.

The first heater of the present invention having the constitution described above is capable of heating a wafer or other object to a desired temperature in a shorter period of time while minimizing the temperature difference across the surface of the object, and a wafer heating apparatus that uses the heater.

The present invention also provides a second heater comprising a plate-shaped member having a first principal surface which is a mount surface whereon an object to be heated is placed, a second principal surface, a resistive heating member provided therein or on the second principal surface, and a temperature measuring element; wherein the resistive heating member is formed in a continuous band comprising arc bands that are located on at least two concentric circles of different diameters and are connected with each other, with power feeder sections provided on both ends thereof, the temperature measuring element is provided within a ring-shaped resistive heating member zone that is defined as a region interposed between a circle inscribed to an arc band located at the innermost position among the arc bands and a circle circumscribed to an arc band located at the outermost position among the arc bands; and the power feeder section is provided outside of the ring-shaped resistive heating member zone.

The second heater of the present invention having the constitution described above is capable of heating a wafer or other object to a desired temperature in a shorter period of time while minimizing the temperature difference across the surface of the object, and a wafer heating apparatus that uses the heater.

In the second heater of the present invention, at least two arc bands are disposed on one of the adjacent circles and the arc bands are connected by the linkage arc band that is located adjacent to the arc band disposed on the other circle, while the distance between the adjacent linkage arc bands is smaller than the distance between the arc bands that are connected by the linkage arc band.

In the first and second heaters of the present invention, the distance between the adjacent linkage arc bands is preferably set in a range from 30 to 80% of the distance between the arcs.

It is preferable that the first heater of the present invention comprises a plurality of the resistive heating members, and the resistive heating members are provided within a ring-shaped resistive heating member zone that is defined as a region interposed between a circle inscribed to an arc band located at the innermost position among the arc bands and a circle circumscribed to an arc band located at the outermost position among the arc bands.

In the first and second heaters of the present invention, it is preferable that a plurality of the ring-shaped resistive heating member zones are disposed in a concentric arrangement, with the resistive heating member disposed in each of the ring-shaped resistive heating member zones.

In the heater described above, it is also preferable that the plurality of ring-shaped resistive heating member zone comprise a first ring-shaped resistive heating member zone, a second ring-shaped resistive heating member zone and a third ring-shaped resistive heating member zone disposed in this order from the inside, while a circular or ring-shaped central resistive heating member zone is provided inside of the first ring-shaped resistive heating member zone and an additional resistive heating member is provided in the central resistive heating member zone.

Further in the heater described above, it is preferable that outer diameter D1 of the central resistive heating member zone is in a range from 20 to 40% of the outer diameter D of the third ring-shaped resistive heating member zone, outer diameter D2 of the first ring-shaped resistive heating member zone is in a range from 40 to 55% of the outer diameter D, outer diameter D3 of the second ring-shaped resistive heating member zone is in a range from 55 to 85% of the outer diameter D, inner diameter D22 of the first ring-shaped resistive heating member zone is in a range from 34 to 45% of the outer diameter D, inner diameter D33 of the second ring-shaped resistive heating member zone is in a range from 55 to 65% of the outer diameter D, and inner diameter D0 of the third ring-shaped resistive heating member zone is in a range from 85 to 93% of the outer diameter D.

In the heater described above, it is also preferable that the second ring-shaped resistive heating member zone and the third ring-shaped resistive heating member zone are each divided into equal sections by a plurality of boundary zones provided in the radial direction, that the boundary zones that divide the second ring-shaped resistive heating member zone and the boundary zones that divide the third ring-shaped resistive heating member zone are located at staggered positions with respect to each other so as not to overlap in the radial direction, and it is more preferable that the number of divisions of the second ring-shaped resistive heating member zone and the number of divisions of the third ring-shaped resistive heating member zone are different.

In the heater described above, the resistive heating member provided in the central resistive heating member zone and the resistive heating member provided in the first ring-shaped resistive heating member zone may be connected either in series or in parallel.

A through hole may be provided between the central resistive heating member zone and the first ring-shaped resistive heating member zone so as to penetrate the plate-shaped member.

In the first and second heaters of the present invention, it is preferable that width of the resistive heating member provided in the ring-shaped resistive heating member zone located at the outermost position is smaller than the width of the resistive heating member provided in the other resistive heating member zones.

In the first and second heaters of the present invention, it is preferable that three or more peripheral protrusions are provided along the periphery of the mount surface and inner protrusions that are lower than the peripheral protrusions in height are provided inside of the peripheral protrusions, and the peripheral protrusions are held so as to be movable at least in one of the radial direction of the plate-shaped member and a direction perpendicular thereto.

The heater described above may have power terminals for supplying electric power to the resistive heating member, a cooling nozzle for cooling the plate-shaped member and an opening, and be further provided with a casing that covers the power terminals and the other surface of the plate-shaped member and clamp bolts that clamp the peripheral protrusions onto the plate-shaped member, with the clamp bolts penetrating through the plate-shaped member from one surface described above to the other surface, so as to fasten the casing.

The plate-shaped member may also be fastened onto the casing via a clamp fixture.

A third heater of the present invention comprises a plate-shaped ceramic member having a first principal surface which is a mount surface whereon an object to be heated is placed, a second principal surface and a resistive heating member embedded therein.

The third heater is characterized in that the resistive heating member is formed in a continuous electrically conductive wire having two spiral coils of which center is one of two concentric circles of different radii, at least one spiral coil of which center is the other circle, and connecting coils that connect the spiral coils of which center is one of two concentric circles and the spiral coil of which center is the other circle, said connecting coils being located adjacent to each other;

while the distance between the adjacent connecting coils is smaller than the distance between the spiral coil of which center is the one circle and the spiral coil of which center is the other circle.

The heater of the present invention having the constitution described above comprises the plate-shaped ceramic member wherein the coil-shaped resistive heating member is embedded that is capable of heating an object in a shorter period of time with high reliability while minimizing the temperature difference across the surface of the object to be heated.

In the third heater, it is preferable that the connecting distance is in a range from 30 to 80% of the distance between the coils.

In the third heater, it is also preferable that the spiral coil located at the outermost position has a coil pitch smaller than those of other spiral coils.

Moreover, it is preferable that the third coil has a cylindrical support member joined onto the second principal surface of the plate-shaped ceramic member, while the spiral coil located inside of the support member has a coil pitch smaller than those of the spiral coils located outside of the support member.

A wafer heating apparatus according to the present invention is characterized by having one of the first through the third heaters of the present invention.

A method for manufacturing the third heater of the present invention comprises the steps of:

forming a groove in a green compact that is made of ceramic powder in a plate shape;

inserting a coil-shaped resistive heating member in the groove;

filling a gap between the groove and the resistive heating member with a ceramic powder and applying a preliminary pressure to the ceramic powder; and firing the preliminarily pressed green compact in a heat resistant mold while applying a pressure thereto.

According to the method for processing the wafer of the present invention, at least one of formation of a semiconductor film on the wafer, etching process and formation of resist film is carried out while heating the wafer by means of the heater, with the wafer being placed on a mount surface of the wafer heating apparatus of the present invention.

DESCRIPTION OF THE PREFERRED EMBODIMENTS

Embodiments of the present invention will now be described below.

Embodiment 1

Figure 1:
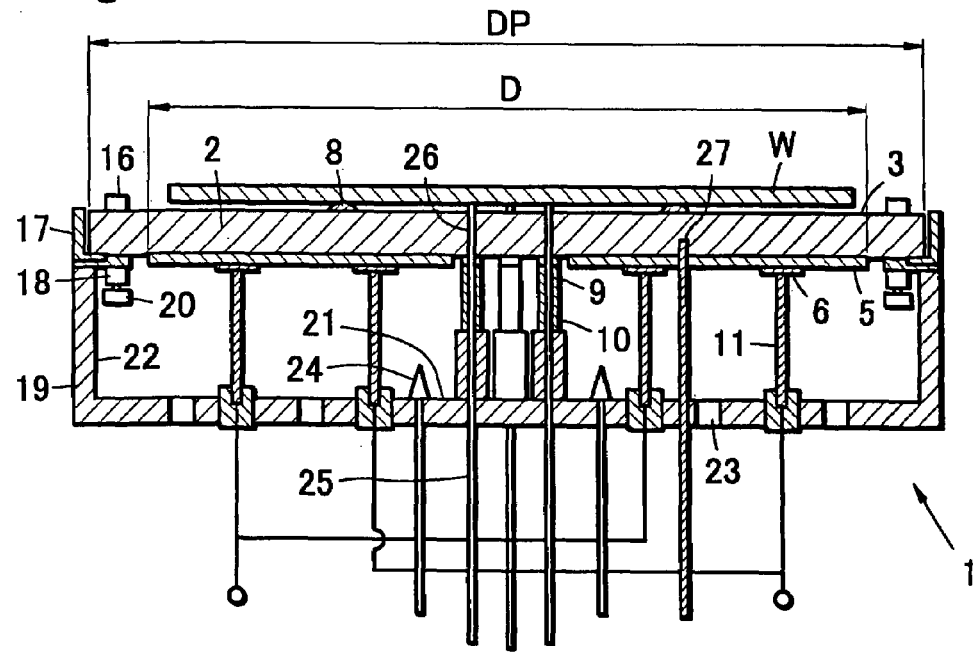
FIG. 1 is a sectional view showing the constitution of the heater according to the first embodiment of the present invention.

FIG. 1 is a sectional view showing the constitution of a heater 1 according to a first embodiment of the present invention. The heater 1 of the first embodiment comprises a plate-shaped ceramic member 2, power feeder sections 6, power terminals 11 and a metal casing 19.

According to the first embodiment, the plate-shaped ceramic member 2 is made of a ceramic material consisting of silicon carbide or aluminum nitride as the main component, for example, and has one principal surface used as a mount surface 3 to place the wafer W thereon and a resistive heating member 5 is formed as described below on the other principal surface.

The power feeder sections 6 are electrically connected to the resistive heating member 5 that is formed on the other principal surface of the plate-shaped ceramic member 2, while the power terminals 11 are connected to the power feeder sections 6.

The metal casing 19 holds the power terminals 11 connected to the power feeder sections 6 and is fastened onto the periphery of the other principal surface of the plate-shaped ceramic member 2 via a contact member 17 so as to surround the power feeder sections 6.

The plate-shaped ceramic member 2 has a through hole 26 that penetrates therethrough in the direction of thickness. Wafer lift pins 25 are provided movably in the vertical direction in the through hole 26, so that the wafer W can be moved vertically and placed on the mount surface 3 and unloaded therefrom. With the constitution described above, electric power can be supplied from the outside through the power terminals 11 to the powder feeder sections 6, so as to heat the wafer W while measuring the temperature of the plate-shaped ceramic member 2 by means of a temperature measuring element 27.

The wafer W is held while being lifted by the wafer support pins 8 from the mount surface 3, so as to prevent the wafer W from being subjected to uneven distribution of temperature due to uneven bearing.

According to the present invention, it is preferable to divide the resistive heating member 5 into a plurality of zones each provided with a separate power feeder section and connected to the power terminals 11 so that electric power can be supplied independently to each of the power feeder sections 6. This constitution makes it possible to control the electric power supplied to the power terminals 11 so that each of the temperature measuring element 27 indicates a predetermined temperature and uniform temperature distribution over the surface of the wafer placed on the mount surface 3. In this case, while it is preferable to provide the temperature measuring element 27 in each zone, but one temperature measuring element 27 may be provided for every two or three zones.

The power feeder sections 6 are made of gold, silver, palladium, platinum or the like, for example, and is put into contact with the power terminals 11 thereby establishing electrical continuity. There is no restriction on the method of connecting the power terminals 11 and the power feeder sections 6, and soldering, brazing or the like may be employed as long as electrical continuity can be secured.

Figure 2:
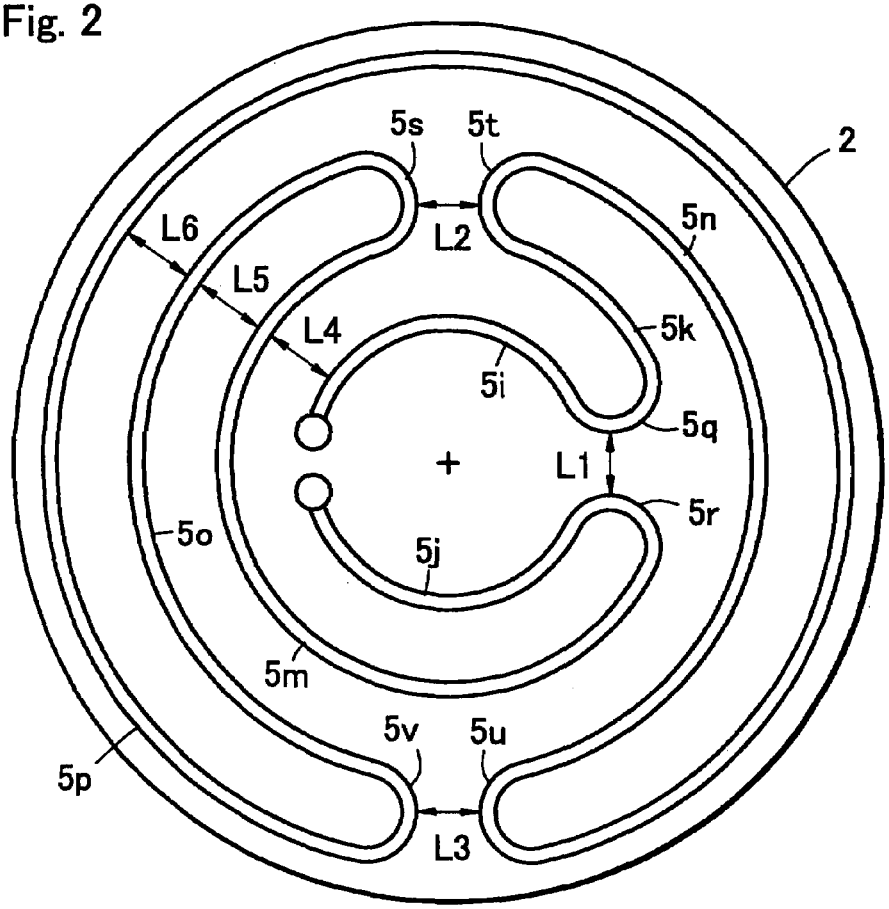
FIG. 2 is a plan view showing the configuration of the resistive heating member of the first embodiment.

In the heater of the first embodiment, the band-shaped resistive heating member 5 formed inside of the plate-shaped ceramic member 2 or on the principal surface thereof comprises one continuous electrical conductor constituted from arc bands 5i through 5p that have substantially the same line width and formed in substantially concentric configuration and are connected by turn-back linkage arc bands 5q through 5v as shown in FIG. 2.

Specifically, the arc band 5i that has the power feeder section 6 at one end thereof is formed so as to constitute a part of circle that is located at the innermost position and has center located at the center of the plate-shaped ceramic member 2, with the other end of the arc band 5i connected to one end of the turn-back linkage arc band 5q. Connected to the other end of the turn-back linkage arc band 5q is one end of the arc band 5k that is formed so as to constitute a part of circle located at the second position from the inside (with the center located at the center of the plate-shaped ceramic member 2), with the other end of the arc band 5k being connected to one end of the turn-back linkage arc band 5t. Connected to the other end of the turn-back linkage arc band 5t is one end of the arc band 5n formed so as to constitute a part of circle located at the third position from the inside (with the center located at the center of the plate-shaped ceramic member 2), with the other end of the arc band 5n being connected to one end of the turn-back linkage arc band 5u. Connected to the other end of the turn-back linkage arc band 5u is one end of the arc band 5p that is formed so as to constitute a part of circle located at the fourth position from the inside (the outermost circle in the example shown in FIG. 2, with the center located at the center of the plate-shaped ceramic member 2), with the other end of the arc band 5p being connected to one end of the turn-back linkage arc band 5v. Connected to the other end of the turn-back linkage arc band 5v is one end of the arc band 5o that is formed so as to constitute a part of circle located at the third position from the inside, with the other end of the arc band 5o being connected to one end of the turn-back linkage arc band 5s. Connected to the other end of the turn-back linkage arc band 5s is one end of the arc band 5m that is formed so as to constitute a part of circle located at the second position from the inside, with the other end of the arc band 5m being connected to one end of the turn-back linkage arc band 5r. Connected to the other end of the turn-back linkage arc band 5r is the arc band 5j that is formed so as to constitute a part of the innermost circle, with the other end of the arc band 5j being formed as the power feeder section.

As described above, the resistive heating member 5 is a long band of heat generating member constituted from the plurality of arc bands 5i through 5p arranged to constitute concentric circles and the turn-back linkage arc bands 5q through 5v that connect adjacent ones of the arc bands 5i through 5p, that are disposed on circles of different radii, with each other in series, and both ends (arc bands 5i, 5j) form the power feeder sections 6.

In the first embodiment, since the resistive heating member 5 is formed by disposing each of the pairs of the arc band 5i and the arc band 5j, the arc band 5k and the arc band 5m and the arc band 5n and the arc band 5o so as to constitute a circle, with the arc band 5p also constituting a circle, while the circles are disposed concentrically, concentric temperature distribution patterns can be formed to repeat from the center of the mount surface 3 to the circumference by energizing the resistive heating member 5.

The first embodiment is characterized in that distances L1, L2 and L3 of the adjacent pair of the turn-back linkage arc band 5q and the turn-back linkage arc band 5r, the pair of the turn-back linkage arc band 5s and the turn-back linkage arc band 5t and the pair of the turn-back linkage arc band 5u and the turn-back linkage arc band 5v, respectively, are set to be smaller than the distances L4, L5 and L6 between the arc bands 5i through 5p that are located adjacent to each other in the radial direction.

This constitution enables it to generate the same amount of heat per unit volume from the turn-back linkage arc bands 5q through 5v as well as from the arc bands 5i through 5p, thereby to improve the uniformity of heating the mount surface 3 (uniform temperature distribution over the mount surface 3). In the prior art, the distances L1, L2 and L3 of the adjacent pairs of the turn-back linkage arc band 5q through the turn-back linkage arc band 5v are set to be equal to the distances L4, L5 and L6 between the turn-back arc bands 5i through 5p that are located adjacent to each other in the radial direction. With such a constitution, since heat is generated with lower density in the turn-back linkage portion (hereinafter referred to simply as the turn-back region) P5 that connect the arc bands 5i through 5p and the turn-back linkage arc band 5q through the turn-back linkage arc band 5v, temperature becomes lower in the outside of the turn-back region P5, resulting in larger temperature difference across the surface of the wafer W, thus impairing the uniform heating performance.

According to the present invention, in contrast, since the distances L1, L2 and L3 of the adjacent pair of the turn-back linkage arc bands 5q through 5v located on the same circle are made smaller than the distances L4, L5 and L6 between the arc bands 5i through 5p that are located adjacent to each other in the radial direction, shortage in heat generated from the turn-back region P5 is compensated for by the heat generated by the turn-back linkage arc bands 5q through 5v, thus enabling it to avoid temperature decrease in the turn-back region P5. As a result, temperature difference across the surface of the wafer W that is placed on the mount surface 3 can be decreased and uniformity of heating can be improved.

Highest uniformity of heating by the mount surface 3 can be achieved by setting the distances L1, L2 and L3 of the adjacent pair of the turn-back linkage arc bands 5q through 5v located on the same circle in a range from 30 to 80% of the distances L4, L5 and L6 between the arc bands 5i through 5p that are located adjacent to each other in the radial direction, more preferably setting L1, L2 and L3 in a range from 40 to 60% of L4, L5 and L6.

Also according to the present invention, since the resistive heating member 5 is constituted from the arc bands 5i through 5p and the turn-back linkage arc bands 5q through 5v, it is less probable that an excessive stress is generated in the edges than in the case of the rectangular turn-back resistive heating member of the prior art, and the heater 1 that has higher reliability can be provided wherein the plate-shaped ceramic member 2 and the resistive heating member 5 are less likely to break even when temperature of the heater 1 is raised or lowered at a high rate.

In the first embodiment, it is preferable for the form of the resistive heating member shown in FIG. 2 that the distance L4 between the innermost circle whereon the arc band 5i and the arc band 5j are disposed and the circle located at the second position from the inside whereon the arc band 5m and the arc band 5k are disposed, the distance L5 between the second circle and the circle located at the third position from the inside whereon the arc band 5n and the arc band 5o are disposed and the distance L6 between the third circle and the circle located at the outermost position whereon the arc band 5p is disposed are set substantially equal.

When the arc bands are disposed at substantially equal intervals in the radial direction as described above, it is made possible to generate the same amount of heat per unit volume from the arc bands 5i through 5p, thereby to suppress the unevenness of heating the mount surface 3 in the radial direction.

The effect of the constitution of the resistive heating member 5 described above is obtained, in addition to the case where the resistive heating member is embedded in the plate-shaped ceramic member, also in case the resistive heating member is provided on the other principal surface of the plate-shaped ceramic member 2. When the band-shaped resistive heating member 5 is provided on the other principal surface of the plate-shaped ceramic member 2, in particular, greater effect of preventing the plate-shaped ceramic member 2 and the resistive heating member 5 from breaking can be achieved by over-coating an insulation film on the resistive heating member 5.

The resistive heating member may also be constituted from a plurality of heating members that can be heated independently in a concentric configuration. In this case, it is preferable to set the distance between the outermost band of the resistive heating member and the band located inside thereof in the concentric configuration smaller than the distance of the band located inside thereof. The resistive heating member 5 having such a constitution makes it easier to replenish heat to the periphery of the plate-shaped ceramic member 2 from which heat is dissipated at a higher rate, thereby preventing the periphery of the wafer W from becoming lower in temperature.

In the heater 1 of the first embodiment, it is preferable to divide the resistive heating member into a plurality of ring-shaped resistive heating member zones disposed in a concentric configuration with the center located at the center axis of the wafer W that is placed on the mount surface 3. This is because, while heating of the surface of a disk-shaped wafer W is subjected to the influences of the atmosphere around the wafer W, wall surface that opposes the wafer W and the gas flow, the wall surface surrounding the wafer W, the surface that oppose the top surface of the wafer and the flow of the ambient gas are designed in centrally symmetric configuration so as to prevent the temperature from varying across the surface of the disk-shaped wafer W. Uniformly heating the wafer W requires the heater 1 to be designed to match the centrally symmetric environment with respect to the wafer W, and it is preferable to divide the mount surface 3 radially into resistive heating member zones 4 in centrally symmetric configuration.

In order to heat a wafer w of 300 mm or more in diameter with uniform temperature distribution across the surface, in particular, it is preferable to divide the mount surface 3 into three ring-shaped resistive heating member zones in concentric configuration.

FIG. 3A shows a preferable example of dividing into a plurality of resistive heating member zones 4. In this preferable example of zone division, the mount surface is divided into resistive heating member zone 4a of circular or ring shape located at the innermost position and three ring-shaped resistive heating member zones 4b, 4cd, 4eh located concentrically on the outside thereof. In this example, the resistive heating member 5 is divided into four resistive heating member zones so as to improve the performance of uniformly heating the wafer W.

In order to minimize the temperature difference across the surface of the wafer W, it is preferable to set the outer diameter D1 of the resistive heating member zone 4a located at the center of the heater 1 in a range from 20 to 40% of the outer diameter D of the ring-shaped resistive heating member zone 4eh located along the periphery, outer diameter D2 of the resistive heating member zone 4b located outside thereof in a range from 40 to 55% of the outer diameter D of the ring-shaped resistive heating member zone 4eh located along the periphery, and the inner diameter D0 of the ring-shaped resistive heating member zone 4eh located at the outermost position in a range from 55 to 85% of the outer diameter D of the ring-shaped resistive heating member zone 4eh located at the outermost position.

The outer diameter of the resistive heating member zone means the diameter of the circle that is circumscribed to the outermost arc band of the resistive heating member formed in the resistive heating member zone. The inner diameter of the resistive heating member zone means the diameter of the circle that is inscribed to the innermost arc band of the resistive heating member formed in the resistive heating member zone. Definition of the circumscribed circle and the inscribed circle is made by using the arc section excluding the protruding portions of the resistive heating member such as power feeder section.

When the outer diameter D1 is less than 20% of D, temperature of the mid portion of the resistive heating member zone 4a would not rise sufficiently even if the resistive heating member zone 4a is caused to generate more heat, due to the small outer diameter of the central resistive heating member zone 4a. When the outer diameter D1 is more than 40% of D, temperature of the resistive heating member zone 4a would become too high along the periphery thereof as the temperature of the mid portion of the resistive heating member zone 4a is raised, due to the large outer diameter of the resistive heating member zone 4a located at the center. The outer diameter D1 is preferably in a range from 20% to 30% of D, and more preferably from 23% to 27%, which makes it possible to further decrease the temperature difference across the surface of the wafer W.

When the outer diameter D2 is less than 40% of the outer diameter D, since the heater 1 tends to cool down along the periphery, an attempt to prevent temperature of the wafer W along the periphery thereof from decreasing by causing the ring-shaped resistive heating member zone 4cd to generate more heat would result in higher temperature of the ring-shaped resistive heating member zone 4cd in an inner portion thereof nearer to the center of the wafer W, thus increasing the temperature difference across the wafer surface. When the outer diameter D2 is more than 55% of the outer diameter D, an attempt to prevent the temperature of the wafer W along the periphery thereof from decreasing by causing the ring-shaped resistive heating member zone 4cd to generate more heat raises the temperature of the ring-shaped resistive heating member zone 4cd although the effect of decreasing the temperature of the wafer W along the periphery thereof reaches the ring-shaped resistive heating member zone 4b, thus resulting in lower temperature of the ring-shaped resistive heating member zone 4b along the periphery thereof. The outer diameter D2 is preferably in a range from 41% to 53% of the outer diameter D, and more preferably from 43% to 49%, which makes it possible to further decrease the temperature difference across the wafer surface.

When the outer diameter D3 is less than 55% of the outer diameter D, since the heater 1 tends to cool down along the periphery thereof, an attempt to prevent the temperature of the wafer W along the periphery thereof from decreasing by increasing heat generation from the ring-shaped resistive heating member zone 4eh would result in higher temperature of the ring-shaped resistive heating member zone 4eh in the inner portion thereof nearer to the center of the wafer W, thus increasing the temperature difference across the surface of the wafer W. When the outer diameter D3 is more than 85% of the outer diameter D, an attempt to prevent the temperature of the wafer W along the periphery thereof from decreasing by causing the ring-shaped resistive heating member zone 4eh to generate more heat raises the temperature of the ring-shaped resistive heating member zone 4eh although the effect of decreasing the temperature of the wafer W along the periphery thereof reaches the ring-shaped resistive heating member zone 4cd, thus resulting in lower temperature of the ring-shaped resistive heating member zone 4cd along the periphery thereof. The outer diameter D3 is preferably in a range from 65% to 85% of the outer diameter D, and more preferably from 67% to 70%, which makes it possible to further decrease the temperature difference across the surface of the wafer W.

It was found that the constitution of the heater 1 comprising the plurality of the resistive heating member 5 as described above makes it possible to compensate for slight asymmetry in the lateral configuration of the environment and unevenness in the thickness of the symmetrical heating member, while further decreasing the temperature difference across the surface of the wafer W.

External dimensions of the resistive heating member zone 4 have been described in detail. According to the present invention, the resistive heating member is divided into a plurality of resistive heating member zones preferably in such a configuration as annular no-heater zones where the resistive heating member 5 does not exist between the resistive heating member zone located inside and the resistive heating member zone located outside. Forming the no-heater zones enables it to provide the support pins 8, the through hole 26 and/or the power feeder sections 6 in the no-heater zones. This makes it possible to prevent the temperature from being unevenly distributed due to the support pins 8, the through hole 26 and/or the power feeder section 6 that would otherwise increase the temperature difference across the wafer surface.

Inner diameter D11 of the resistive heating member zone 4 having outer diameter of D1 on the center side of the resistive heating member zone 4a may be set in range from 5 to 10% of the diameter D. This allows it to provide the support pins 8, for example, within the circle of diameter D11, so as to prevent the temperature of the wafer surface from decreasing due to the support pins 8.

It is preferable that inner diameter D22 of the resistive heating member zone that has the outer diameter D2 is in a range from 34% to 45% of the outer diameter D, inner diameter D33 of the resistive heating member zone that has the outer diameter D3 is in a range from 55% to 65% of the outer diameter D and inner diameter D0 of the resistive heating member zone that has the outer diameter D is in a range from 85% to 93% of the outer diameter D.

The reason for setting the inner diameter D22 of the ring-shaped resistive heating member zone 4b located at the second position from the inside preferably in a range from 34% to 45% of the outer diameter D is that this enables it to provide an annular no-heater zone measuring about 1% to 22% of the diameter between the resistive heating member zone 4a and the ring-shaped resistive heating member zone 4b, thus minimizing the decrease in the temperature of the wafer surface even when the lift pins 25 or the like are provided in the no-heater zone. The inner diameter D22 is more preferably set in a range from 36% to 41% of the outer diameter D. This enables it to provide a through hole that penetrates through the plate-shaped member between the resistive heating member zone 4a and the ring-shaped resistive heating member zone 4b.

It is preferable that inner diameter D33 of the ring-shaped resistive heating member zone 4cd is in a range from 55% to 65% of the diameter D. An annular no-heater zone can be formed between the ring-shaped resistive heating member zone 4b and the ring-shaped resistive heating member zone 4cd. Since the power feeder sections 6 that supply electric power to the resistive heating member can be provided in this no-heater zone, cold spot or the like can be prevented from being created on the surface of the wafer W due to the disposition of the power feeder sections 6. Inner diameter D33 is more preferably in a range from 58% to 63% of the diameter D.

Further, inner diameter D0 of the ring-shaped resistive heating member zone 4eh may be in a range from 85% to 93% of the diameter D. This allows it to provide an annular no-heater zone between the ring-shaped resistive heating member zone 4eh and the ring-shaped resistive heating member zone 4cd. The wafer W can be heated without increasing the temperature difference across the wafer surface, by providing the support pins 8 that support the object to be heated such as wafer W, and/or the power feeder sections 6 in the annular no-heater zone. Inner diameter D0 is more preferably in a range from 90% to 92% of the diameter D.

In the heater 1 comprising the resistive heating member 5 disposed in the configuration of a plurality of rings as described above, there has been such a possibility that thickness becomes uneven between left and right when a large-sized resistive heating member is formed by screen printing, due to slight asymmetry in the environment and/or the restriction of the manufacturing method of the band-shaped resistive heating member. It was found that division of the annular zones described above is preferable for the reason of operating environment and the restriction of the manufacturing method, resulting in smaller temperature difference across the wafer surface.

FIG. 3B shows another example of zone division of the heater 1 of the present invention, where the ring-shaped resistive heating member zones 4cd and 4eh are further divided. In the example shown in FIG. 3B, among the four ring-shaped resistive heating member zones 4a, 4b, 4cd and 4eh, the ring-shaped resistive heating member zones 4a, 4b are ring-shaped, while the ring-shaped resistive heating member zone 4cd located outside thereof is divided into two equal parts of fan-shaped resistive heating member zone 4c, 4d with equal center angles (180°), and the ring-shaped resistive heating member zone 4eh located outside thereof is divided into four equal parts of fan-shaped resistive heating member zones 4e, 4f, 4g and 4h with equal center angles (90°). Such a configuration is preferable as it achieves uniform temperature distribution over the surface of the wafer W.

In the example shown in FIG. 3B, it is preferable that the resistive heating member zones 4a through 4h are provided with the resistive heating members 5a through 5h that can independently control the heat generation, respectively.

In the examples shown in FIG. 3A and FIG. 3B, the resistive heating member zones 4a, 4b may be connected with each other in parallel so as to be controlled by a single control circuit, if the outside environment where the heater 1 would not be changed frequently. With this constitution, predetermined space can be provided between the resistive heating member zones 4a, 4b, and therefore the through hole 26 through which the lift pins that lift the wafer W pass can be provided.

When the through hole 26 that penetrates the plate-shaped member is provided between the central resistive heating member zone 4a and the ring-shaped resistive heating member zone 4b located outside thereof, wafer temperature can be prevented from decreasing due to the through hole 26 so as to decrease the temperature difference across the surface of the wafer W.

While the ring-shaped resistive heating member zone 4cd is divided into two equal parts of the same center angles and the ring-shaped resistive heating member zone 4eh is divided into four equal parts of the same center angles in the example described above, the present invention is not limited to this constitution.

While the resistive heating member zones 4c, 4d shown in FIG. 3B are divided by a straight border line, it needs not necessarily be a straight line but may be a wavy line. The resistive heating member zones 4c, 4d are preferably symmetrical with respect to the center of the concentric resistive heating member zone.

Similarly, border lines between the resistive heating member zones 4e and 4f, 4f and 4g, 4g and 4h and 4h and 4e need not necessarily be straight lines but may be wavy lines. These zones are also preferably symmetrical with respect to the center of the concentric resistive heating member zone.

It is also preferable that the border line between the resistive heating member zones 4c, 4d and the border lines between the resistive heating member zones 4e, 4f, 4g and 4h are not aligned with each other on a straight line, since it enables it to prevent cold spots from occurring near the border lines.

According to the present invention, the resistive heating member zones 4e, 4f, 4g, 4h and the resistive heating member zones 4c, 4d are divided in such a manner as the border zones of the resistive heating member zones 4e, 4f, 4g, 4h in the outermost ring-shaped resistive heating member zone 4eh and the border zones of the resistive heating member zone 4c, 4d in the ring-shaped resistive heating member zone 4cd located inside thereof are staggered with respect to each other.

The constitution will be described in more detail with reference to FIG. 3B.

First, a reference line Ls that passes the center of the plate-shaped ceramic member 2 is defined, and one of the border lines of the resistive heating member zone 4e is defined by a straight line that is inclined by a small angle Δβ from the reference line Ls. Then the other border line of the resistive heating member zone 4e is defined by a straight line that is inclined by an angle β1 from the reference line Ls. These angles satisfy the relation β1=90°−Δβ. Further, one of the border lines of the resistive heating member zone 4f is defined by a straight line that is inclined by an angle β2 from the reference line Ls. These angles satisfy the relation β2=90°+Δβ. Thus the border zone Zef between the resistive heating member zone 4e and the resistive heating member zone 4f is determined. Similarly, the border zones that divide the ring-shaped resistive heating member zone 4eh into four resistive heating member zones 4e, 4f, 4g, 4h are defined.

Then the ring-shaped resistive heating member zone 4cd located inside of the ring-shaped resistive heating member zone 4eh is defined by means of the reference line Ls. One of the border lines of the resistive heating member zone 4c is defined by a straight line that is inclined by an angle α1 from the reference line Ls. The angle satisfies the relation α1=α−Δα. Then one of the border lines of the resistive heating member zone 4d is defined by a straight line that is inclined by an angle α2 from the reference line Ls. These angles satisfy the relation α2=α+Δα. Thus the border zone Zcd between the resistive heating member zone 4c and the resistive heating member zone 4d is determined. Further, the other border line of the resistive heating member zone 4d is defined by a straight line that is inclined by an angle (α1+180°) from the reference line Ls, and the other border line of the resistive heating member zone 4c is defined by a straight line that is inclined by an angle (α2+180°) from the reference line Ls. Thus the border zones that divide the ring-shaped resistive heating member zone 4cd into two resistive heating member zones 4c, 4d are defined.

The small angle Δβ and the small angle Δα are determined uniquely in accordance to the space L1 which will be described later, and usually the small angle Δβ and the small angle Δα are made equal to each other.

While the ring-shaped resistive heating member zone 4eh is divided into four resistive heating member zones 4e, 4f, 4g, 4h and the ring-shaped resistive heating member zone 4cd is divided into two resistive heating member zones 4c, 4d in the example described above, the present invention is not limited to these numbers of divisions.

According to the present invention, cold spots can be prevented from being created and temperature difference across the wafer surface can be decreased, by appropriately setting the number of divisions (or the center angle of the zones created by the division) of the resistive heating member zone located at the outermost position and the resistive heating member zone located inside thereof and the angles α and β that define the border lines with respect to the reference line, so that the border zones of the resistive heating member zone located at the outermost position and the border zones of the resistive heating member zone located inside thereof are not aligned with each other on a straight line.

As described above, in the example of setting the resistive heating member zone shown in FIG. 3B according to the present invention, the border line Zcd within the ring-shaped resistive heating member zone 4cd is located in a region encompassed by the center angle α1-α2 of the plate-shaped member from the reference line that passes the center of the plate-shaped member. The border line Zef of the ring-shaped resistive heating member zone 4eh is located in a region encompassed by the center angle β1-β2. The border zones are set in a staggered configuration so that α1-α2 do not overlap with β1-β2.

In the heater 1 of the present invention, it is preferable that the interval between the plurality of resistive heating members 5 along the circumference in the same resistive heating member zone is smaller than the intervals between the bands in the radial direction in the same resistive heating member zone. With this configuration, cold spots can be prevented from being created near the borders.

Figure 4:
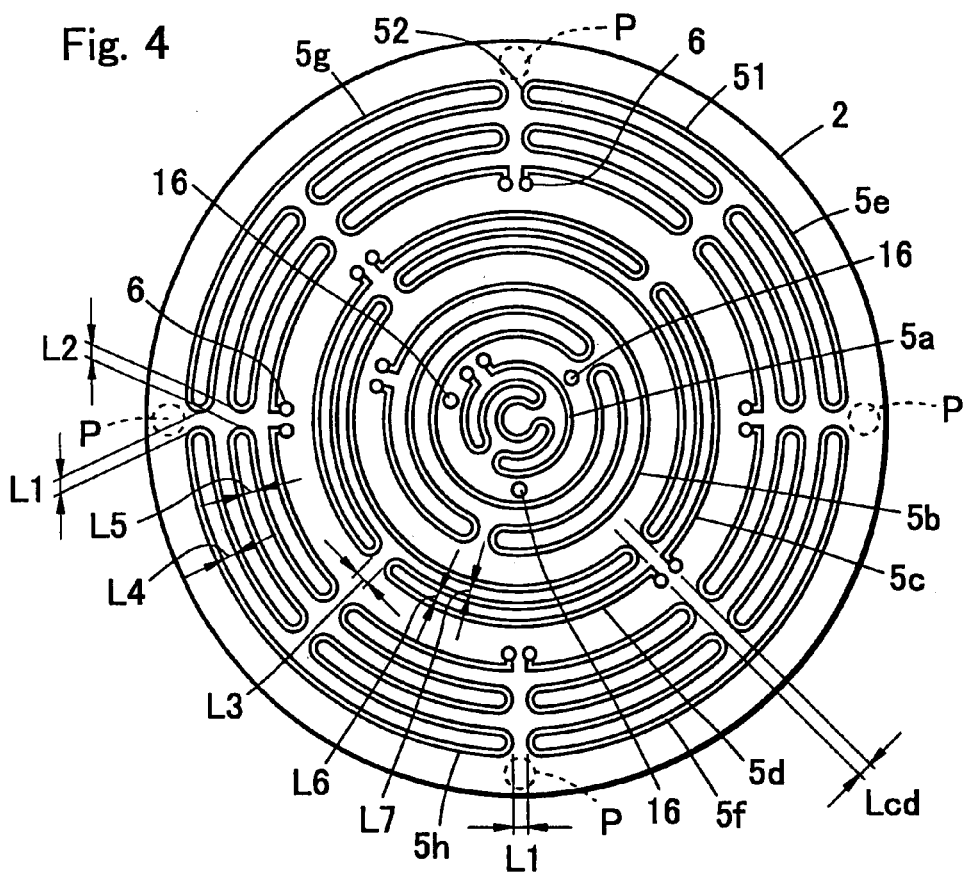
FIG. 4 is a plan view showing a preferable example of configuration of the resistive heating member according to the present invention.

In the example shown in FIG. 4, the interval Lcd between the resistive heating member 5c and the resistive heating member 5d along the circumference is preferably smaller than the intervals L6, L7 of the arc bands in the radial direction within the same resistive heating member 5c (or 5d). It is also preferable that the intervals L1, L2 between the resistive heating member 5e and the resistive heating member 5f, between the resistive heating member 5f and the resistive heating member 5h, between the resistive heating member 5h and the resistive heating member 5g, and between the resistive heating member 5g and the resistive heating member 5e along the circumference is smaller than the intervals L4, L5 of the arc bands in the radial direction within the same resistive heating members 5e, 5f, 5g, 5h. With this configuration, cold spots can be prevented from being created near the borders.

In the example of zone division according to the present invention shown in FIG. 3B, the resistive heating member 5b is provided in the single resistive heating member zone that is the ring-shaped resistive heating member zone 4b located at the innermost position which is not divided, among the three ring-shaped resistive heating member zones 4b, 4cd, 4eh excluding the resistive heating member zone 4a. The ring-shaped resistive heating member zone 4cd located outside of the ring-shaped resistive heating member zone 4b consists of two fan-shaped resistive heating member zones 4c and 4d that are equal halves of a ring, while the fan-shaped resistive heating member zones 4c and 4d are provided with the resistive heating members 5c, 5d, respectively. The ring-shaped resistive heating member zone 4eh located outside of the ring-shaped resistive heating member zone 4cd consists of four fan-shaped resistive heating member zones 4e, 4f, 4g and 4h that are equal quarter of a ring, while the fan-shaped resistive heating member zones 4e, 4f, 4g and 4h are provided with the resistive heating members 5e, 5f, 5g and 5h, respectively. The resistive heating member zone and the resistive heating member constituted as shown in FIG. 3B enable it to heat the wafer W with uniform temperature distribution over the surface.

In the heater 1 shown in FIG. 3B, it is preferable that the resistive heating members 5a through 5h that are provided in the resistive heating member zones 4a through 4h, respectively, can be individually controlled.

However, the zone 4a and the zone 4b may also be connected with each other in parallel or series so as to be controlled by a single control circuit depending on the operating conditions of the heater 1. The space between the resistive heating member zone 4a and 4b may be set such that a through hole wherein the lift pin that lifts the wafer W passes can be provided therein.

While the ring-shaped resistive heating member zones 4cd, 4eh are divided into two parts and four parts, respectively, the present invention is not limited to this constitution.

While the resistive heating member zones 4c, 4d shown in FIG. 3B are divided by a straight border line, it needs not necessarily be a straight line but may be a wavy line. The resistive heating member zones 4c, 4d are preferably centrally symmetric with respect to the center of the concentric resistive heating member zone.

Similarly, border lines between the resistive heating member zones 4e and 4f, 4f and 4g, 4g and 4h and 4h and 4e need not necessarily be straight lines but may be wavy lines. These zones are also preferably centrally symmetrical with respect to the center of the concentric circle.

Each of the resistive heating members 5 is preferably formed by printing process or the like in the form of a band 1 to 5 mm in width and 5 to 50 μm in thickness. When a large area is printed at a time, there may arise unevenness in thickness of the printed layer due to difference in pressure between a squeegee and a screen across the printed surface. Especially when the resistive heating member 5 is large in size, thickness of the resistive heating member 5 becomes uneven across the surface, resulting in varying amount of heat generated. Varying amount of heat generated leads to larger temperature difference across the wafer surface. It was found that, in order to prevent difference in temperature from occurring due to the varying thickness of the resistive heating member, it is effective to divide the resistive heating member 5 of large diameter into five parts.

Accordingly, since the area of the resistive heating member 5 to be printed in the resistive heating member zone 4 can be made smaller when the ring-shaped resistive heating member zone 4cd of the concentric rings except for the central portion of the wafer mount surface 3 is divided into two parts, and the ring-shaped resistive heating member zone 4eh of the large ring is divided into four parts, thickness of the resistive heating member 5 can be made uniform. Moreover, slight difference in temperature across the surface of the wafer W can be corrected and uniform temperature distribution over the surface of the wafer W can be achieved. In order to make fine adjustment of resistance of the band of the resistive heating member 5, a long groove may be formed along the resistive heating member by means of laser or the like, thereby adjusting the resistance.

The resistive heating members 5a, 5b, 5c, 5d, 5e, 5f, 5g and 5h shown in FIG. 4 are formed in turn-back configuration.

In the heater 1 of the present invention, diameter D of the circumscribed circle of the resistive heating member 5 is preferably in a range from 90 to 97% of the diameter DP of the plate-shaped ceramic member 2.

When diameter D of the circumscribed circle C of the resistive heating member 5 is smaller than 90% of the diameter DP of the plate-shaped ceramic member 2, it takes longer time to raise or lower the temperature and therefore results in unfavorable temperature characteristic of the wafer W. For the purpose of achieving uniform temperature distribution over the wafer so that temperature of the wafer W does not become lower along the periphery, diameter D is preferably about 1.02 times the diameter of the wafer W. When the diameter DP of the plate-shaped ceramic member 2 is larger than the range described above in relation to the size of the wafer W, size of the wafer W becomes too small in relation to the diameter DP of the plate-shaped ceramic member 2, and the efficiency of heating the wafer W for the input power becomes lower. Moreover, larger size of the plate-shaped ceramic member 2 results in larger installation area of the wafer manufacturing apparatus, which is not desirable because it decreases the rate of operation of the semiconductor manufacturing apparatus.

When diameter D of the circumscribed circle C of the resistive heating member 5 is larger than 97% of the diameter DP of the plate-shaped ceramic member 2, the space between the contact member 17 and the periphery of the resistive heating member 5 becomes too small and heat dissipates from the periphery of the resistive heating member 5 into the contact member 17, thus resulting in uneven temperature distribution in the circumferential portion. Particularly, since heat is transferred through the contact member 17 also from the portion along the periphery that does not include arc band 51 in contact with the circumscribed circle C, and the arc band 51 located along the periphery is bended toward the center of the plate-shaped ceramic member 2, temperature may become lower in the portion P that does not include arc band 51 along the circumscribed circle C which surrounds the resistive heating member 5, thus resulting in larger temperature difference across the wafer surface. According to the present invention, diameter D of the circumscribed circle C of the resistive heating member 5 is set preferably in a range from 92 to 95% of the diameter DP of the plate-shaped ceramic member 2.

In case the plate-shaped ceramic member 2 and the metal casing 19 have substantially the same outer diameters and the plate-shaped ceramic member 2 is supported by the metal casing 19 from below as shown in FIG. 1, diameter D of the circumscribed circle C of the resistive heating member 5 is preferably in a range from 91 to 95%, and more preferably in a range from 92 to 94% of the diameter DP of the plate-shaped ceramic member 2.

In addition, in the heater 1 of the present invention, the configuration of the resistive heating member shown in FIG. 4 includes the empty portion P that does not include arc band of the resistive heating member 5 in part of the circumscribed circle C. The distance L1 between the linkage arc bands that oppose each other in the vicinity of the empty region P is preferably smaller than the difference between the diameter DP of the plate-shaped ceramic member 2 and the diameter D of the circumscribed circle C (hereinafter denoted as LL). When the distance L1 is larger than the difference LL, heat of the empty region P may be transferred to the periphery of the plate-shaped ceramic member, thus resulting in a lower temperature of the empty region P. When the distance L1 is smaller than the difference LL, however, temperature of the empty region P is less likely to lower so that temperature of a part of the peripheral portion of the wafer W placed on the mount surface 3 of the plate-shaped ceramic member 2 does not lower and the temperature difference across the surface of the wafer W can be decreased.

In order to prevent the temperature of the empty region P from lowering, it is preferable to keep the resistance of the linkage arc band 52 that heats the empty region at the same or slightly higher level as that of the other portion so as to increase the amount of heat generation, which makes it less likely that temperature of the empty region P becomes lower and achieves uniform temperature distribution over the wafer. When the resistive heating member 5 is formed by printing process or the like, the temperature of the linkage arc band 52 can be made higher than the temperature of the arc band 51 so as to achieve uniform temperature distribution over the surface of the wafer W, by making the width Ws of the linkage arc band 52 smaller by 1 to 5% than the width Wp of the arc band 51, thereby increasing the resistance of the linkage arc band 52.

In the wafer heater 1 wherein one of the principal surfaces of the plate-shaped ceramic member 2 having thickness from 1 to 7 mm is used as the mount surface 3 to place the wafer W thereon and the resistive heating member 5 is formed on the bottom surface of the plate-shaped ceramic member 2, it is preferable that thickness of the resistive heating member 5 is in a range from 5 to 50 μm and the area occupied by the resistive heating member 5 in the circumscribed circle C is in a range from 5 to 30% of the area of the circumscribed circle C that surrounds the resistive heating member 5.

When the area occupied by the resistive heating member 5 in the circumscribed circle C is less than 5% of the area of the circumscribed circle C that surrounds the resistive heating member 5, distances L1, L2 etc. in the resistive heating member 5 become too large, and therefore temperature of a portion above a part of the mount surface 3 that does not include the resistive heating member 5 becomes lower than that of the other portions, thus making it difficult to achieve uniform temperature distribution of the mount surface 3. When the area occupied by the resistive heating member 5 in the circumscribed circle C is larger than 30% of the area of the circumscribed circle C that surrounds the resistive heating member 5, on the other hand, thermal stress due to difference in the thermal expansion coefficient becomes large enough to deform the plate-shaped ceramic member 2, even when the difference in the thermal expansion coefficient between the plate-shaped ceramic member 2 and the resistive heating member 5 is made small within $2.0\times10^{-6}/°$ C. Even when the plate-shaped ceramic member 2 is made of a sintered ceramic material that is hard to deform, thickness t of the plate-shaped ceramic member 2 is as small as 1 to 7 mm. Thus the plate-shaped ceramic member 2 may warp to become concave on the mount surface 3 when the resistive heating member 5 is energized to heat. As a result, difference in temperature may become large, with the temperature of the wafer W becoming higher around the center than along the periphery.

The area occupied by the resistive heating member 5 in the circumscribed circle C is preferably in a range from 7 to 20%, more preferably from 8% to 15% of the area of the circumscribed circle C.

More specifically, distance L1 is preferably 0.5 mm or more and not more than three times the thickness of the plate-shaped ceramic member 2. When distance L1 is less than 0.5 mm, whisker-like protrusion that can cause short-circuiting may be produced in a region opposing the resistive heating member 5, when printing the resistive heating member 5. When distance L1 is more than three times the thickness of the plate-shaped ceramic member 2, a cold zone may be produced on the surface of the wafer W at position corresponding to the distance L1, thus increasing the temperature difference across the surface of the wafer W.

In order to efficiently achieve the effect described above, thickness of the resistive heating member 5 is preferably in a range from 5 to 50 μm.

When thickness of the resistive heating member 5 is less than 5 μm, it becomes difficult to form the resistive heating member 5 with uniform thickness by the screen printing process. When thickness of the resistive heating member 5 is larger than 50 μm, the resistive heating member 5 becomes too rigid due to the relatively large thickness, even when the area occupied by the resistive heating member 5 is set to not larger than 30% of the area of the circumscribed circle C. As a result, the plate-shaped ceramic member 2 may be deformed due to expansion and shrinkage of the resistive heating member 5 caused by the temperature change of the plate-shaped ceramic member 2. Also it becomes difficult to form the resistive heating member 5 with uniform thickness by the screen printing process, resulting in large temperature difference across the surface of the wafer W. Thickness of the resistive heating member 5 is more preferably in a range from 10 to 30 μm.

Now the constitution of the members of the heater 1 of the present invention will be described in detail.

It is understood that the present invention is not limited to the specific examples described below.

In the heater 1 shown in FIG. 1, the plate-shaped ceramic member 2 has thickness t in a range from 1 to 7 mm, and Young's modulus in a range from 200 to 450 MPa in a temperature range from 100 to 200° C.

Alumina, silicon nitride, sialon or aluminum nitride may be used as the material to form the plate-shaped ceramic member 2 having Young's modulus in a range from 200 to 450 MPa in a temperature range from 100 to 200° C. Among these, aluminum nitride is the most suitable for the material to form the plate-shaped ceramic member 2 due to high thermal conductivity of 50 W/(m·K) or even 100 W/(m·K) or higher and high resistance against fluorine or chlorine corrosive gases, and against plasma.

Thickness of the plate-shaped ceramic member 2 is more preferably from 2 to 5 mm. When thickness of the plate-shaped ceramic member 2 is less than 2 mm, strength of the plate-shaped ceramic member 2 may become too low to endure the thermal stress when cooled down with cooling air that is blown from a gas nozzle 24 after being heated by the resistive heating member 5, thus causing cracks in the plate-shaped ceramic member 2. When thickness of the plate-shaped ceramic member 2 is more than 5 mm, heat capacity of the plate-shaped ceramic member 2 becomes large and requires a longer period of time for the temperature to stabilize after heating or cooling.

The plate-shaped ceramic member 2 is elastically fastened by passing bolt 16 through a bottomed metal casing 19 around an opening thereof, and screwing nut 20 via an elastic material 18 placed on the bottomed metal casing 19, while interposing the ring-shaped contact member 17 so that the plate-shaped ceramic member 2 and the bottomed metal casing 19 do not contact directly with each other. With this constitution, even when the bottomed metal casing 19 is deformed due to temperature change of the plate-shaped ceramic member 2, the deformation is absorbed by the elastic member 18, so that the plate-shaped ceramic member 2 is restricted from warping and the temperature of the wafer surface is prevented from varying due to the warp of the plate-shaped ceramic member 2.

Cross section of the ring-shaped contact member 17 may be of any shape including polygon and circle. In case the plate-shaped ceramic member 2 and the contact member 17 make planar contact with each other, heat transfer from the plate-shaped ceramic member 2 through the contact member 17 to the bottomed metal casing 19 can be restricted satisfactorily small when width of contact region between the plate-shaped ceramic member 2 and the contact member 17 is in a range from 0.1 mm to 13 mm. This enables it to heat the wafer W uniformly by minimizing temperature difference across the wafer surface. The width is more preferably in a range from 0.1 to 8 mm. If width of the contact region of the contact member 17 is less than 0.1 mm, the contact region may deform when the contact member is put into contact with the plate-shaped ceramic member 2, thus causing the contact member 17 to break. If width of the contact region of the contact member 17 is larger than 13 mm, heat of the plate-shaped ceramic member 2 is transferred to the contact member, thus resulting in lower temperature of the plate-shaped ceramic member 2 along the periphery thereof and difficulty in achieving uniform temperature distribution over the surface of the wafer W. Width of the contact region between the plate-shaped ceramic member 2 and the contact member 17 is more preferably in a range from 0.1 mm to 8 mm, and most preferably from 0.1 to 2 mm.

Heat conductivity of the contact member 17 is preferably lower than that of the plate-shaped ceramic member 2. When heat conductivity of the contact member 17 is lower than that of the plate-shaped ceramic member 2, it is made possible to achieve uniform temperature distribution over the surface of the wafer W that is placed on the plate-shaped ceramic member 2, and temperature of the plate-shaped ceramic member 2 can be quickly raised and lowered without being affected by the bottomed metal casing 19 due to small heat transfer to the contact member 17.

When heat conductivity of the contact member 17 is less than 10% of the heat conductivity of the plate-shaped ceramic member 2, heat transfer from the plate-shaped ceramic member 2 to the bottomed metal casing 19 decreases and more heat is transferred by the ambient gas (air in this case) and radiation from the plate-shaped ceramic member to the bottomed metal casing 19.

When heat conductivity of the contact member 17 is higher than the heat conductivity of the plate-shaped ceramic member 2, heat is transferred from the peripheral portion of the plate-shaped ceramic member 2 through the contact member 17 to the bottomed metal casing 19, thereby heating the bottomed metal casing 19 while the temperature of the peripheral portion of the plate-shaped ceramic member 2 decreases thus resulting in larger temperature difference across the wafer surface. Also because the bottomed metal casing 19 is heated, it takes longer time to cool down the plate-shaped ceramic member 2 due to high temperature of the metal casing 19 when it is attempted to cool down the plate-shaped ceramic member 2 by blowing air from the gas nozzle 24, or it takes longer time to heat the plate-shaped ceramic member 2 to a predetermined temperature.

The material used to make the contact member 17 preferably has Young's modulus of 1 GPa or higher, and more preferably 10 GPa or higher, in order to be held via a small contact area. Such a level of contact area enables it to minimize the deformation of the contact member 17 even when the plate-shaped ceramic member 2 is fastened by means of the bolt 16 onto the bottomed metal casing 19 via the contact member 17 having small contact region of 0.1 mm to 8 mm in width. Thus the plate-shaped ceramic member 2 can be prevented from being displaced or deviating from parallelism so as to remain held precisely.

Use of the contact member 17 having a high Young's modulus also makes it possible to achieve a high accuracy that cannot be obtained with a contact member made of fluorocarbon resin or a resin reinforced with glass fiber as described in Japanese Unexamined Patent Publication (Kokai) No. 2001-313249.

The material used to make the contact member 17 is preferably a metal such as carbon steel or special steel that contains nickel, manganese and/or chromium due to high value of Young's modulus. The material used to make the contact member 17 also preferably has heat conductivity that is lower than that of the plate-shaped ceramic member 2, such as stainless steel or Fe—Ni—Co alloy, the so-called Kovar.

Further, in order to hold the plate-shaped ceramic member 2 in stable condition with small contact area between the contact member 17 and the plate-shaped ceramic member 2 while reducing the possibility of the contact region being chipped into particles even with a small contact area, the cross section of the contact member 17 along the plane perpendicular to the plate-shaped ceramic member 2 preferably has circular shape rather than polygon, Use of a wire having circular section 1 mm in diameter as the contact member 17 makes it possible to achieve uniform temperature distribution over the surface of the wafer W and quickly raise and lower the temperature without causing displacement of the plate-shaped ceramic member 2 and the bottomed metal casing 19.

The bottomed metal casing 19 has side wall 22 and bottom 21, and the plate-shaped ceramic member 2 is placed so as to cover the opening of the bottomed metal casing 19. The bottomed metal casing 19 also has a hole 23 for discharging the cooling gas, while the power terminals 11 connected to the power feeder section 6 for supplying electric power to the resistive heating member 5 of the plate-shaped ceramic member 2, the gas nozzle 24 for cooling the plate-shaped ceramic member 2 and a thermocouple 27 for measuring the temperature of the plate-shaped ceramic member 2 are provided.

It is preferable that the bottomed metal casing 19 has a depth of 10 to 50 mm, with the bottom 21 disposed at a distance of 10 to 50 mm, more preferably 20 to 30 mm from the plate-shaped ceramic member 2. This makes it easy to equalize the heating of the mount surface 3 though exchange of radiation heat between the plate-shaped ceramic member 2 and the bottomed metal casing 19. Also as thermal insulation with the outside is provided, time required for the mount surface 3 to reach stabilized and uniform temperature distribution is reduced.

The lift pins 25 provided movably in the vertical direction in the bottomed metal casing 19 place the wafer W on the mount surface 3 and lift the wafer W from the mount surface 3. The wafer W is held in the state of being lifted from the mount surface 3 by the wafer support pins 8, so as to prevent the temperature from unevenly distributed due to uneven bearing or other cause.

To heat the wafer W with the heater 1, the wafer W that has been transferred to above the mount surface 3 by a transfer arm (not shown) is held by the lift pins 25, then the lift pins 25 are lowered thereby to place the wafer W on the mount surface 3.

When the heater 1 is used in forming the resist film, it is preferable to use the plate-shaped ceramic member 2 that is made of silicon carbide as the main component since this material does not generate a gas through reaction with moisture that is contained in the atmosphere, thus making it possible to form fine wiring in high density without affecting the resist film structure, even when used in applying the resist film onto the wafer W. Care should be paid at this time, so that a sintering assist agent does not contain nitrogen that may react with water and form ammonia and/or amine.

Sintered body of silicon carbide that forms the plate-shaped ceramic member 2 is made by mixing silicon carbide as the main component and boron (B) or carbon (C) as the sintering aid, or adding a metal oxide such as alumina ($Al_2O_3$) or yttria ($Y_2O_3$) to be formed in plate shape after mixing well, and sintering at a temperature from 1900 to 2100° C. Silicon carbide based on either a type or B type may be used.

When the sintered body of silicon carbide is used as the plate-shaped ceramic member 2, the insulation film that isolates the plate-shaped ceramic member 2 having semi-conductivity and the resistive heating member 5 may be made of glass or a resin. When glass is used, withstanding voltage is below 1.5 kV and sufficient insulation cannot be ensured when the thickness is less than 100 μm. When the thickness is more than 400 μm, cracks may be generated to make the layer unable to function as an insulation layer, due to large difference in thermal expansion between the insulation layer and the sintered body of silicon carbide that forms the plate-shaped ceramic member 2 or sintered aluminum nitride. Therefore, thickness of the insulation layer made of glass is preferably in a range from 100 to 400 μm, more preferably in a range from 200 to 350 μm.

The principal surface of the plate-shaped ceramic member 2 opposite to the mount surface 3 is preferably polished to achieve flatness within 20 μm and mean surface roughness (Ra) in a range from 0.1 μm to 0.5 μm, in order to improve the adhesion of the surface with the insulation layer that is made of glass or resin.

When the plate-shaped ceramic member 2 is made of a sintered material based on aluminum nitride as the main component, an oxide of rare earth element such as $Y_2O_3$ or $Yb_2O_3$ and, as required, an oxide of alkali earth metal such as CaO are added as the sintering assist agent to the main component of aluminum nitride and, after mixing well and forming into plate shape, sintered at a temperature from 1900 to 2100° C. in a nitrogen gas. In order to improve adhesion of the resistive heating member 5 with the plate-shaped ceramic member 2, an insulation layer made of glass may be formed, but may be omitted in case sufficient amount of glass is in the resistive heating member 5 and sufficient bonding strength is obtained accordingly.

The glass used to form the insulation layer may be either crystalline or amorphous in nature, a material having durable temperature of 200° C. or higher and thermal expansion coefficient in a range from −5 to +5×10$^{-7}$/° C. in a temperature range from 0 to 200° C. with respect to the thermal expansion coefficient of the ceramics that forms the plate-shaped ceramic member 2 is preferably used. Use of glass having a value of thermal expansion coefficient out of the range described above may lead to defects such as crack and peel-off when cooled down after bonding the glass due to large difference from the thermal expansion coefficient of the ceramics that forms the plate-shaped ceramic member 2.

The insulation layer made of glass may be formed on the plate-shaped ceramic member 2 by dropping an appropriate quantity of glass paste onto the center of the plate-shaped ceramic member 2 and spreading it to form a uniform film by spin coating method, or applying the glass paste uniformly by screen printing, dipping, spray coating or the like, and firing the glass paste at a temperature of 600° C. or higher. When the insulation layer is made of glass, adhesion of the insulation layer made of glass and the plate-shaped ceramic member 2 made of sintered body of silicon carbide or sintered aluminum nitride can be improved by heating the plate-shaped ceramic member 2 at a temperature from 850 to 1300° C. thereby to oxidize the surface to be covered by the insulation layer.

Figure 3:
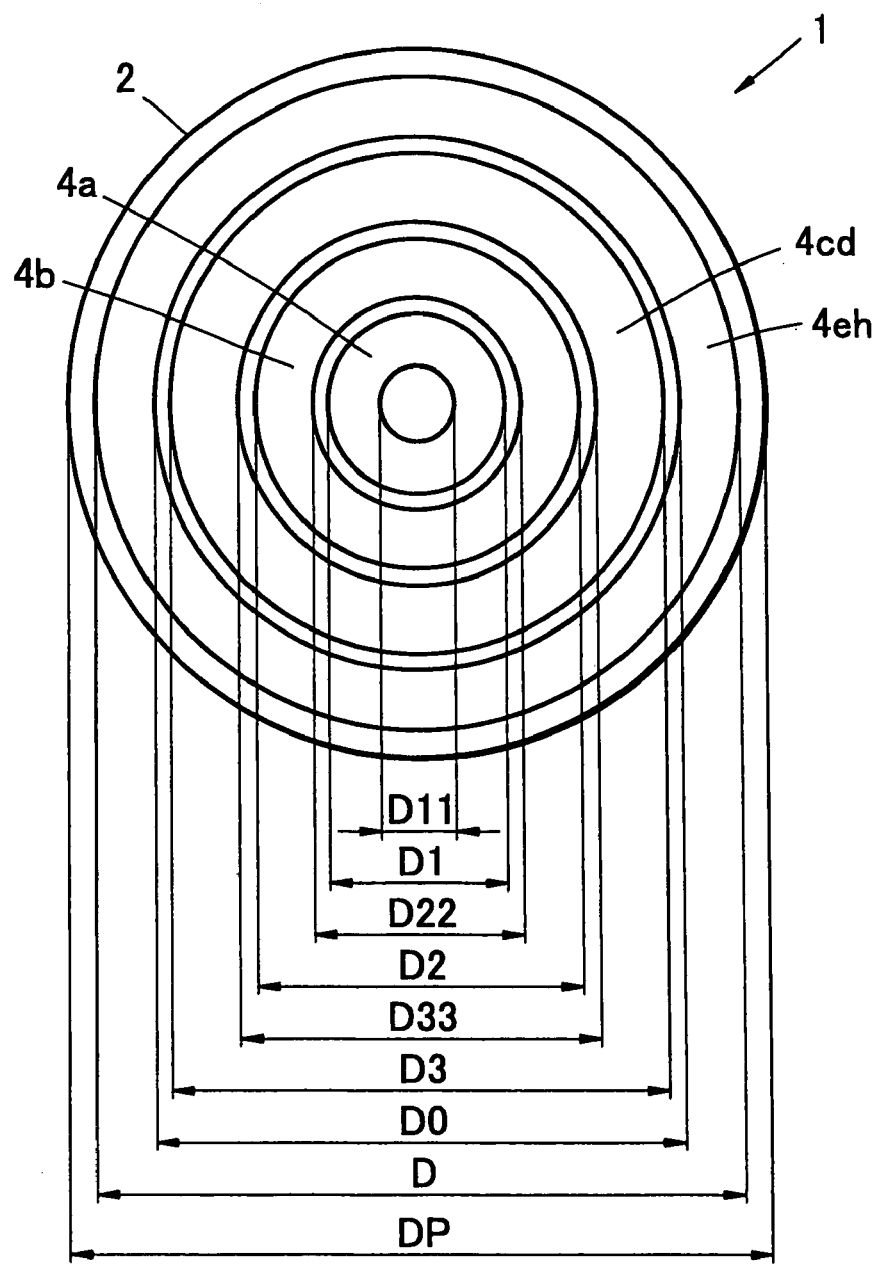
FIG. 3A is a plan view showing a preferable example of ring-shaped resistive heating member zone according to the present invention.
FIG. 3B is a plan view showing an example of dividing the resistive heating member zone into a plurality of portions outside the ring-shaped resistive heating member zone of FIG. 3A.
Figure 3:
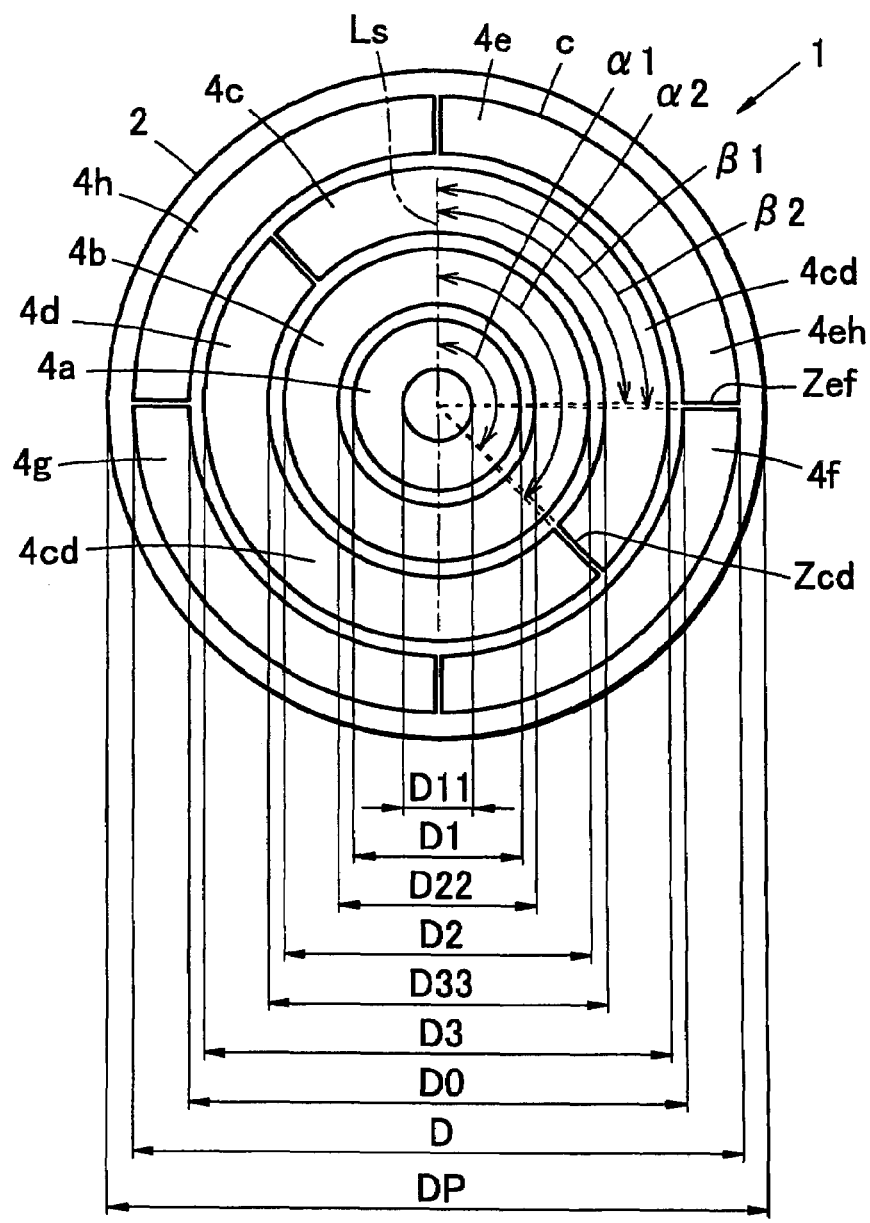
Figure 20:
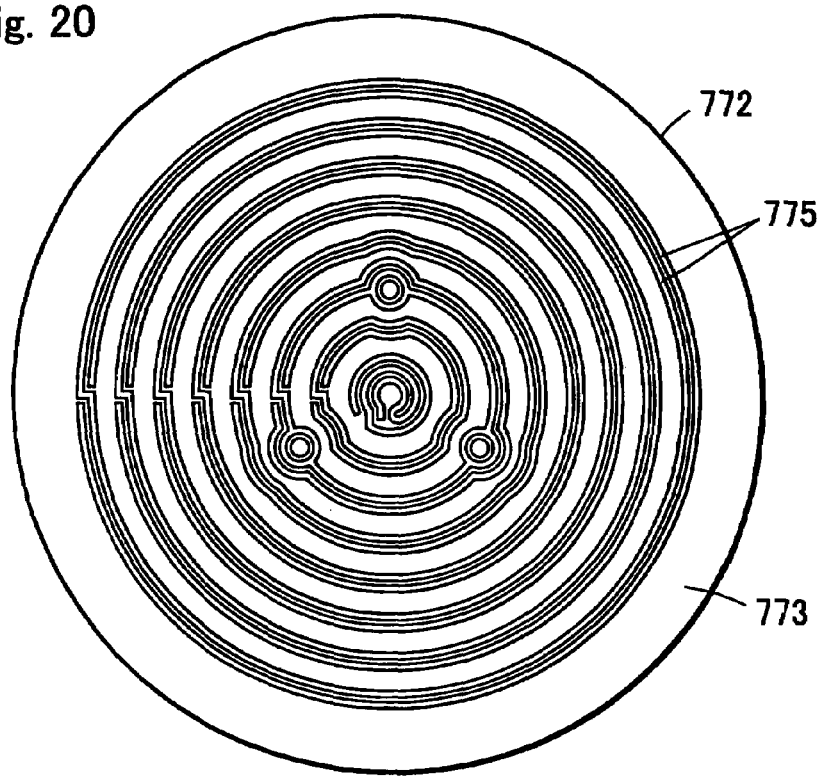
FIG. 20 is a schematic diagram showing the configuration of another resistive heating member of the prior art.
Figure 21:
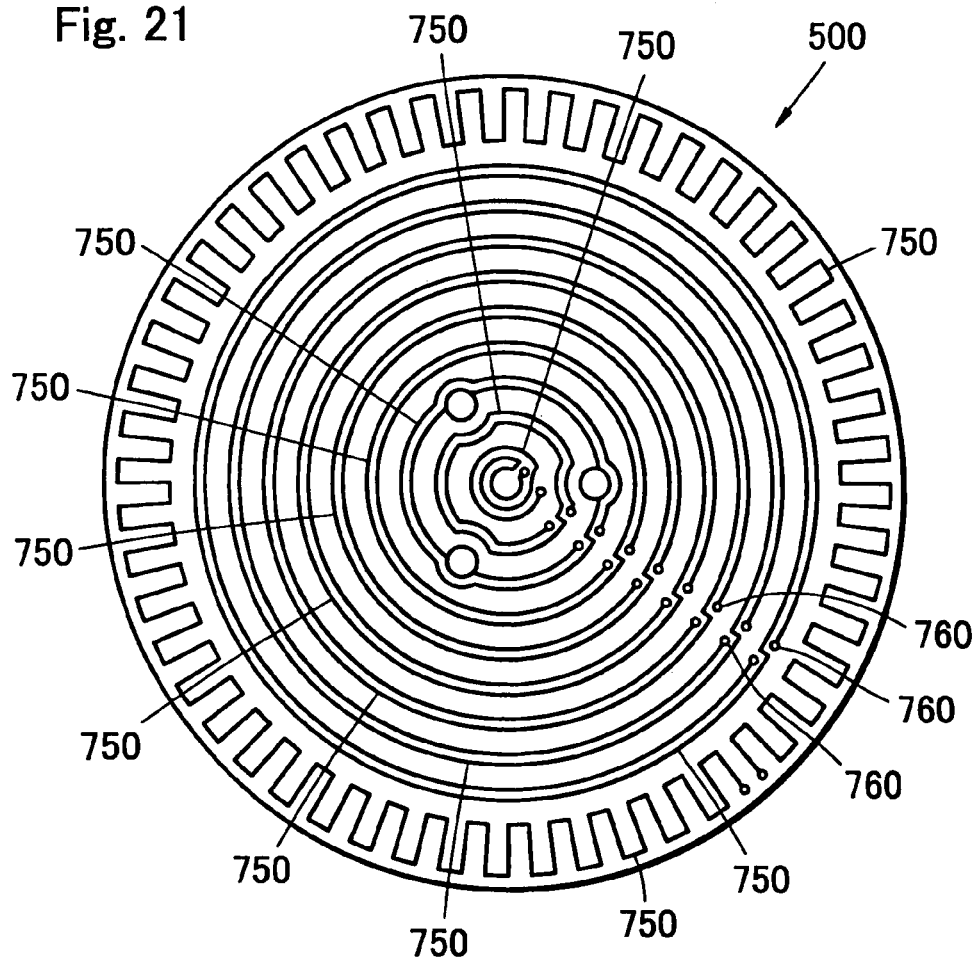
FIG. 21 is a schematic diagram showing the configuration of another resistive heating member of the prior art.
Figure 22:
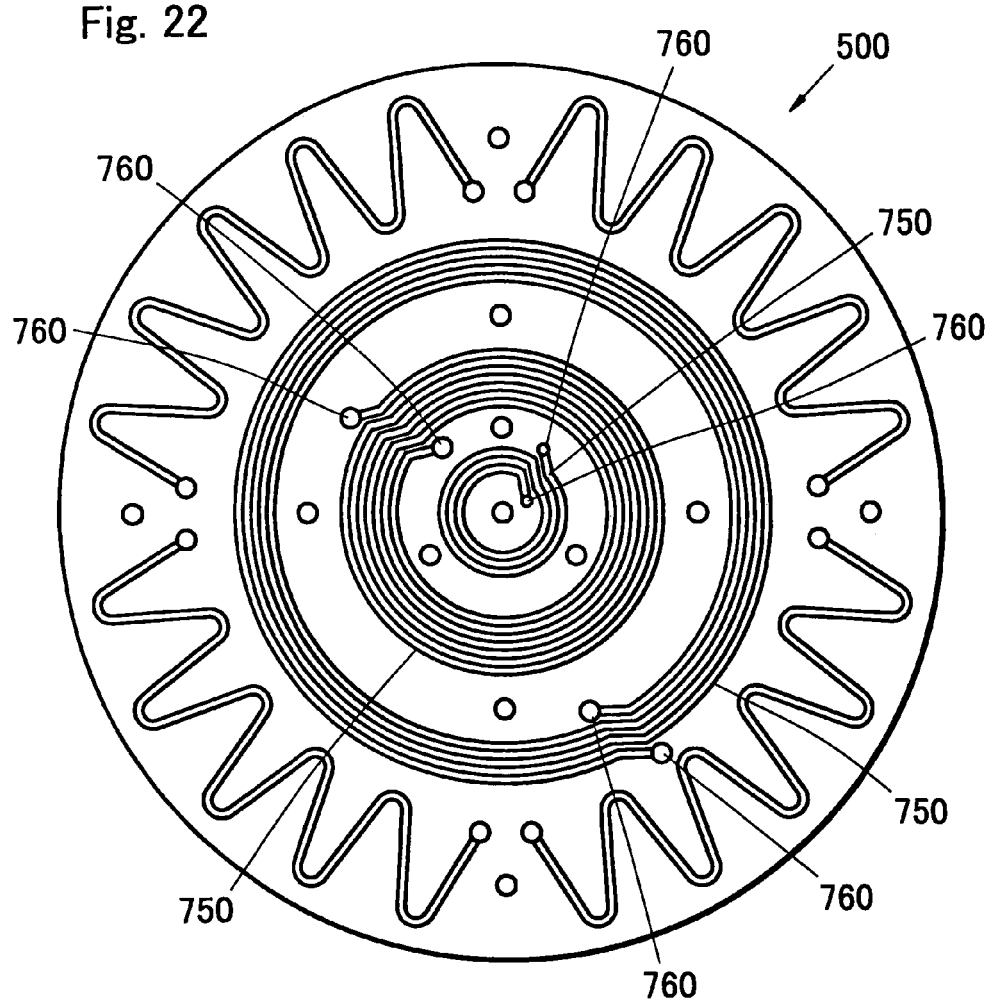
FIG. 22 is a schematic diagram showing the configuration of another resistive heating member of the prior art.

The resistive heating member 5 of the present invention is preferably divided into a plurality of blocks as shown in FIG. 3 and FIG. 4 and formed in such a configuration as each block consists of arc and straight sections turning back in spiral or zigzag shape. Since it is important to achieve uniform temperature distribution over the surface of the wafer W for the heater 1 of the present invention, it is preferable that the resistive heating member 5 of band shape has uniform density. Such a configuration of the resistive heating member as shown in FIG. 20 where regions that include resistive heating member 772 disposed densely therein and regions that include resistive heating member 772 disposed sparsely therein are repeated alternately is not desirable since surface temperature of the wafer W varies between the dense region and the sparse region.

When the resistive heating member 5 is divided into a plurality of resistive heating member zones, it is preferable to control the temperature of each zone independently so as to achieve uniform temperature distribution over the surface of the wafer W placed on the mount surface 3.

The resistive heating member 5 may be formed by printing an electrode paste containing electrically conductive metal particles, glass frit and metal oxide, onto the plate-shaped ceramic member 2 and baking it. At least one kind of metal selected from among Au, Ag, Cu, Pd, Pt and Rh is preferably used as the metal particles, and the glass frit is preferably a low-expansion glass that is made of an oxide of metal containing B, Si and Zn and has thermal expansion coefficient of 4.5×10$^{-6}$/° C. or lower, lower than that of the plate-shaped ceramic member 2. The metal oxide is preferably one kind selected from among silicon oxide, boron oxide, alumina and titania.

The reason for using at least one kind of metal selected from among Au, Ag, Cu, Pd, Pt and Rh as the metal particles that form the resistive heating member 5 is because of the low electrical resistance of these metals.

The glass frit that forms the resistive heating member 5 is made of an oxide of metal containing B, Si and Zn, and the metal particles that constitute the resistive heating member 5 have thermal expansion coefficient higher than that of the plate-shaped ceramic member 2, and therefore it is preferable to use a low-expansion glass that has thermal expansion coefficient of 4.5×10$^{-6}$/° C. or lower, lower than that of the plate-shaped ceramic member 2, in order to make the thermal expansion coefficient of the resistive heating member 5 proximate to that of the plate-shaped ceramic member 2.

The reason for using at least one kind selected from among silicon oxide, boron oxide, alumina and titania as the metal oxide that forms the resistive heating member 5 is that these metal oxides have high adhesion with the metal particles contained in the resistive heating member 5 and have thermal expansion coefficients proximate to that of the plate-shaped ceramic member 2, thus showing high adhesion also with the plate-shaped ceramic member 2.

It is not desirable, however, that the content of the metal oxide in the resistive heating member 5 exceeds 80%, since resistance of the resistive heating member 5 becomes higher despite increased adhesion with the plate-shaped ceramic member 2. Therefore content of the metal oxide is preferably not higher than 60%.

The resistive heating member 5 that is made of the electrically conductive metal particles, the glass frit and the metal oxide preferably has thermal expansion coefficient of which difference from that of the plate-shaped ceramic member 2 is not greater than 3.0×10$^{-6}$/° C.

This is because it is difficult to constrain the difference in thermal expansion coefficient between the resistive heating member 5 and the plate-shaped ceramic member 2 to 0.1×10$^{-6}$/° C. for the reason of the manufacturing process, and a difference in thermal expansion coefficient between the resistive heating member 5 and the plate-shaped ceramic member 2 larger than 3.0×10$^{-6}$/° C. may lead to warping of the mount surface 3 in concave shape due to thermal stress generated between the resistive heating member 5 and the plate-shaped ceramic member 2, when the resistive heating member 5 is energized.

The insulation layer may be coated with the resistive heating member 5 by forming a coating of metal such as gold (Au), silver (Ag), copper (Cu) or palladium (Pd) by vapor deposition or plating process, printing a paste made of a resin paste or a glass paste containing electrically conductive metal oxide such as rhenium oxide ($Re_2O_3$) or lanthanum manganate ($LaMgO_3$) or the metallic material described above dispersed in the paste, and baking the paste so as to bind the electrically conductive material with the matrix made of resin or glass. Glass, when used as the matrix, may be either crystallized glass or amorphous glass, but preferably crystallized glass is used in order to minimize the change in resistance due to thermal cycle.

When silver (Ag) or copper (Cu) is used for the resistive heating member 5, there arises the possibility of migration. In this case, a coating layer of the same material as the insulation layer having thickness of about 40 to 400 μm may be formed to cover the resistive heating member 5.

The resistive heating member 5 is supplied with electric power by pressing the power terminals 11 provided on the bottomed metal casing 19 onto the power feeder section 6 formed on the surface of the plate-shaped ceramic member 2 by means of a spring (not shown) thereby establishing electrical continuity. This is because forming the terminals by embedding the metal member in the plate-shaped ceramic member 2 that is 2 to 5 mm in thickness adversely affects the uniformity of heating due to the heat capacity of the terminals. When electrical continuity is established by pressing the power terminals 11 by the spring as described above, thermal stress due to the temperature difference between the plate-shaped ceramic member 2 and the bottomed metal casing 19 can be mitigated so as to maintain electrical continuity with high reliability. Moreover, since the contact is prevented from being concentrated to a point, an electrically conductive material having elasticity may be inserted as an intermediate layer. The effect of the intermediate layer can be achieved simply by inserting a foil sheet. Diameter of the power feeder section 6 of the power terminal 11 is preferably in a range from 1.5 to 5 mm.

Temperature of the plate-shaped ceramic member 2 is measured by means of the thermocouple 27 of which distal end is embedded in the plate-shaped ceramic member 2. The thermocouple 27 is preferably of sheathed type having outer diameter of 0.8 mm or less, in consideration of the response characteristic and the ease of maintenance. The distal end of the thermocouple is preferably secured in a hole formed in the plate-shaped ceramic member 2 while being pressed against the inner wall surface of the hole by means of a fastening member provided in the hole, in order to ensure the reliability of measurement. Temperature may be measured also by embedding a thermocouple of bare wire or a temperature measuring resistor such as Pt.

As shown in FIG. 1, on one of the principal surfaces of the plate-shaped ceramic member 2, a plurality of support pins 8 may be provided so as to hold the wafer W at a predetermined distance from one of the principal surfaces of the plate-shaped ceramic member 2.

The wafer heater 1 that is provided only with the resistive heating member 5 on the other principal surface 3 of the plate-shaped ceramic member 2 is shown in FIG. 1. It goes without saying that electrode may be provided between the principal surface 3 and the resistive heating member 5 for the purpose of electrostatic attraction or generating plasma.

Embodiment 2

A heater according to the second embodiment of the present invention is constituted similarly to the heater 1 of the first embodiment, except for the positioning of the temperature measuring element 27 that is specified in relation to the resistive heating member 5 and the power feeder section 6. In the second embodiment, preferable form is similar to that of the first embodiment. In the drawings referred to in the second embodiment, components similar to those of the first embodiment will be identified with similar reference numerals.

The heater according to the second embodiment of the present invention has such a constitution as one of the principal surfaces of the plate-shaped ceramic member 2 is used as a mount surface (heating surface) 3 for heating an object, with the resistive heating member 5 running in a U shaped configuration comprising a plurality of arc bands and linkage arc band inside or on the other principal surface, and the temperature measuring element 27 that measures the temperature of the plate-shaped ceramic member 2 or the object to be heated is disposed as described below. In the second embodiment, the power feeder sections 6 connected to both ends of the resistive heating member 5 are disposed outside of the ring-shaped resistive heating member zone and the temperature measuring element 27 is disposed in the ring-shaped resistive heating member zone, so as to minimize the temperature difference across the wafer surface and decrease the temperature difference across the wafer surface during transitional phase.

Figure 5:
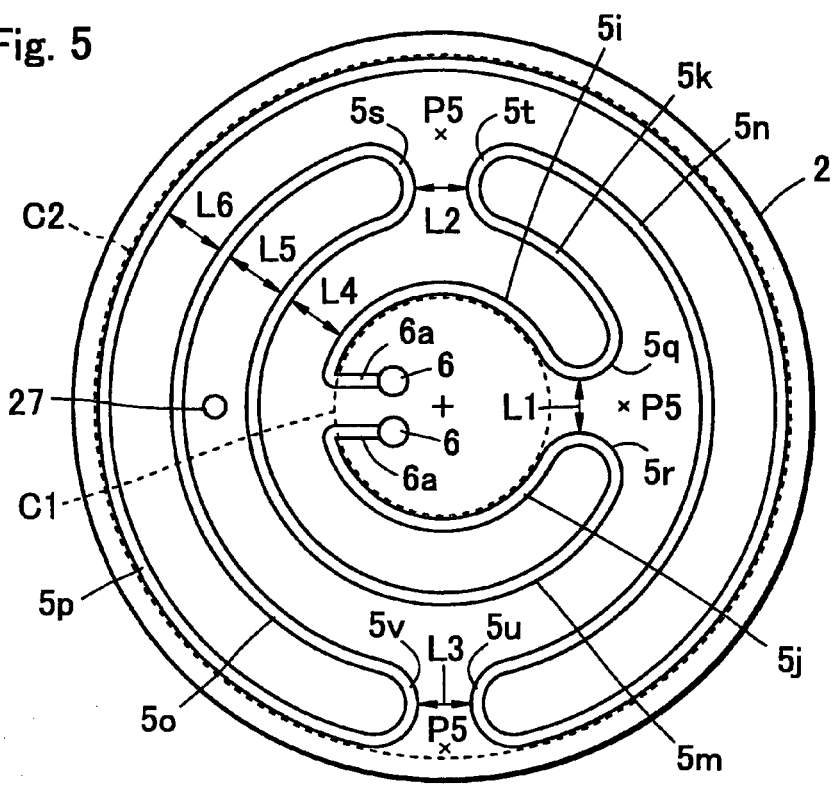
FIG. 5 is a plan view showing an example of constitution of the resistive heating member of the heater according to the second embodiment of the present invention.
Figure 6:
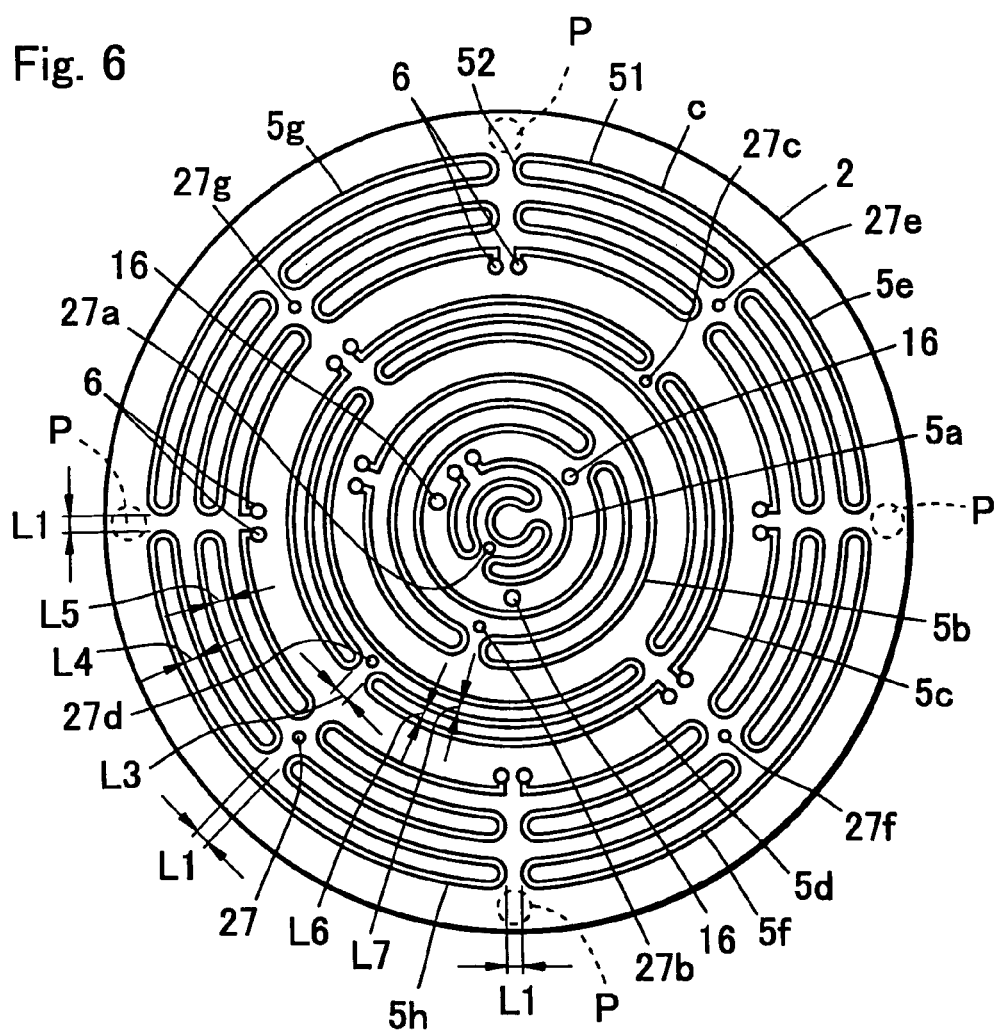
FIG. 6 is a schematic diagram showing another example of constitution of the resistive heating member of the heater according to the second embodiment of the present invention.

FIG. 5 shows the positions of the resistive heating member 5, the power feeder sections 6 and the temperature measuring element 27 disposed in the heater 1 of the second embodiment, where the position of the power feeder section 6 is different from that of the first embodiment shown in FIG. 2, and the position of the temperature measuring element 27 is explicitly indicated. Specifically, in the heater of the second embodiment, the two power feeder sections 6 are provided within the inscribed circle C1 of the resistive heating member 5, and are connected to the ends of the resistive heating member 5 with feeder wires 6a. The temperature measuring element 27 is provided in the resistive heating member zone that is defined as a region disposed between the inscribed circle C1 of the resistive heating member 5 and the circumscribed circle C2 of the resistive heating member 5. Constitution of the resistive heating member 5 is the same as that of the resistive heating member described in the first embodiment with reference to FIG. 2, and will be omitted here.

It is necessary to reliably connect the power feeder sections 6, that feed the electric power to the resistive heating member 5, with the power terminals 11, and it is preferable to use a material that has low electrical resistance and make the width larger than that of the band so as to keep the resistance low, in order to prevent the power feeder sections from generating heat. Temperature difference across the wafer surface can be minimized by disposing the power feeder sections 6 outside of the ring-shaped resistive heating member zone adjacent thereto, so as to achieve centrally symmetric heating of the mount surface 3 of the plate-shaped ceramic member 2. The temperature measuring element 27 disposed in the ring-shaped resistive heating member zone enables it to accurately monitor the temperature of the mount surface 3 being heated by the resistive heating member 5, and accordingly minimize the delay in time of measuring the wafer W and minimize the measurement error. The power feeder sections 6 and the resistive heating member 5 are connected preferably with lead wires that have smaller resistance and larger width than the resistive heating member 5. The power feeder sections 6 and the power terminals 11 are connected preferably by brazing or pressure contact.

The power feeder sections 6 are preferably formed in circular or polygonal shape larger than the width of the resistive heating member 5, for the purpose of connecting to the power terminals 11. In the heater described in Japanese Unexamined Patent Publication (Kokai) No. 2001-257200, that has a temperature measuring element disposed between independent resistive heating members having rectangular shape, it is difficult to precisely control the temperature of the resistive heating member and it is impossible to decrease the temperature difference across the wafer surface, thus the concept is entirely different from that of the present invention.

While the power feeder sections 6 are disposed inside (within the inscribed circle C1) in FIG. 5, it goes without saying that similar effect can be obtained when the power feeder sections 6 are disposed outside (outside of the circumscribed circle C2).

Embodiment 3

Figure 7:
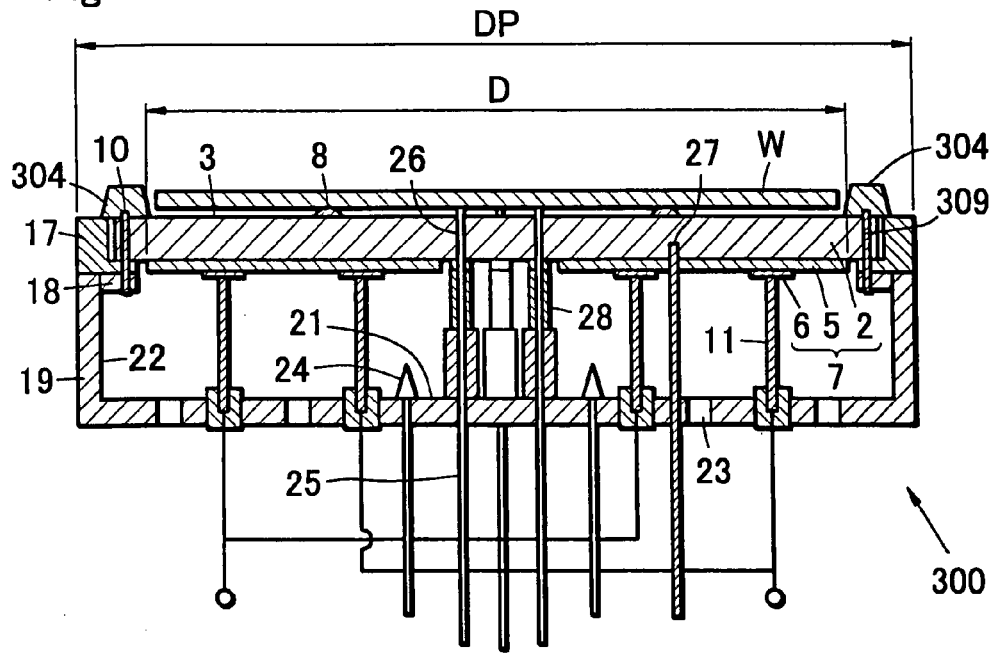
FIG. 7A is a sectional view showing the constitution of the heater according to the third embodiment of the present invention.
FIG. 7B is a plan view of the heater of the third embodiment.
Figure 7:
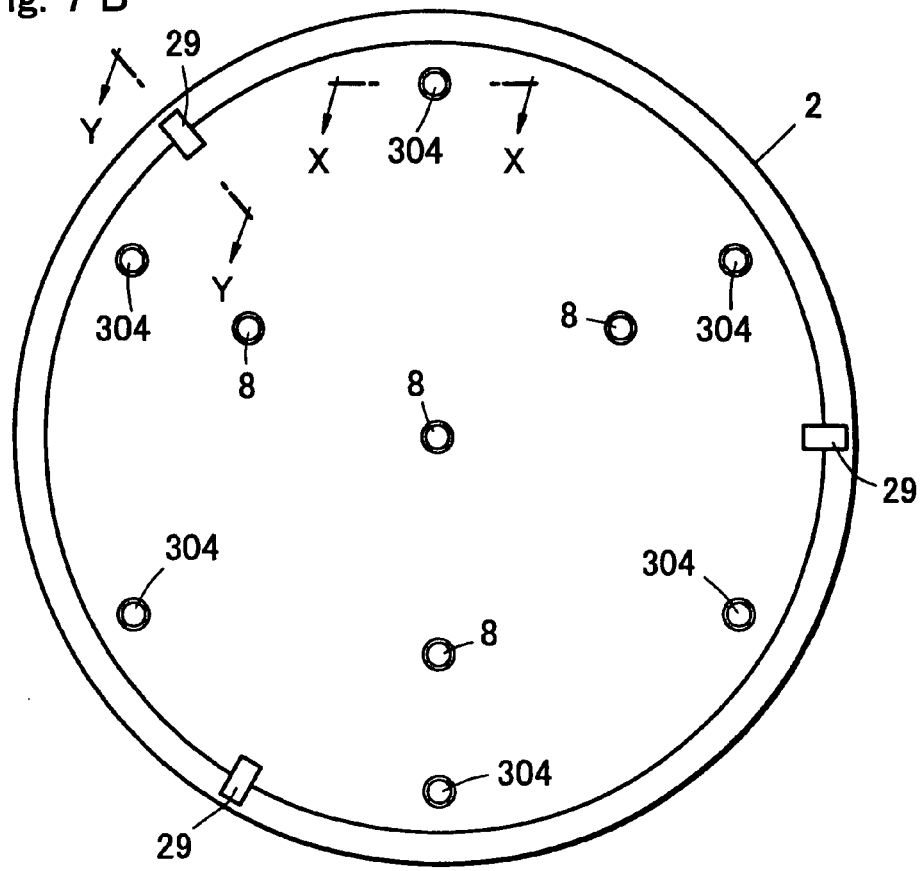

FIG. 7A is a sectional view showing the constitution of a heater 300 according to the third embodiment of the present invention.

The heater 300 of the third embodiment has such a constitution as an example of which is shown in FIGS. 7A, 7B where three or more peripheral protrusions 304 are provided along the periphery of the mount surface 3 and inner protrusions (wafer support pin) 8 that are lower than the peripheral protrusions 304 in height are provided inside of the peripheral protrusions 304, so that the peripheral protrusions 4 are held so as to be movable in at least one of radial direction of the plate-shaped ceramic member and vertical direction. Constitution of the third embodiment is similar to that of the first embodiment except for the points described below.

Figure 8:
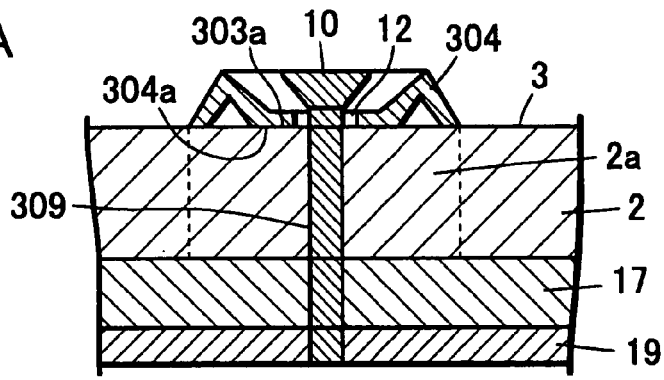
FIG. 8A is an enlarged sectional view of first example of the peripheral protrusion of the third embodiment.
FIG. 8B is an enlarged sectional view of second example of the peripheral protrusion of the third embodiment.
FIG. 8C is an enlarged sectional view of third example of the peripheral protrusion of the third embodiment.
FIG. 8D is an enlarged sectional view of fourth example of the peripheral protrusion of the third embodiment.
Figure 8:
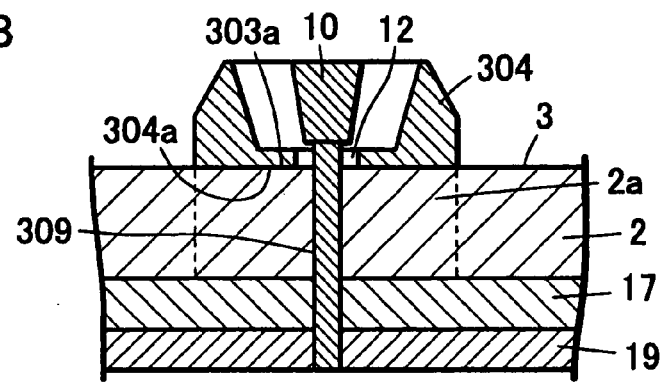
Figure 8:
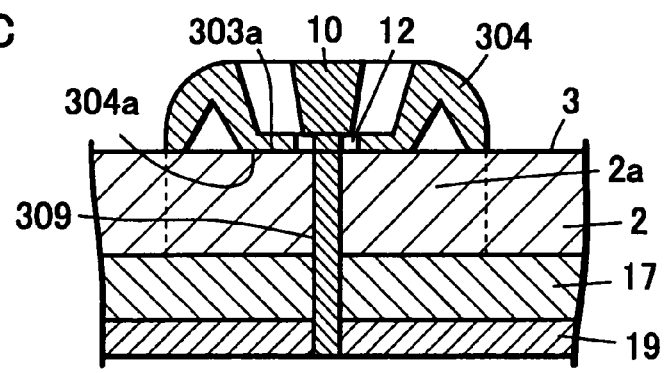
Figure 8:
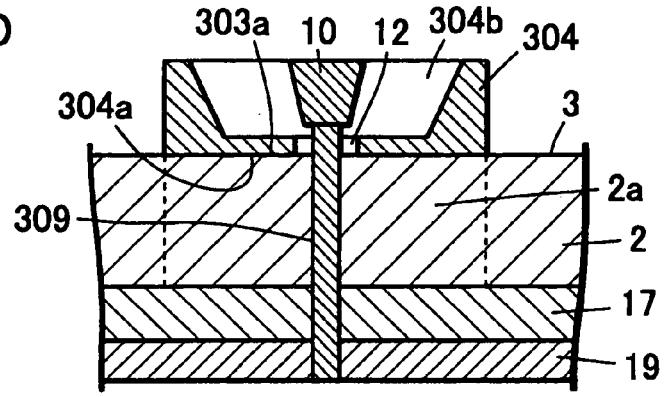

In the third embodiment, as shown in FIGS. 8A, 8B, a space is secured between fastening holes 12 of the peripheral protrusions 304 and the bolts 10 that fasten the peripheral protrusions 304, so that the peripheral protrusions 304 can move in both the radial direction of the plate-shaped ceramic member and vertical direction over this space.

In the case of the heaters described in Japanese Unexamined Patent Publication (Kokai) No. 10-229114 and Japanese Unexamined Patent Publication (Kokai) No. 2002-237375 that have ring-shaped protrusions that prevent lateral displacement of the wafer W, there is a problem that the plate-shaped ceramic member becomes too thick along the periphery that means large heat capacity of the peripheral portion of the plate-shaped ceramic member, thus resulting in large temperature difference across the wafer surface during transitional phase of heating. In the heater 300 of the third embodiment, in contrast, the temperature difference across the wafer surface during transitional phase can be prevented from increasing and lateral displacement of the wafer W can be prevented, by providing the peripheral protrusions 304 that are isolated along the periphery of the plate-shaped ceramic member 2.

The peripheral protrusions 304 are required for positioning of the wafer W when the wafer W is placed on the mount surface 3, but also have the effect of increasing the temperature difference across the surface. In addition to the heat capacity of the peripheral protrusions 304, transfer of heat from the peripheral protrusions 304 through the bolts 10 into the casing 19 may increase temperature difference across the surface of the wafer W. Therefore it is preferable to provide means of restricting the heat transfer from the peripheral protrusions 304 to the bolts 10. In the third embodiment, therefore, the gap is provided between the fastening holes 12 that fasten the peripheral protrusions 304 located above the mount surface 3 and the bolts 10, so as to mitigate the heat transfer from the peripheral protrusions 304 to the bolts 10. As a result, in the heater of the third embodiment, heat transferred through the bolts 10 to the casing 19 and the contact member 17 is reduced, thus preventing the temperature of the peripheral protrusions 304 from lowering along the periphery. Size of the gap is preferably from 0.3 to 2 mm in the difference between the diameter of the through hole and outer diameter of the bolt, more preferably from 0.5 to 1.5 mm, which results in high insulation effect.

In the third embodiment, in order to further decrease the temperature difference across the wafer surface, it is preferable to form a through hole 309 in the plate-shaped ceramic member 2 and pass the bolt 10 through the through hole 309 for securing, so as to prevent lateral displacement of the peripheral protrusions 304 and the plate-shaped ceramic member 2. When the peripheral protrusions 304 are fastened onto the plate-shaped ceramic member 2 firmly by the bolt 10, heat transfer between the plate-shaped ceramic member 2 and the bottom surface of the peripheral protrusions 304 increases, thus allowing heat to flow from the plate-shaped ceramic member 2 via the bolt 10 to the casing 19, resulting in the decrease in temperature of the plate-shaped ceramic member 2 around the peripheral protrusions 304 and decrease in temperature of the wafer W. Therefore, it is preferable to fasten the peripheral protrusions 304 not firmly on the plate-shaped ceramic member 2 but with a force just required to prevent lateral displacement by means of the bolt 10. Specifically, it is preferable that the peripheral protrusions 304 are allowed to make lateral displacement of about 0.3 to 2 mm. By connecting in this way, contact area between the bolt 10 and the peripheral protrusion 304 becomes smaller resulting in narrower passage for heat to dissipate through the peripheral protrusion 304. In the third embodiment, this constitution enables it to maintain uniform temperature distribution over the mount surface, thus decreasing the temperature difference across the mount surface 3 of the wafer W during transitional phase when changing the temperature.

In the structure of the third embodiment, after the wafer W has been transferred from an arm, that is not shown in the drawing, onto the wafer lift pins 25 that protrude from the mount surface 3 of the plate-shaped ceramic member 2, the wafer lift pins 25 descend so that the wafer W is placed on the inner protrusion 8 provided on the mount surface 3 while being guided by the peripheral protrusion 4. In order to decrease temperature difference across the surface of the wafer W, it is important to place the wafer W precisely by aligning the center of the wafer on the center of the plate-shaped ceramic member 2. Therefore, it is preferable that the periphery of the wafer W is guided by the peripheral protrusion 304 in contact therewith and is supported by the inner protrusion 8.

FIGS. 8A through 8D are enlarged sectional views of a part of the peripheral protrusions 304. FIG. 8A shows the peripheral protrusion 304 having a truncated cone shape and FIG. 8B shows the peripheral protrusions 4 having a cylindrical shape with a truncated cone connected on top thereof. FIG. 8C shows the peripheral protrusions 304 having a curved circumferential surface. FIG. 8D shows the peripheral protrusions 304 having cylindrical shape.

According to the present invention, cross section of the peripheral protrusion 304 parallel to the mount surface 3 is preferably circular, which makes it possible to reduce the size of the peripheral protrusion 304, minimize the decrease in temperature of the heater 7 along the periphery thereof, and make it easier to install.

The peripheral protrusion 304 is preferably cylindrical in shape, with smaller diameter at the top and larger diameter at the bottom. When the diameter is smaller at the top, the wafer W can be placed at the correct position while being guided along the inner surface of the peripheral protrusion 304, even when it is attempted to place the wafer W on the surface 3 in a displaced way.

In the heater 300 of the present invention, it is preferable that the casing 19 has the nozzle 24 and the opening 23 for discharging the cooling gas that has been ejected from the nozzle 24, in order to circulate the cooling gas along the inner surface surrounded by the heater 7 and the casing 19. It is preferable to provide the nozzle 24 and the opening 23, since this enables it to increase the rate of cooling the heater 1.

Mean surface roughness Ra of the circumferential surface of the peripheral protrusions 304 is preferably less than 3. When the surface roughness is larger than 3.0, wafer W may be worn off through friction with the peripheral protrusions 304 to generate particulate matter when it is attempted to correct the position of the wafer W while the peripheral edge of the wafer W is in contact with the peripheral protrusions 304, thus resulting in decreasing in yield of the wafer W. It is difficult to finish the peripheral protrusions 304 to have mean surface roughness Ra of 0.01 or less.

In order to prevent lateral displacement of the wafer W by means of the peripheral protrusion 304, at least three peripheral protrusions 304 are required on the same circle, and it is preferable that diameter of the circle inscribed to the peripheral protrusions 304 is from 1.001 to 1.03 times, more preferably from 1.001 to 1.02 times the diameter of the wafer W. Such an arrangement enables it to place the wafer W at the correct position on the mount surface 3, so that the wafer W can uniformly receive the heat from the mount surface 3 of the plate-shaped ceramic member 2, thus resulting in smaller temperature difference across the surface of the wafer W. More specifically, diameter of the circle inscribed to the peripheral protrusions 304 is preferably from 200.2 to 206 mm for a silicon wafer W that is 200 mm in diameter, and preferably from 300.3 to 309 mm for a silicon wafer W that is 300 mm in diameter. More preferably, diameter of the inscribed circle is from 200.2 to 204 mm, or from 300.3 to 306 mm.

The peripheral protrusions 304 of the present invention is preferably made of a circular ceramic member that has heat capacity less than three times the heat capacity of the plate-shaped ceramic member 2 that corresponds to the surface over which the peripheral protrusions 304 and the plate-shaped ceramic member 2 make contact with each other. The peripheral protrusions 304 are placed on the top surface along the periphery of the plate-shaped ceramic member 2. Therefore, temperature distribution over the mount surface 3 of the plate-shaped ceramic member 3 is important for achieving uniform temperature distribution over the wafer, and providing the peripheral protrusions 304 along the periphery of the mount surface 3 causes heat from the plate-shaped ceramic member 2 to flow to the peripheral protrusions 304 or from the peripheral protrusions 304 to the plate-shaped ceramic member 2 in accordance to the heat capacity of the peripheral protrusions 304. It was found that this heat transfer causes the temperature of the plate-shaped ceramic member 2 surrounding the peripheral protrusions 304 to rise or fall. Accordingly, heat transfer occurs mainly through contact surfaces 304a, 303a between the peripheral protrusions 304 and the plate-shaped ceramic member 2. Heat capacity of the peripheral protrusions 304 is preferably smaller, in order to keep temperature difference across the surface of the wafer W during stationary state within 0.5° C. or minimize the temperature difference across the surface during transition. When this heat capacity is less than three times the heat capacity of the cylindrical portion 2 a of the plate-shaped ceramic member 2 of which top surface is the contact surface 303a, it was found that the heat transfer becomes small resulting in larger temperature difference across the surface of the wafer W.

Figure 9:
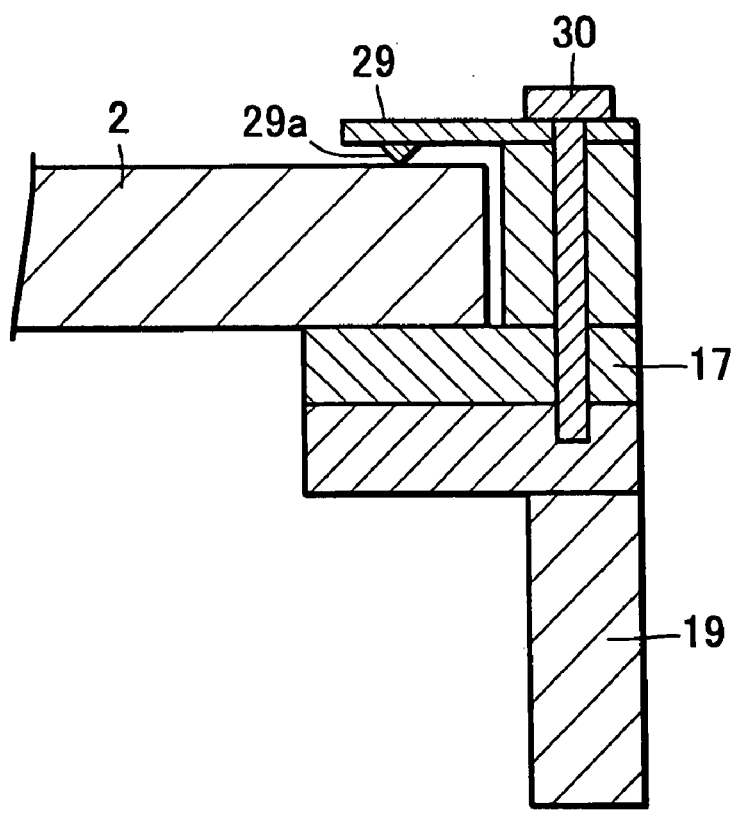
FIG. 9 is a sectional view taken along lines Y-Y of FIG. 7B.

Since the plate-shaped ceramic member 2 may undergo vertical displacement even when lateral displacement of the plate-shaped ceramic member 2 is prevented by means of the bolt 10, the plate-shaped ceramic member 2 is preferably pressed by clamp fittings 29 on the periphery thereof, as shown in FIG. 9. In order to prevent heat from flowing through the clamp fitting 29 into the casing 19, the clamp fittings 29 preferably press the plate-shaped ceramic member 2 by point contact on the protrusion 29a. It is preferable that the clamp fittings 29 are provided at three to five positions.

While the distance between the mount surface 3 and the wafer W is maintained by supporting the wafer W by the inner protrusion 8, it is preferable to dispose the inner protrusions 8 evenly distributed over the mount surface 3 in order to maintain the distance between the wafer W surface and the mount surface 3 uniform. It is preferable that at least one inner protrusion 8 is disposed within an area having diameter 0.5 times that of the circle inscribed to the peripheral protrusions 304 from the center of the mount surface 3, and at least three inner protrusions 8 are disposed within an area ranging 0.5 to 1 time the diameter of the inscribed circle, which enables it to support the wafer without uneven bearing with minimum deformation of the wafer W. Thus deformation and warping of the wafer W due to gravity can be prevented from occurring, resulting in smaller temperature difference across the surface of the wafer W.

By supporting the wafer W at a predetermined space from the mount surface 3 via the inner protrusion 8, it is made possible to eliminate temperature difference across the wafer surface due to uneven bearing that would arise when the wafer W is in direct contact with the mount surface 3. Heating the wafer W via the gas located over the mount surface 3 makes it possible to uniformly heating the wafer W and achieves uniform temperature distribution over the wafer W.

In order to minimize the temperature difference across the surface of the wafer W, it is desirable that height of the inner protrusions 8 above the mount surface 3 that determines the distance between the wafer W and the mount surface 3 is from 0.05 to 0.5 mm, so as to prevent particles from being caught between the wafer W and the mount surface 3 and prevent the surface of the wafer W from changing due to slight deformation of the mount surface 3. When the distance is less than 0.05 mm, heat is transferred from the mount surface 3 to wafer W in a flooding manner thereby causing significant temperature difference across the wafer surface. When the distance is more than 0.5 mm, heat transfer from the mount surface 3 to wafer W decreases thereby causing significant temperature difference across the wafer surface. The distance is more preferably from 0.07 to 0.2 mm.

The contact member 17 that makes contact with the cylindrical section 2a has high heat insulation effect and restricts heat transfer, and should be studied in view of the relationship between the peripheral protrusions 304 and the plate-shaped ceramic member 2. Diameter of the peripheral protrusion 304 is preferably from 5 to 15 mm, and more preferably from 7 to 11 mm. Height is preferably from 3 to 14 mm. While it is preferable that the circumferential surface is tapered as shown in FIGS. 8A through 8C, the circumferential surface may also be cylindrical. It is also preferable that the peripheral protrusions 304 has a space 4b formed therein. Heat capacity of the peripheral protrusions 304 can be decreased by forming the space. It is also preferable that the bottom surface 304a of the peripheral protrusions 304 has mean surface roughness Ra from 0.1 to 10, and the surface in contact with the plate-shaped ceramic member 2 has mean surface roughness Ra from 0.1 to 10, which makes heat transfer from the contact surface smaller.

It is preferable that the peripheral protrusions 304 of the plate-shaped ceramic member 2 has heat conductivity up to two times as high as the heat conductivity of the plate-shaped ceramic member 2. When heat conductivity of the peripheral protrusions 304 is higher than two times that of the plate-shaped ceramic member 2, it becomes easier to raise the temperature of the peripheral protrusions 304 which may result in large temperature difference across the wafer surface during transition. It is preferable to make the heat conductivity of the peripheral protrusions 304 lower than that of the plate-shaped ceramic member 2, since this enables it to minimize the rise and fall of the temperature along the periphery of the peripheral protrusions 304.

In order to minimize the temperature difference across the surface of the wafer W, it is preferable that a part of the peripheral protrusions 304 is located within the circumscribed circle that surrounds the resistive heating member 5 of the plate-shaped ceramic member 2. Such an arrangement enables it to heat the mount surface 3 over a wider area than the surface of the wafer W by means of the resistive heating member 5, thus minimizing the temperature difference across the surface of the wafer W.

Figure 10:
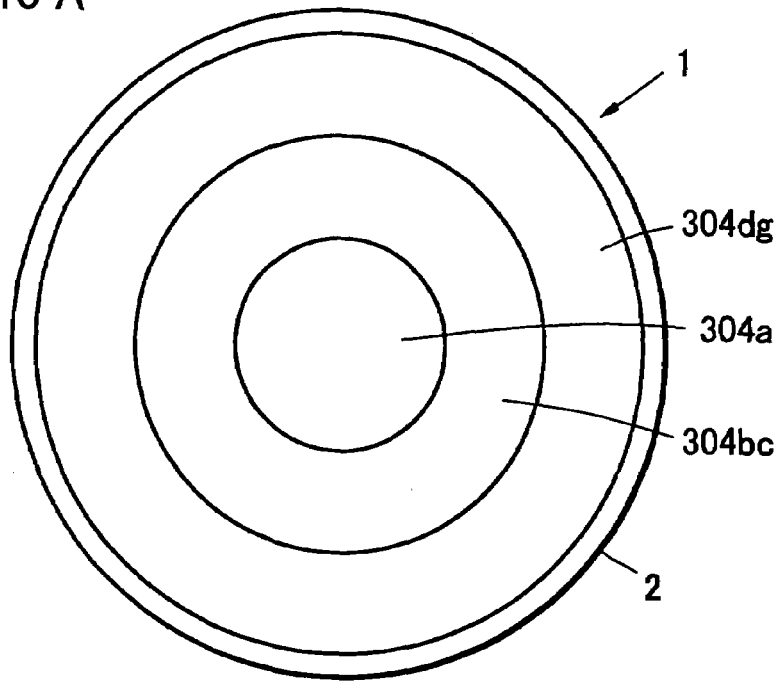
FIG. 10A is a schematic plan view showing an example of the configuration of the resistive heating member zone of the heater according to the third embodiment.
FIG. 10B is a schematic plan view showing an example of the resistive heating member zone obtained by dividing the resistive heating member zone of FIG. 10A further.
Figure 10:
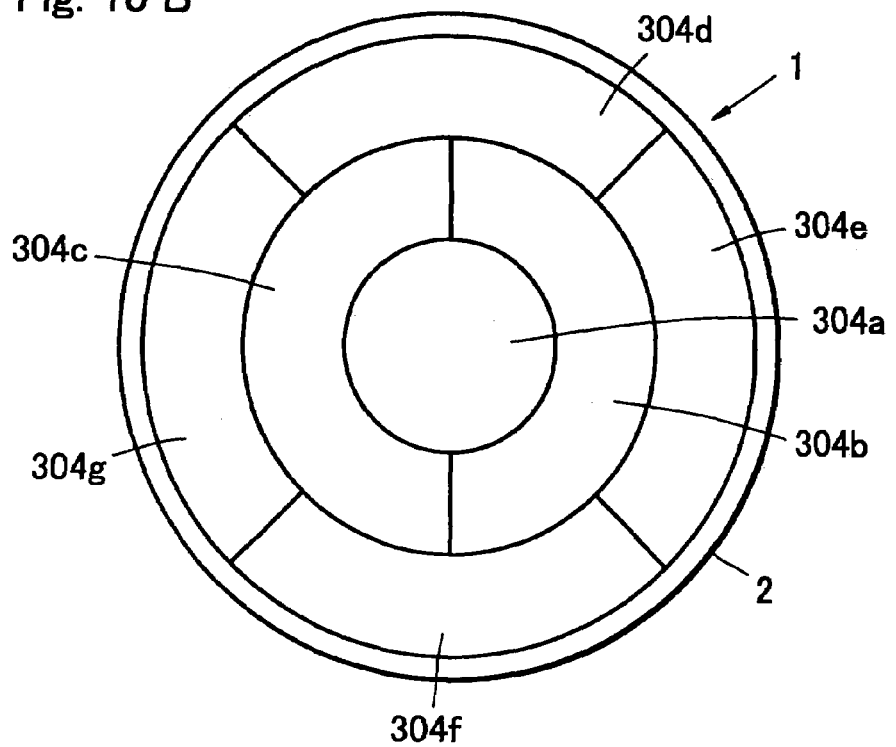

FIG. 10A shows an example of arrangement of the resistive heating member zone 4 of the plate-shaped ceramic member according to the present invention, an example simpler than that shown in FIG. 3A.

In the example shown in FIG. 10A, the resistive heating member zone 304a of circular shape is provided at the center, the ring-shaped resistive heating member zone 304bc of concentric configuration and the ring-shaped resistive heating member zone 304dg are provided outside thereof.

FIG. 10B shows an example where the ring-shaped resistive heating member zone 304bc located outside is divided into two equal parts of semi-circular resistive heating member zones 304b, 304c, and the ring-shaped resistive heating member zone 304dg located outside thereof is divided into four equal parts of fan-shaped resistive heating member zones 304d, 304e, 304f, 304g in the example shown in FIG. 10A. This arrangement is preferable because it makes it possible to achieve uniform temperature distribution over the surface of the wafer W.

In FIG. 10B, it is preferable that the resistive heating member zones 304a through 304g of the heater 1 form the resistive heating members 5a through 5g that are separated from each other, so that the resistive heating member zones 304a through 304g can be independently controlled.

While the ring-shaped resistive heating member zones 304bc, 304dg are divided into two parts and four parts, respectively, in the radial direction in the example shown in FIG. 10B, numbers of divisions are not limited to these.

While the border lines between the resistive heating member zones 304b, 304c shown in FIG. 10B are straight lines, the border lines need not necessarily be straight lines but may be wavy lines. The resistive heating member zones 304b, 304c are preferably centrally symmetric with respect to the center of the plate-shaped ceramic member 2.

Similarly, border lines between the resistive heating member zones 304d and 304e, 304e and 304f, 304f and 304g, and 304g and 304d need not necessarily be straight lines, and the resistive heating member 304d through 304g are also preferably centrally symmetric with respect to the center of the plate-shaped ceramic member 2.

Embodiment 4

Now a heater according to the fourth embodiment of the present invention will be described.

Figure 11:
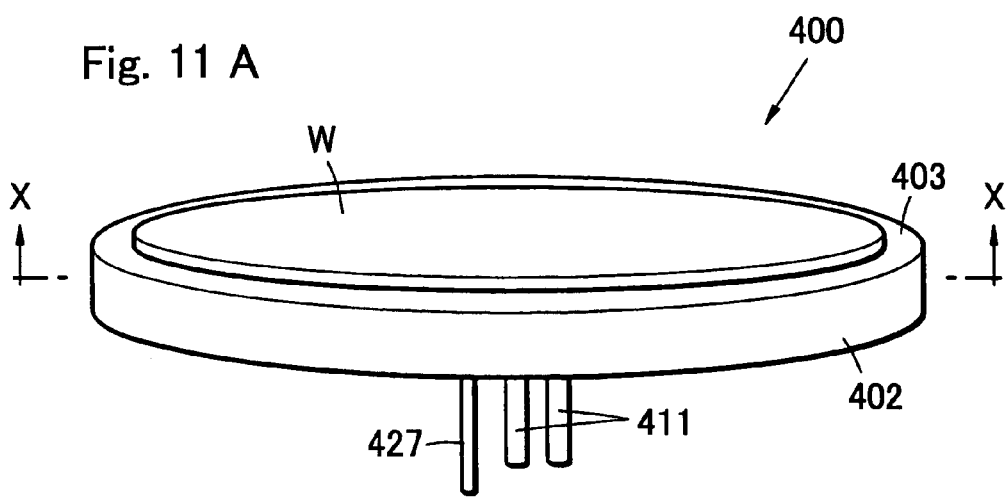
FIG. 11A is a schematic perspective view showing the constitution of the ceramic heater according to the fourth embodiment of the present invention, b) being a schematic sectional view taken along lines X-X.
FIG. 11B is a schematic sectional view taken along lines X-X of FIG. 11A.
Figure 11:
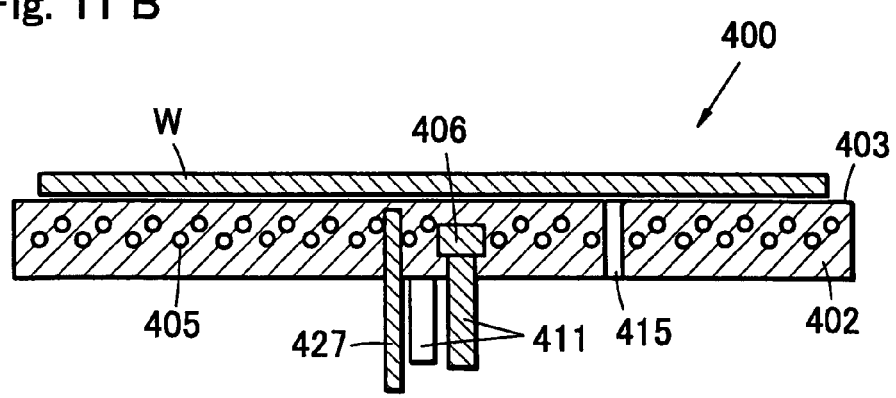

FIG. 11A is a perspective view showing the constitution of the heater 400 of the fourth embodiment, and FIG. 11B is a schematic sectional view taken along lines X-X of FIG. 11A. The heater 400 of the fourth embodiment has a plate-shaped ceramic member 402 made of silicon carbide or aluminum nitride as the main component, similarly to the other embodiments, with one of the principal surfaces being used as the mount surface 403 whereon the wafer W is placed, but is different from those of the first through third embodiments in that a coil-shaped resistive heating member 405 is embedded in the plate-shaped ceramic member 402. In the heater 400 of the fourth embodiment, a temperature measuring element 427 is inserted into a recess formed in the other principal surface of the plate-shaped ceramic member 402, in order to measure the temperature of the mount surface 403 and the wafer W.

The plate-shaped ceramic member 402 has a through hole 415 in which wafer lift pin (not shown) is provided so as to move the wafer W vertically and place it on the mount surface 403 or unload it therefrom.

The resistive heating member 405 is a coil of wire made of tungsten, molybdenum or an alloy of tungsten and molybdenum, and the coiled wire is bent and embedded in the plate-shaped ceramic member 402. Connected to both ends of the coiled wire (the resistive heating member 405) are power feeder sections 406. Connected to the power feeder sections 406 are power terminals 411. There is no restriction on the method of connecting the power feeder sections 406 and the power terminals 411, and soldering, brazing or screw clamping may be employed as long as electrical continuity can be secured. Thus electric power is supplied from the outside to the power terminals 411, so as to heat the wafer W to a predetermined temperature while measuring the temperature of the plate-shaped ceramic member 402 by means of the temperature measuring element 427.

In the ceramic heater 400 of the fourth embodiment, one of the principal surfaces of the plate-shaped ceramic member 402 wherein the coil-shaped resistive heating member 405 is embedded is used as the mount surface 403 on which a plate-shaped member to be heated is placed.

Figure 12:
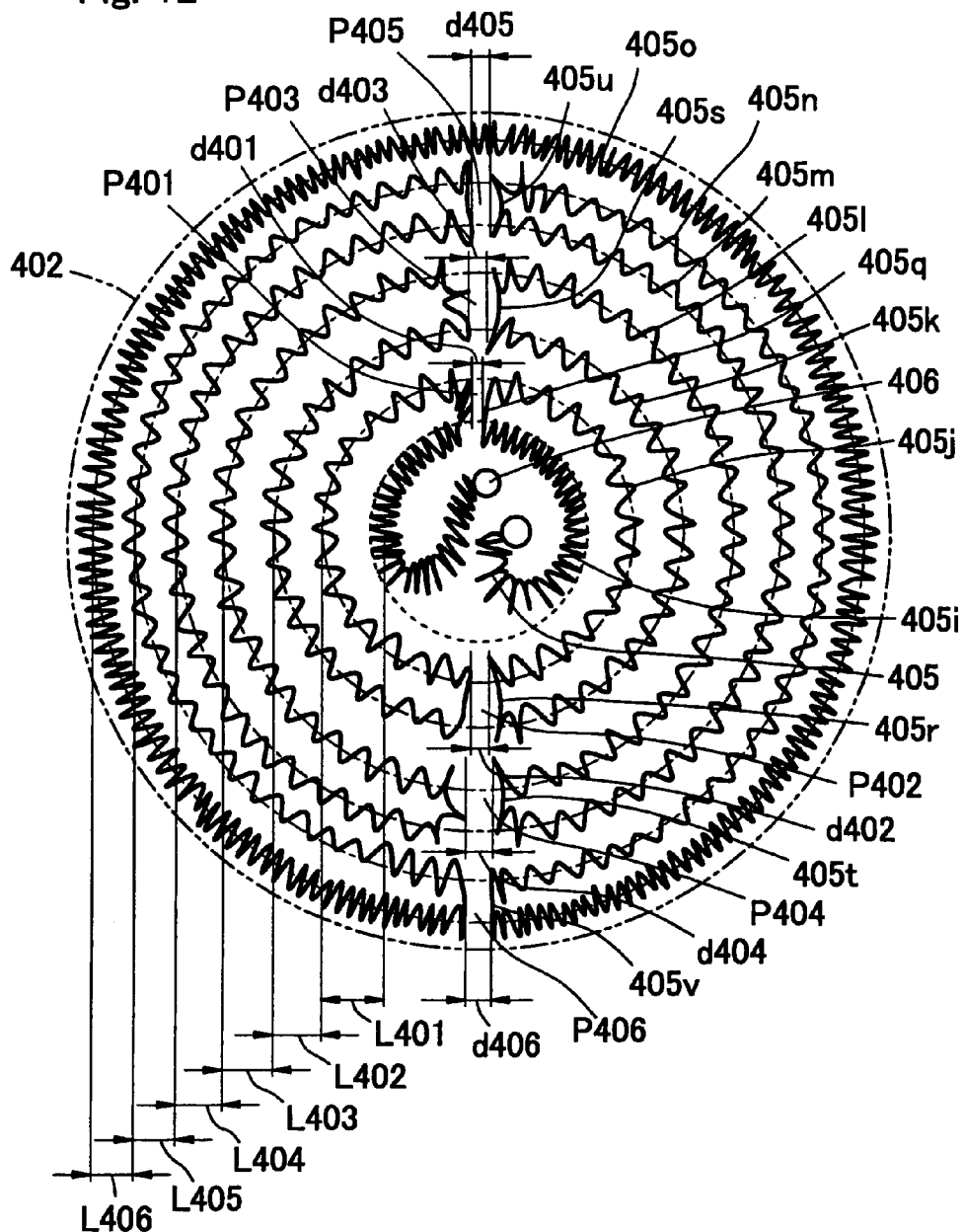
FIG. 12 is a schematic diagram showing the configuration of the resistive heating member of the heater according to the fourth embodiment.

In the fourth embodiment, the coil-shaped resistive heating member 405 constitutes concentric circle of which center is located at a point (hereinafter referred to as center of symmetry) on the central axis of the plate-shaped ceramic member 402 as shown in FIG. 12, and is embedded in the plate-shaped ceramic member 402 so as to be substantially axially symmetrical with respect to one straight line (hereinafter referred to as axis of symmetry) that passes the center and is parallel to the mount surface 403.

Constitution of the coil-shaped resistive heating member 405 will be described in detail below, wherein seven circles that correspond to positions where arc sections of the coil-shaped resistive heating member 405 are disposed will be defined as the first through seventh circles starting with the inside to the outside, and the defined circles will be used in the description for simplicity.

Also in the following description, one semicircular region of the plate-shaped ceramic member 402 located on one side of the axis of symmetry will be called the first region, and the other semicircular region located on the opposite side of the axis of symmetry will be called the second region.

In the fourth embodiment, the power feeder sections 406 provided on both ends of the coil-shaped resistive heating member 405 are disposed in the vicinity of the center of the plate-shaped ceramic member 402. The coil-shaped resistive heating member 405 connected to one of the power feeder sections 406 is installed along the first circle of the first region and becomes a first arc section 405i, which is bent in the first region with a turn-back section 405q, followed by a second arc section 405j installed along the second circle in the first region. Thereafter, a third arc section 405k, a fourth arc section 405L, a fifth arc section 405m, a sixth arc section 405n and seventh arc section 405o are installed in the first region along the third through seventh circles, respectively, while being turned back in turn-back sections 405r, 405s, 405t, 405u and 405v. The seventh arc section 405o located at the outermost position is connected to the seventh arc section 405o of the second region.

In the second region, similarly to the first region, a second arc section 405j, a third arc section 405k, a fourth arc section 405L, a fifth arc section 405m, a sixth arc section 405n and seventh arc section 405o are installed in the second region along the second through seventh circles, respectively, while being turned back in turn-back sections 405q, 405r, 405s, 405t, 405u and 405v. The first arc section 405i located at the innermost position is installed along the second circle, with the power feeder section 406 provided at the distal end thereof is disposed near the center of the plate-shaped ceramic member 402. The arc section here means that the center line of the wire that is wound in coil is formed in an arc, in other words, the portion where the wire is wound in a spiral shape around the arc-shaped center line.

In the fourth embodiment, as described above, concentric semicircle sections connected by the turn-back section are disposed side by side in the first region and the second region, while the semicircle sections in the first region and the second region are disposed in a symmetrical arrangement with respect to the axis of symmetry.

The fourth embodiment is characterized in that distances d401 through d406 between the pairs of opposing turn-back sections 405q through 405v are made smaller than the distances L401 through L406 between the adjacent arc sections. With this constitution, the resistive heating member 405 can be formed by connecting a plurality of substantially concentric ring sections into a single body, thereby decreasing the temperature difference across the surface of the wafer W to be heated to not larger than 3° C.

As shown in FIG. 12, distances d401 through d406 between the pairs of opposing turn-back sections 405q through 405v are the distance d401 between the turn-back section 405q of the first region and the turn-back section 405q of the second region, the distance d402 between the turn-back section 405r of the first region and the turn-back section 405r of the second region, the distance d403 between the turn-back section 405s of the first region and the turn-back section 405s of the second region, the distance d404 between the turn-back section 405t of the first region and the turn-back section 405t of the second region, the distance d405 between the turn-back section 405u of the first region and the turn-back section 405u of the second region, and the distance d406 between the turn-back section 405v of the first region and the turn-back section 405v of the second region.

The distances L401 through L406 between the adjacent arc sections refer to the distance between the center lines of spiral as shown in FIG. 12.

In the fourth embodiment, it is preferable that the distances L401 through L406 between the adjacent arc sections are equal to each other, and the coil has substantially constant pitch, in order to further decrease the temperature difference across the surface of the wafer W to be heated.

In the heater 400 of the fourth embodiment, as described above, since a main portion of the resistive heating member 405 has a plurality of arc sections that are disposed to constitute substantially concentric circles, uniform temperature distribution of the mount surface 403 can be formed in concentric circles arranged from the center to the periphery, when the resistive heating member 405 is energized to generate heat.

Since the distance L401 between the center lines of the resistive heating members 405i and 405j, the distance L402 between the center lines of the resistive heating members 405j and 405k, the distance L403 between the center lines of the resistive heating members 405k and 405L, the distance L404 between the center lines of the resistive heating members 405L and 405m, the distance L405 between the center lines of the resistive heating members 405m and 405n, and the distance L406 between the center lines of the resistive heating members 405n and 405o are set substantially equal, amounts of heat generated per unit volume from the resistive heating members 405i through 405o can be made equal, and therefore unevenness of heat generation in the radial direction of the mount surface 403 can be suppressed.

Also in the fourth embodiment, as described above, it is important to make the distances d401, d402, d403, d405 and d406 between the pairs of opposing turn-back sections smaller than the distances L401, L402, L403, L404, L405 and L406 between the adjacent arc sections.

In order to improve the equality of heating the mount surface 403, it is necessary to make the amounts of heat generated per unit volume not only from the arc sections 405i through 405o, but also from the turn-back sections 405q through 405v. Normally, the distances d401, d402, d403, d405 and d406 between the pairs of the turn-back sections 405q through 405v are made smaller than the distances L401 through L406 between the adjacent arc sections 405i through 405o, at least in one section. This makes it possible to compensate for the heat generation from peripheral portions P401 through P406 of the turn-back sections 405q through 405v by means of the heat generated from the turn-back sections 405q through 405v, thereby to suppress the decrease in temperature in the peripheral portions P401 through P406 of the turn-back sections 405q through 405v. As a result, temperature difference across the surface of the wafer W placed on the mount surface 403 can be minimized, thus improving the uniformity of heating. Also as the temperature difference across the surface of the wafer W decreases, temperature difference across the mount surface 403 decreases, and therefore the possibility of large thermal stress being generated-in the plate-shaped ceramic member 402 of large size decreases, thus improving the durability against heat cycles of rapid heating and cooling. Particularly the peripheral portions P406, P405 and P404 located near the periphery of the plate-shaped ceramic member 402 are likely to cool down because of heat dissipation through the periphery of the plate-shaped ceramic member 402, it is preferable that at least the distance d406 of the outermost turn-back section 405v is smaller than the distance L406 of the center lines of the resistive heating member 405o and 405n. In addition, it is more preferable that the distance d405 of the outermost turn-back section 405u located inside thereof is smaller than the distance L405 of the center lines of the resistive heating member 405n and 405m. In addition, it is more preferable that the distance d404 located inside thereof is smaller than the distance L404.

According to the fourth embodiment, since the temperature difference across the wafer surface decreases and temperature difference across the mount surface decreases, the possibility of large thermal stress being generated in the plate-shaped ceramic member 402 of large size decreases, and the durability against heat cycles of rapid heating and cooling can be improved.

Especially when the distances d401 through d406 between the pairs of the turn-back sections 405q through 405v are set in a range from 30 to 80% of the distances L401 through L406 between the adjacent arc sections 405i through 405o, uniformity of heating the mount surface 403 can be improved further. When this ratio is lower than 30%, temperature in the periphery of the turn-back sections 405q through 405v may become lower. When this ratio is higher than 80%, temperature in the periphery of the turn-back sections 405q through 405v may become higher. Such possibilities can be eliminated by setting the ratio in the range from 30 to 80%, and heat generation near the turn-back sections 405q through 405v can be favorably increased, thereby further improving the uniformity of heating the mount surface 3. The distances d401 through d406 are more preferably in a range from 40 to 60% of the corresponding distances L1 through L6.

The resistive heating member 405 of the fourth embodiment is made of a wire wound in a coil shape, consisting of the arc sections 405i through 405o and the turn-back sections 405q through 405v, and therefore is not subject to excessive stress acting on the edge, in contrast to the turn-back resistive heating member having rectangular configuration formed by the conventional printing method. Accordingly, the ceramic heater 400 having high reliability is provided since it is less probable that plate-shaped ceramic member 402 and/or the resistive heating member 405 would be broken when the heater 400 is heated or cooled quickly.

In the resistive heating member 405, pitch of the coil in the outermost arc section is preferably smaller than the pitch of the coil in the arc section that is located inside thereof. This configuration enables it to generate more heat from the resistive heating member 405 located near the periphery, so as to prevent the temperature of the plate-shaped ceramic member 402 from decreasing on the periphery due to dissipation through radiation and convection, thus decreasing the temperature difference across the wafer surface. The resistive heating member 405 having such a constitution makes it possible to compensate for the loss of heat through radiation and convection from the periphery of the plate-shaped ceramic member 2, thereby preventing the temperature of the wafer W from decreasing along the periphery. This constitution is preferable also because, as the temperature difference across the mount surface 3 is decreased when raising the temperature and thermal stress generated in the plate-shaped ceramic member 402 is reduced, the plate-shaped ceramic member 402 is less likely to break even when subjected to quick thermal cycles repeatedly.

The resistive heating member 405 embedded in the plate-shaped ceramic member 402 is formed in concentric configuration, for example, as shown in FIG. 15A. Area S occupied by the resistive heating member 405 is preferably 90% of the area of the mount surface 403, as proximate to the area of the mount surface 403 as possible, in order to minimize the temperature difference across the wafer surface. The area S is the area of the circumscribed circle, circumscribed ellipse and circumscribed polygon surrounding the resistive heating member 405.

Japanese Unexamined Patent Publication (Kokai) No. 4-101381 describes a wafer heating apparatus wherein heat generation is increased in a region beyond 90% of the diameter of the mount surface. Since this heater is formed in a spiral having eight turns at the most, even when heat generation can be increased in the region of 90%, the region is not centrally symmetric with respect to the center of the plate-shaped ceramic member and therefore there is a possibility of the difference in temperature between the left and right halves of the wafer increases. Constitution of the fourth embodiment, in contrast, is preferable since the resistive heating member 405 along the periphery is centrally symmetric with respect to the center of the plate-shaped ceramic member 402 so that heat generation increases uniformly, thus eliminating the possibility of increasing the temperature difference across the surface of the wafer W.

FIG. 13A is a schematic perspective view of a variation (heater 401) of the heater 400 of the fourth embodiment. FIG. 13B is a schematic sectional view taken along lines X-X of FIG. 13A. A cylindrical support member 418 is joined at the center of the other principal surface of the heater 401 of this variation, so as to surround power terminals 411 and the temperature measuring element 427. When the cylindrical support member 418 is joined in this way, the heater 401 can be held on a flange section 418b provided at the bottom of the support member 418. Therefore, even when the ceramic heater 401 is heated to 500° C. or higher in the atmosphere of halogen plasma, it is less likely that the heater 401 deforms or is corroded to generate particulate matter because the heater has high resistance against heat and corrosion.

In the heater 401 of this variation, it is preferable that the cylindrical support member 418 is joined at the center of the other principal surface of the plate-shaped ceramic member 402 with a flange section 418a, and the coil pitch of the resistive heating member located inside of the cylindrical support member 418 is smaller than the coil pitch of the resistive heating member located outside of the cylindrical support member 418. This is because the coil of the resistive heating member located inside of the cylindrical support member 418 generates more heat so as to prevent the temperature from decreasing when the coil pitch of resistive heating member located inside of the cylindrical support member 418 is smaller, although heat is transferred from the plate-shaped ceramic member 402 to the cylindrical support member 418 and may cause the temperature inside of the support member 418 of the plate-shaped ceramic member 402 may lower. While temperature difference across the mount surface 403 can be decreased by increasing the outer diameter of the coil of the ceramic heater that has the resistive heating member in the form of coil, it is difficult to turns back the coil with a radius of curvature of the center line smaller than the outer diameter of the coil, and it is preferable to form the resistive heating member that is turned back with a radius of curvature 1.5 to 3 times the outer diameter of the coil. While the resistive heating member 405 is embedded in concentric configuration, since the diameter is smaller near the center of the plate-shaped ceramic member and the radius of curvature of the turn-back section becomes smaller, it becomes more difficult to increase the heat generation by decreasing the distance between the arc sections of the resistive heating member 405. Therefore, in order to increase the heat generation without making the radius of curvature of the turn-back section too small, it is preferable to increase the heat generation per unit length of the coil by decreasing the pitch of the coil that forms the resistive heating member 405, thereby decreasing the difference in temperature across the mount surface 403 and decrease temperature difference across the surface of the wafer W.

Coil pitch Na of the resistive heating member 405a located inside of the cylindrical support member 418 is the length of the center line of the resistive heating member 405a located inside of the periphery of the flange 418a of the cylindrical support member 418 divided by the number of turns of the coil.

Figure 14:
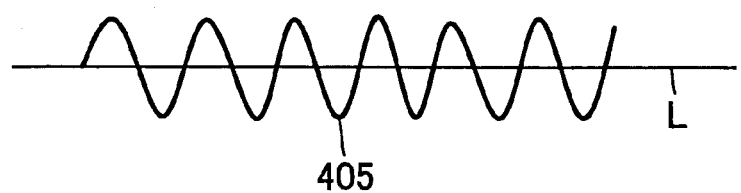
FIG. 14 is a schematic diagram showing the resistive heating member of the fourth embodiment.

The center line of the resistive heating member 405 refers to the center line L of the resistive heating member 405 that has coil shape, when viewed from the side of the mount surface 3 as shown in FIG. 14.

Figure 15:
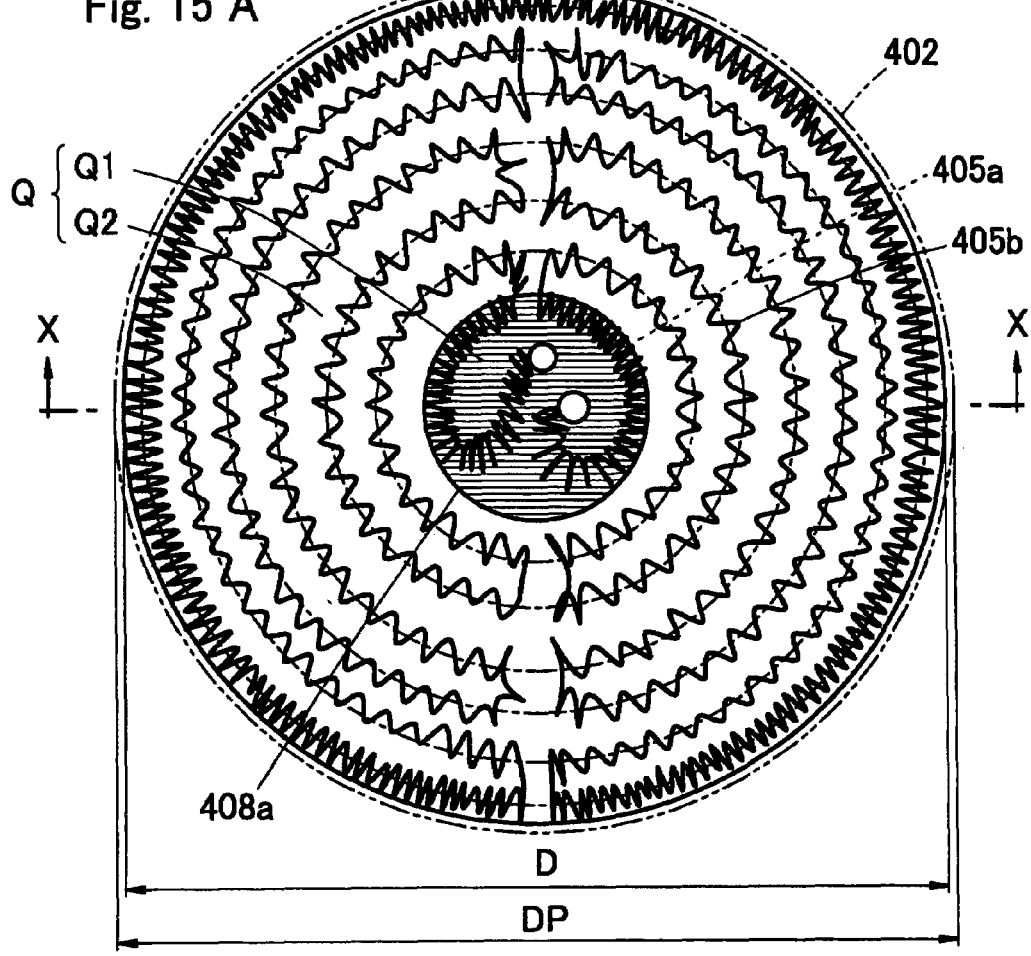
FIG. 15A is a schematic plan view explanatory of a preferable form of resistive heating member in the variation shown in FIG. 13A.
FIG. 15B is a schematic sectional view taken along lines X-X of FIG. 15A.
Figure 15:
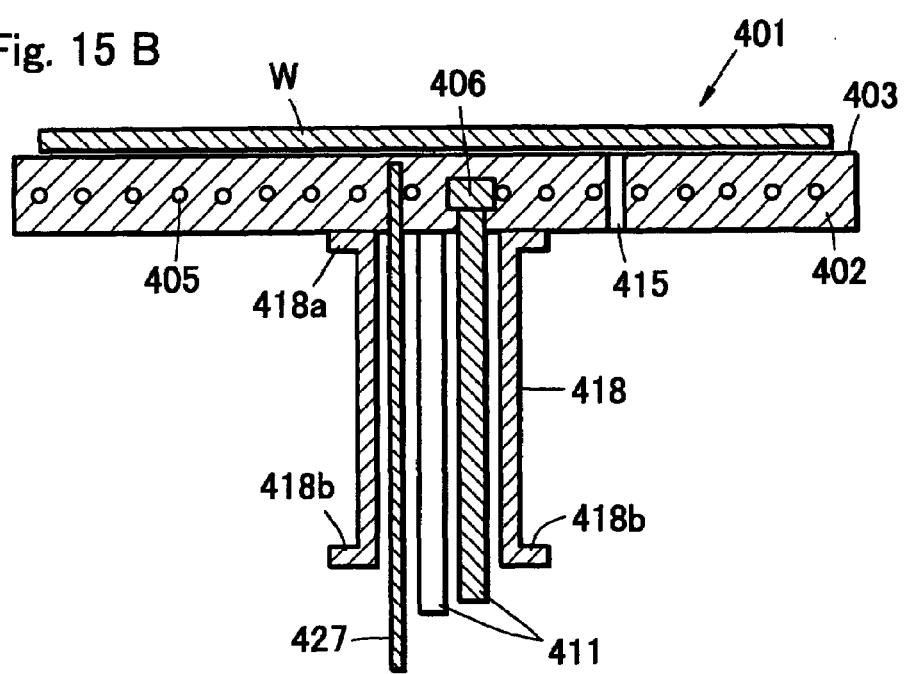
Figure 16:
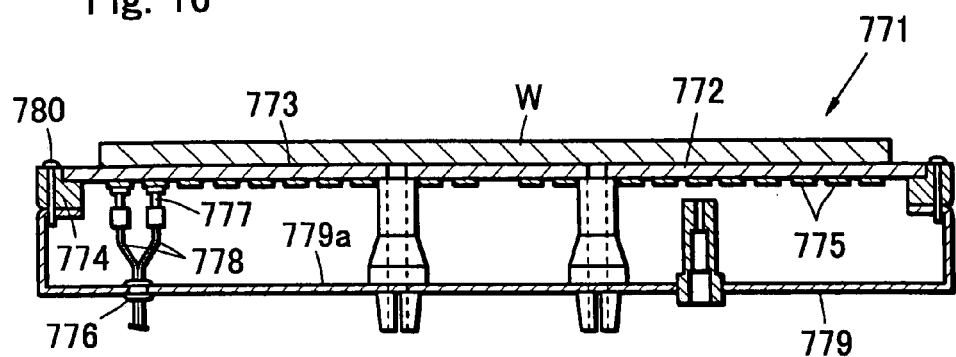
FIG. 16 is a sectional view showing an example of heater of the prior art.

Coil pitch Nb of the resistive heating member 405b located outside of the cylindrical support member 418 is also determined as the length of the center line of the resistive heating member 405b located outside of the periphery of the flange 418a of the cylindrical support member 418 divided by the number of turns of the coil (FIG. 15).

With the cylindrical support member 418 joined at the center of the other principal surface of the plate-shaped ceramic member 402, the area S1 of the plate-shaped ceramic member 402 within the cylindrical support member 418, resistance R1 of the resistive heating member 405a within the cylindrical support member 418, the area S2 outside of the cylindrical support member 418 and resistance R2 of the resistive heating member 405b outside of the cylindrical support member 418 are preferably such that resistance density (R1/S1) inside of the cylindrical support member 418 is larger than resistance density (R2/S2) outside of the cylindrical support member 418.

Area S is the sum of area S1 and area S2.

When the heater 401 is energized, heat sink occurs wherein heat is dissipated through the cylindrical support member 418 into a reaction chamber that is not shown in the drawing, to which the support member 418 is attached, thereby hampering uniform heating of the mount surface 403. At the same time, especially when raising the temperature, there is a possibility of the ceramic heater 401 being broken as significant thermal stress is generated in the interface between the middle of the plate-shaped ceramic member 402 where the cylindrical support member 418 is joined and the periphery of the ceramic heater 401 where the cylindrical support member 418 is not joined. In this variation, however, the resistance density (R1/S1) per unit area of the resistive heating member 405a in a region Q1 located inside of the cylindrical support member 418 is made larger than the resistance density (R2/S2) per unit area of the resistive heating member 405b in a region Q2 located outside of the cylindrical support member 418, so that more heat is generated from the middle of the plate-shaped ceramic member 402 where the cylindrical support member 418 is joined than from the peripheral portion. This makes it possible to compensate for the temperature decrease due to the heat sink, make the temperature distribution across the mount surface 3 uniform, and cause more heat to be generated in the middle of the ceramic heater 401 than in the periphery when raising the temperature. As a result, thermal stress generated in the ceramic heater 401 can be mitigated, and the ceramic heater 401 can be prevented from breaking when heated quickly.

The resistance density (R1/S1) is preferably in a range from 1.05 to 1.5 times the resistance density (R2/S2).

When the resistance density (R1/S1) is less than 1.05 times the resistance density (R2/S2), it becomes impossible to compensate for the temperature decrease due to the heat sink from the cylindrical support member 418 resulting in lower temperature in the middle of the mount surface 3 than in the peripheral portion, and it becomes impossible to achieve uniform temperature distribution. It also causes a significant thermal-stress that may break the ceramic heater 401 when raising the temperature. When the resistance density (R1/S1) is higher than 1.5 times the resistance density (R2/S2), heat generation from the resistive heating member 405a becomes much more than the heat loss due to the heat sink from the cylindrical support member 418 resulting in higher temperature in the middle of the mount surface 3 than in the peripheral portion, and it becomes impossible to achieve uniform temperature distribution. It also causes a significant thermal stress that may break the ceramic heater 400 when raising the temperature.

In the case of the ceramic heater 401 that has heating pattern Q shown in FIG. 15A, for example, the resistance density (R1/S1) and the resistance density (R2/S2) for the ceramic heater 401 having the cylindrical support member 418 joined thereon can be determined as follows.

First, the cylindrical support member 418 is cut off, and the heating pattern Q embedded in the plate-shaped ceramic member 402 is analyzed by irradiating with X ray, thereby to determine the area S1 of the region Q1 located inside of the cylindrical support member 418, and the area S2 of the region Q2 located outside of the cylindrical support member 418.

Resistance R1 of the resistive heating member 405a and resistance R2 of the resistive heating member 405b are determined as follows. The plate-shaped ceramic member 402 is divided into to parts of disk-shaped ceramic member and a ring-shaped ceramic body by separating along the circle corresponding to the outer diameter of the cylindrical support member 418. Resistance R1 of the resistive heating member 405a embedded in the disk-shaped ceramic member 402 and resistance R2 of the resistive heating member 405b embedded in the ring-shaped ceramic member are measured. The resistance density (R1/S1) and the resistance density (R2/S2) may be calculated from the area S1, area S2, resistance R1 and resistance R2 that have been determined as described above.

Resistance density ratio (R1/S1)/(R2/S2) can also be determined from the resistance calculated from the wire diameter of the resistive heating member 405 and the number of turns of the resistive heating member 405 observed from the surface 403 using transmission X ray photograph or the like.

In the fourth embodiment and the variation thereof, it is preferable to provide 7 to 13 concentric arcs of resistive heating member at substantially the same intervals, in order to heat the wafer W measuring 200 mm or more in diameter with uniform temperature distribution. Particularly, for a ceramic heater used to heat the wafer measuring 200 mm or more in diameter, the coil-shaped resistive heating member 405 is disposed along 7 to 9 concentric rings, or for a ceramic heater used to heat the wafer measuring 300 mm or more in diameter, the coil-shaped resistive heating member 405 is disposed along 11 to 15 concentric rings. This constitution enables it to decrease the unevenness in the density of the resistive heating member for the mount surface 403 and decrease the temperature difference across the wafer surface.

The diameter of the spiral of the resistive heating member 405 made by winding the wire into coil is preferably 0.05 to 0.2 times the thickness of the plate-shaped ceramic member 402. According to the present invention, in case the resistive heating member 405 has an elliptical spiral configuration that has different diameters in different directions, it is preferable that the minor axis lies in the direction of thickness of the plate-shaped ceramic member 402, and length of the minor axis is preferably set to 0.05 to 0.2 times the thickness of the plate-shaped ceramic member 402.

In the fourth embodiment, temperature difference across the mount surface can be decreased further by forming the resistive heating member 405 from a wire in elliptical spiral configuration wherein the ratio of the minor axis to major axis is in a range from 0.95 to 0.75.

When diameter (minor axis in the case of elliptical spiral) of the spiral of the resistive heating member 405 is less than 0.05 times the thickness of the plate-shaped ceramic member 402, it becomes difficult to heat the mount surface 403 uniformly since the diameter or minor axis of the spiral of the resistive heating member is too small. When diameter (minor axis in the case of elliptical spiral) of the spiral of the resistive heating member 405 is more than 0.2 times the thickness of the plate-shaped ceramic member 402, it becomes difficult to embed the resistive heating member with accurate distance between the pair of arcs in turn-back configuration, as the large outer diameter of the coil results in discontinuous turn-back configuration, thus resulting in larger temperature difference across the mount surface 403. In order to decrease the temperature difference across the mount surface 403, it is preferable to set the diameter (minor axis in the case of elliptical spiral) of the spiral of the resistive heating member 405 in a range from 0.08 to 0.14 times the thickness of the plate-shaped ceramic member 402.

Since the resistive heating member 405 is formed from the wound wire and is embedded in the ceramic member that is sintered at a high temperature, it is preferably made of tungsten, molybdenum or an alloy thereof that can endure high temperatures. The plate-shaped ceramic member 402 is preferably made of carbide or nitride ceramic material that has heat conductivity of 50 W/(m·K) in order to decrease the temperature difference across the mount surface 3. More preferably, sintered silicon carbide or aluminum nitride is used.

The heater 401 of the present invention can be attached to the inside of a vessel of a film forming apparatus or an etching apparatus. The interface between the mount surface 403 of the heater 401 and the power terminals 411 is sealed from the outside of the vessel by means of an O ring that is attached to the flange 418b of the support member 418, allowing it to control the inside of the vessel to a particular atmosphere by supplying a film forming gas or etching gas from the outside. By placing one of the heaters 401 of the present invention described above in a vessel that allows it to control the atmosphere therein, a wafer heating apparatus of the present invention where the object to be heated is a wafer is provided. In the wafer heating apparatus, film forming gas, etching gas and carrier gas are supplied into the vessel and the wafer W placed on the mount surface 403 of the heater 401 of the present invention is heated by the resistive heating member 405, while controlling the gas pressure in the vessel. The heater 401 of the present invention is suited to the manufacture of semiconductor because of small temperature difference across the wafer surface placed on the mount surface 403, and enables it to manufacture semiconductor with circuits formed with line width of 90 nm or 45 nm without allowing the yield to decrease.

The heater 401 of the present invention can be made by the following method.

This method comprises the steps of making a green compact having plate shape from ceramic powder, forming a groove consisting of arc sections disposed on one of the principal surface of the green compact and turn-back sections connected with each other, inserting a coil-shaped resistive heating member in the groove, and filling the gap between the groove and the resistive heating member with ceramic powder and applying a preliminary pressure to the ceramic powder thereby to obtain the green compact having the resistive heating member embedded therein. The green compact is inserted in a heat resistant mold and is fired while applying a pressure thereto. With this method, shrinkage caused by firing can be made uniform since density of the ceramic powder that fills the gap between the groove and the resistive heating member is near the density of the green compact. As a result, use of the plate-shaped ceramic member 402 enables it to make the heater 400, 401 of the present invention that can keep the strain and residual stress at a low level, less likely to break under repeated heat cycles, and has high durability.

In the process of embedding the coil-shaped resistive heating member 405 in the plate-shaped ceramic member 402 with the manufacturing method described above, since the resistive heating member 405 has relatively large spiral diameter, it is necessary to form the groove that can accommodate the coil-shaped wire in the sheet-shaped ceramic green compact. It is preferable to form the coil-shaped resistive heating member in a form that matches the shape of the groove beforehand and apply heat treatment, since it enables it to accommodate the resistive heating member made of the wire in the groove without allowing the shape to collapse.

It is important that, after inserting the resistive heating member 405 of the desired shape described above in the groove, the gap between the groove and the resistive heating member is filled with ceramic powder of the same composition as the ceramic that forms the green compact, thereby to obtain the green compact having the resistive heating member embedded therein by applying preliminary pressure to the ceramic powder.

That is, with such a constitution as the coil-shaped resistive heating member is simply inserted in the groove and the gap between the groove and the resistive heating member is filled with the ceramic powder without forming the coil-shaped resistive heating member in a shape that matches the groove beforehand, since density of the ceramic powder filing the groove is lower than density of the ceramic green compact, the sintered member may easily be broken as the groove is deformed or subjected to excessive stress when the ceramic green compact is pressurized and sintered.

When the resistive heating member that has been formed in a shape conforming to the groove shape in advance is inserted in the groove, the gap between the groove and the resistive heating member is filled with the ceramic powder and the ceramic powder is pressurized, in contrast, density of the ceramic powder can be set in a range from 70 to 98% of the density of the ceramic green compact. This makes it possible to prevent the residual stress and deformation of the plate-shaped ceramic member from occurring during sintering, so that the resistive heating member can be embedded homogeneously in the plate-shaped ceramic member.

Recessed portion caused by the preliminary pressure is filled with additional ceramic powder that is pressed by applying additional preliminary pressure, so that density of the ceramic powder becomes nearer to the density of the ceramic green compact, and the additional ceramic powder and the green compact are integrated thereby making the green compact where residual stress is not likely to be generated.

The green compact having the resistive heating member embedded therein as described above is inserted in a heat resistant mold made of carbon, BN (boron nitride) or the like and is sintered while applying pressure vertically. The sintered member made by sintering under pressure in this way is less likely to be broken by residual strain or thermal stress when used as the plate-shaped ceramic member 402 of the heater 401 of the present invention and is subjected to quick heating and cooling repetitively.

Diameter D of the circumscribed circle C of the resistive heating member 405 is preferably around 1.02 times the diameter of the wafer W, which enables it to keep a low value of temperature difference across the wafer surface even when the temperature in the peripheral portion decreases. Diameter DP of the plate-shaped ceramic member 2 is preferably in a range from 1.05 to 1.15 times the diameter of the wafer W.

The constitution will now be described in more detail.

FIG. 11B is a sectional view showing another example of the ceramic heater according to the fourth embodiment. The ceramic heater uses one of the principal surfaces as the mount surface 403 where the wafer W is placed, and comprises the plate-shaped ceramic member 402 having the resistive heating member 405 embedded therein, the power feeder sections 406 electrically connected to the resistive heating member 405 and the power terminals 411. The plate-shaped ceramic member 402 has thickness t in a range from 7 to 20 mm and is made of a ceramic material having Young's modulus in a range from 200 to 450 MPa in a temperature range from 100 to 500° C.

For the ceramic material to make the plate-shaped ceramic member 402 having Young's modulus in a range from 200 to 450 MPa in a temperature range from 100 to 500° C., alumina, silicon nitride, sialon or aluminum nitride may be used. Among these, aluminum nitride is most suitable for the material to form the plate-shaped ceramic member 402 due to high thermal conductivity of 50 W/(m·K) or even 100 W/(m·K) or higher and high resistance against corrosive gases based on fluorine or chlorine, and against plasma.

When the plate-shaped ceramic member 402 is made of a sintered material based on aluminum nitride as the main component, it is made as follows.

First, an oxide of rare earth element such as $Y_2O_3$ or $Yb_2O_3$ and, as required, an oxide of alkali earth metal such as CaO are added as the sintering assist agent to the main component of aluminum nitride and, after mixing well and adding an acrylic binder, forming into granuled powder by spray drying.

The powder is put into a mold and pressurized to obtain a green compact of plate shape.

Grooves are formed on the green compact at the positions where the resistive heating member 405 is to be embedded.

The grooves are preferably formed on the green compact by means of a numerically controlled machine tool such as machining center.

A heating member hardening fixture is prepared that has the same configuration as the resistive heating member to be embedded in the green compact. The coil-shaped resistive heating member is cut to a predetermined length and is put into the hardening fixture at a predetermined position with predetermined coil pitch, and heat treatment is applied so that the resistive heating member 405 having the predetermined shape is obtained. The coil-shaped resistive heating member that has been hardened is inserted into the groove of the green compact.

The same ceramic powder as that used to make the green compact is placed over the coil-shaped resistive heating member. The ceramic powder that is put into the groove has a low density of about 1.0 and, when sintered by hot press process or the like under this condition, would result in a concave surface over the groove and lower density of the portion of resistive heating member, thus giving rise to the possibility of the green compact to break at the groove.

Therefore it is preferable to apply a pressure of 5 to 20 MPa over the surface of the ceramic powder that fills the groove to such an extent as the green compact does not break, so as to increase the density of the ceramic powder. When the surface over the groove has sunk under pressure, it is preferable to fill in with additional ceramic powder and repeat pressurization. By filling the groove with the ceramic powder and applying pressure, density of the ceramic powder that fills the groove approaches that of the green compact, thus reducing the possibility of the green compact breaking due to the difference in density in the sintering process that follows. The green compact having the resistive heating member embedded therein is heated at 500° C. for one hour for debindering. The green compact is then put into a heat resistance mold made of carbon or the like and is heated to a temperature from 1700 to 2100° C. under a pressure of 5 MPa to 60 MPa. This process produces the sintered member without breaking it while minimizing the residual stress due to the resistive heating member 405 embedded therein. When sintered in this way, the plate-shaped ceramic member is less likely to break even when the resistive heating member is energized so as to heat or cool down quickly. Last, the sintered member with the resistive heating member embedded therein is ground on the profile and the mount surface, thereby to obtain the plate-shaped ceramic member of the fourth embodiment.

The cylindrical support member 418 is obtained by heating a mixture of the ceramic powder described above and a thermosetting resin or the like and forming it in cylindrical shape by injection molding, or cutting a cylindrical green compact made by casting or rubber press process into desired shape, heating it at a temperature of 400 to 600° C. for debindering, sintering it at a temperature from 1800 to 2200° C. in nitrogen atmosphere and grinding on the circumference.

The cylindrical support member 418 can be joined onto the plate-shaped ceramic member 402 by making a hole in the plate-shaped ceramic member 402 at positions where the power terminals 411 are connected, putting the cylindrical support member 418 into contact via a ceramic paste so as to surround the hole, and applying a pressure while heating the contact surface at a temperature 200 to 400° C. lower than the heating temperature.

The constitution and the method for manufacturing the heater 400, 401 of the present invention have been described. It goes without saying that such constitutions as electrode for electrostatic attraction is embedded in the heater 400, 401 of the present invention, electrode for electrostatic attraction is embedded in the plate-shaped ceramic member to provide a wafer holding member, or high-frequency electrode for generating plasma is embedded in the heater 400, 401 fall within the scope of the present invention without departing from the spirit of the present invention.

EXAMPLE 1

1.0% by weight of yttrium oxide was added to aluminum nitride powder, and the mixture was put into a ball mill together with isopropyl alcohol and urethane balls and milled for 48 hours, thereby to prepare a slurry of aluminum nitride.

The slurry of aluminum nitride was passed through a sieve of #200 mesh to remove urethane balls and particles that have come off the ball mill wall, and was dried in an explosion-proof drier at 120° C. for 24 hours.

The aluminum nitride powder thus obtained was mixed with an acrylic binder and a solvent to make a slip of aluminum nitride, and a plurality of green sheets of aluminum nitride were made by doctor blade process.

The green sheets of aluminum nitride thus obtained were placed one on another so as to heat and make a laminate.

The laminate was heated at a temperature of 500° C. for 5 hours in a stream of non-oxidizing gas for the purpose of debindering, followed by sintering at a temperature of 1900° C. for 5 hours in a non-oxidizing gas atmosphere, thereby to make plate-shaped ceramic members having various values of heat conductivity.

The sintered body of aluminum nitride was ground to make a plurality of plate-shaped ceramic members having disk shape measuring 3 mm in thickness and 330 mm in diameter. Three through holes were formed in each plate-shaped ceramic member. The through holes were formed at equi-spaced positions on a circle at a distance of 60 mm from the center of the plate-shaped ceramic member, diameter of the through holes being 4 mm.

Then an electrically conductive paste was prepared by mixing Au powder and Pd powder as electrically conductive material and a glass paste with a binder of composition described previously. The electrically conductive paste was printed onto the plate-shaped ceramic member in a predetermined pattern of the resistive heating member by screen printing process.

After printing, the organic solvent was evaporated by heating to 150° C., then debindering treatment was applied by heating to 550° C. for 30 minutes, followed by baking at a temperature from 700 to 900° C. Thus the resistive heating member having thickness of 50 µm was made.

The resistive heating member zone was disposed in such an arrangement as one resistive heating member zone is formed in one circle having a diameter 25% of diameter D of the plate-shaped ceramic member, one ring-shaped resistive heating member zone is formed on the outside thereof, a ring having outer diameter that is 45% of D is divided into two resistive heating member zones and a ring of which inner diameter of the outermost resistive heating member zone is 70% of D is divided into four resistive heating member zones, thus providing eight resistive heating member zone in all. Samples were made by setting the diameter of the circumscribed circle C of the four outermost resistive heating member zones to 310 mm. Then the power feeder sections 6 were fastened onto the resistive heating member 5 by brazing, thereby to make the plate-shaped ceramic member 2. In this example, the resistive heating member located at the center and the resistive heating member of ring shape located outside thereof were connected in series so as to control the heating operation simultaneously.

In Example 1, wafer support members were made with different values of the ratio of distance L1 between the linkage arc band to distance L4 between the arc bands (L1/L4× 100%).

The bottomed metal casing is constituted from a bottom made of aluminum with thickness of 2.0 mm and side wall made of aluminum with thickness of 1.0 mm, with a gas injection port, thermocouple and power terminals provided at predetermined position on the bottom. Distance between the bottom surface and the plate-shaped ceramic member was set to 20 mm.

The plate-shaped ceramic member was placed on the opening of the bottomed metal casing, and bolts were passed through the periphery with nuts screwed thereon while interposing a ring-shaped contact member and interposing an elastic member on the contact member side so that the plate-shaped ceramic member and the bottomed metal casing do not make direct contact with each other, so as to elastically fasten the members and make the wafer heating apparatus.

The contact member 17 was made in ring shape with L-shaped cross section. Top surface of the step of the L shape and the bottom surface of the plate-shaped ceramic member make contact in ring shape, and width of the contact surface with the plate-shaped ceramic member was set to 3 mm. The contact member was made of a heat resistant resin. The various wafer heating apparatuses made as described above will be identified as samples Nos. 1 through 9.

The wafer heating apparatuses were evaluated by using temperature measurement wafer 300 mm in diameter having temperature measuring resistors embedded at 29 positions. With power supply connected to each wafer heating apparatus, the wafer W was heated from 25 to 200° C. in five minutes. After setting the temperature of the wafer W to 200° C., the wafer W was removed and the temperature measurement wafer of the room temperature was placed on the mount surface. The time taken to raise the mean temperature of the wafer W and stabilized in a range of 200° C.±0.5° C. was measured as the response time. A process of raising the temperature 30 to 200° C. in five minutes and, after keeping this temperature for five minutes, cooling the wafer for 30 minutes is defined as one heating cycle. After repeating 1000 heating cycles, difference between maximum value and minimum value of the wafer temperature 10 minutes after setting from the room temperature to 200° C. was determined as the temperature difference of the wafer W.

Results of the measurements are shown in Table 1.

TABLE 1

| Sample No. 1 | Constitution of resistive heating member zone | Number of resistive heating member zones | L1/L4 × 100 (%) | Temperature difference of wafer (° C.) |
|---|---|---|---|---|
| * 1 | Plurality of circles, ring and fan shape | 8 | 20 | 1.20 |
| 2 | Plurality of circles, ring and fan shape | 8 | 30 | 0.49 |
| 3 | Plurality of circles, ring and fan shape | 8 | 40 | 0.39 |
| 4 | Plurality of circles, ring and fan shape | 8 | 50 | 0.28 |
| 5 | Plurality of circles, ring and fan shape | 8 | 60 | 0.38 |
| 6 | Plurality of circles, ring and fan shape | 8 | 80 | 0.43 |
| 7 | Plurality of circles, ring and fan shape | 8 | 90 | 0.47 |
| 8 | Plurality of circles, ring and fan shape | 8 | 95 | 0.49 |
| * 9 | Plurality of circles, ring and fan shape | 8 | 120 | 2.60 |

The symbol * indicates example of other than the present invention.

Sample No. 1 showed a large temperature difference of the wafer of 1.2° C. due to low L1/L4 ratio of 20%.

Sample No. 9 showed a large temperature difference of the wafer of 2.6° C. due to high L1/L4 ratio of 120%.

In samples Nos. 2 through 8 where distance between the pair of turn-back arc bands located on the same circle is smaller than the distance between arc bands that are adjacent to each other in the radial direction, excellent characteristic was obtained with small temperature difference of the wafer not larger than 0.5° C.

Samples Nos. 3 through 5 where ratio L1/L4 is in a range from 40 to 60% showed more excellent characteristic with small temperature difference of the wafer not larger than 0.39° C.

EXAMPLE 2

The plate-shaped ceramic member was made similarly to Example 1.

Through holes were formed at three points similarly to Example 1.

The resistive heating member 5 having thickness of 50 μm was formed similarly to Example 1.

The resistive heating member zone 4 was disposed in such an arrangement as one resistive heating member zone is formed in one circle having a diameter of D1 mm at the center, one ring-shaped resistive heating member zone is formed on the outside thereof, a ring having outer diameter D2 (mm) is divided into two resistive heating member zones and a ring of which inner diameter D3 of the outermost resistive heating member zone is divided into four resistive heating member zones, thus providing eight resistive heating member zone in all. Samples were made by setting the diameter of the circumscribed circle C of the four outermost resistive heating member zones to 310 mm, while changing the ratio of D1, D2 and D3. Then the power feeder sections 6 were fastened onto the resistive heating member 5 by brazing, thereby to make the plate-shaped ceramic member 2. In this example, the resistive heating member located at the center and the resistive heating member of ring shape located outside thereof were connected in series so as to control the heating operation simultaneously.

Figure 17:
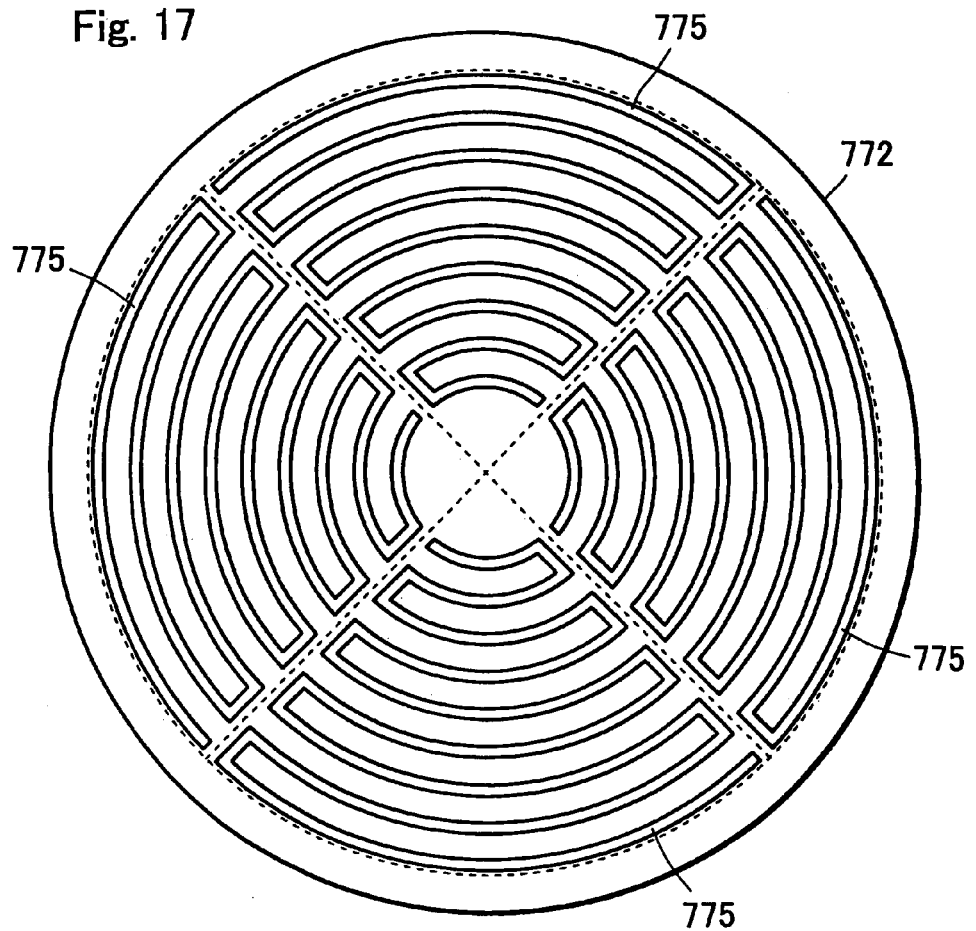
FIG. 17 is a schematic diagram showing the configuration of a resistive heating member of the prior art.
Figure 18:
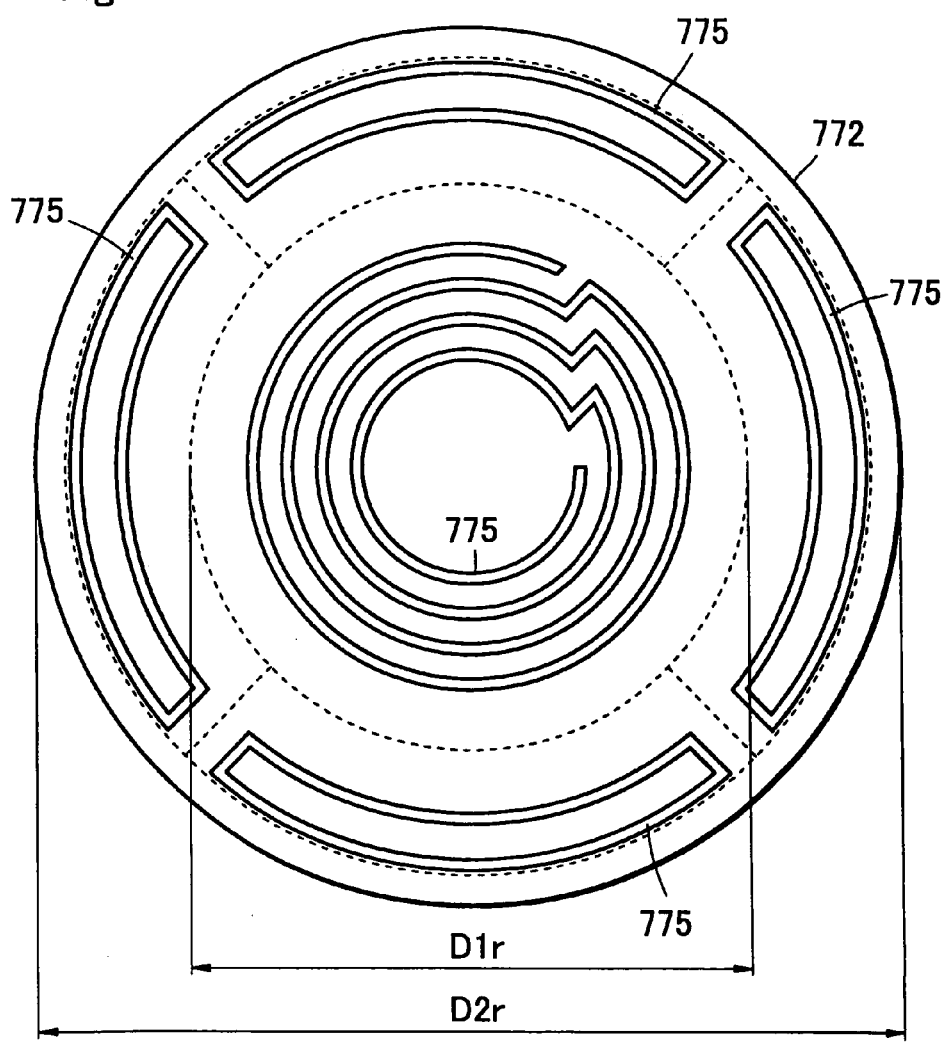
FIG. 18 is a schematic diagram showing the configuration of another resistive heating member of the prior art.
Figure 19:
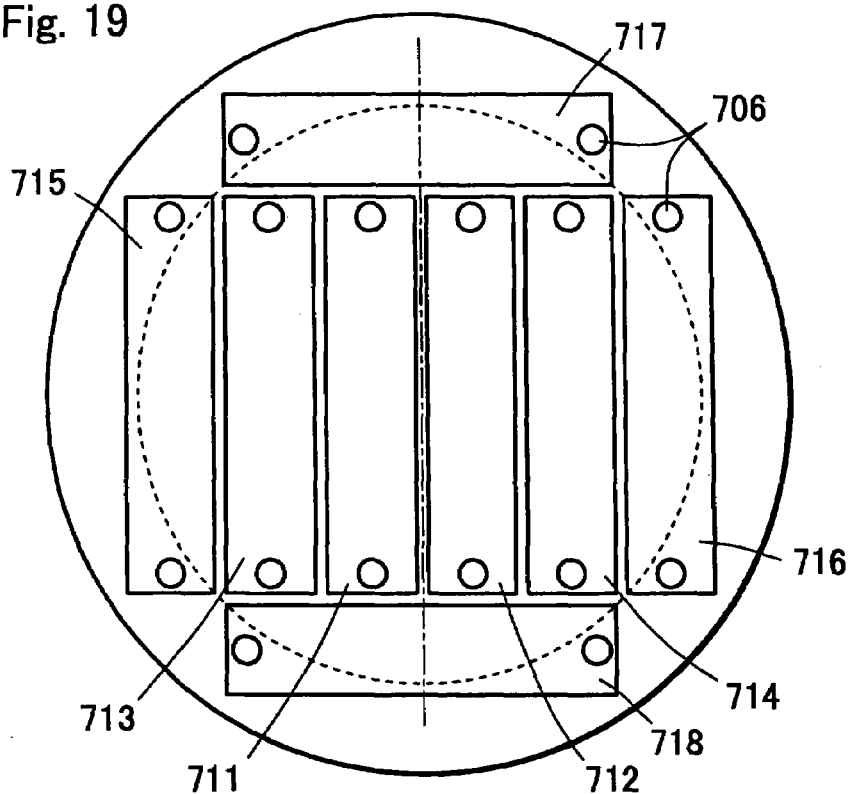
FIG. 19 is a schematic diagram showing the configuration of another resistive heating member of the prior art.

For the purpose of comparison, the resistive heating member zone having the constitution shown in FIG. 19 was made as sample No. 36 using eight rectangular heating zones each measuring 212 mm by 53 mm. Sample No. 37 is the resistive heating member zone having the constitution shown in FIG. 18 where D1$r$ is 150 mm and D2$r$ is 310 mm. Sample No. 38 is the resistive heating member zone having the constitution shown in FIG. 17. Sample No. 39 is a wafer heating apparatus having circular resistive heating member zone consisting of one resistive heating member.

The wafer heating apparatus of Example 2 was made by using the bottomed metal casing and the contact member 17 similar to those of Example 1 and fastening the plate-shaped ceramic member and the metal casing similarly to Example 1.

Various wafer heating apparatuses thus made are identified as samples Nos. 11 through 39.

The wafer heating apparatuses were evaluated by using a temperature measurement wafer 300 mm in diameter having temperature measuring resistors embedded at 29 positions, similarly to Example 1.

The results are shown in Table 2.

TABLE 2

| Sample No. | Constitution of resistive heating member zone | Number of resistive heating member zones | D1/D × 100 (%) | D2/D × 100 (%) | D3/D × 100 (%) | Temperature difference of wafer (° C.) | Response time (seconds) | |
|---|---|---|---|---|---|---|---|---|
| 11 | Plurality of rings, fan shape | 8 | 18 | 48 | 75 | 0.48 | 43 | |
| 12 | Plurality of rings, fan shape | 8 | 20 | 48 | 75 | 0.39 | 35 | |
| 13 | Plurality of rings, fan shape | 8 | 23 | 48 | 75 | 0.28 | 28 | |
| 14 | Plurality of rings, fan shape | 8 | 27 | 48 | 75 | 0.27 | 27 | |
| 15 | Plurality of rings, fan shape | 8 | 30 | 48 | 75 | 0.38 | 34 | |
| 16 | Plurality of rings, fan shape | 8 | 35 | 48 | 75 | 0.42 | 38 | |
| 17 | Plurality of rings, fan shape | 8 | 40 | 48 | 75 | 0.43 | 39 | |
| 18 | Plurality of rings, fan shape | 8 | 25 | 48 | 75 | 0.49 | 45 | |
| 19 | Plurality of rings, fan shape | 8 | 25 | 40 | 75 | 0.42 | 39 | |
| 20 | Plurality of rings, fan shape | 8 | 25 | 41 | 75 | 0.38 | 33 | |
| 21 | Plurality of rings, fan shape | 8 | 25 | 43 | 75 | 0.29 | 28 | |
| 22 | Plurality of rings, fan shape | 8 | 25 | 45 | 75 | 0.28 | 27 | |
| 23 | Plurality of rings, fan shape | 8 | 25 | 49 | 75 | 0.29 | 28 | |
| 24 | Plurality of rings, fan shape | 8 | 25 | 53 | 75 | 0.39 | 34 | |
| 25 | Plurality of rings, fan shape | 8 | 25 | 55 | 75 | 0.41 | 39 | |
| 26 | Plurality of rings, fan shape | 8 | 25 | 60 | 75 | 0.46 | 44 | |
| 27 | Plurality of rings, fan shape | 8 | 25 | 48 | 50 | 0.49 | 45 | |
| 28 | Plurality of rings, fan shape | 8 | 25 | 48 | 55 | 0.42 | 39 | ■ |
| 29 | Plurality of rings, fan shape | 8 | 25 | 48 | 60 | 0.41 | 38 | ■ |
| 30 | Plurality of rings, fan shape | 8 | 25 | 48 | 65 | 0.37 | 33 | ■ |
| 31 | Plurality of rings, fan shape | 8 | 25 | 48 | 67 | 0.22 | 26 | ■ |
| 32 | Plurality of rings, fan shape | 8 | 25 | 48 | 70 | 0.23 | 28 | ■ |
| 33 | Plurality of rings, fan shape | 8 | 25 | 48 | 80 | 0.38 | 33 | ■ |
| 34 | Plurality of rings, fan shape | 8 | 25 | 48 | 85 | 0.38 | 34 | ■ |
| 35 | Plurality of rings, fan shape | 8 | 25 | 48 | 90 | 0.45 | 48 | |
| * 36 | Rectangular | 8 | — | — | — | 2.40 | 63 | |
| * 37 | Conventional single ring | 5 | — | — | — | 1.80 | 55 | |
| * 38 | Fan shape | 4 | — | — | — | 2.50 | 73 | |
| * 39 | Single circle | 1 | — | — | — | 3.60 | 75 | |

The symbol * indicates example of other than the present invention.

The heater 1 of the samples Nos. 11 through 35 of the present invention showed excellent characteristics with temperature difference of the wafer W less than 0.5° C. and response time of 48 seconds or less. Nos. 11 through 35 are heaters 1 having a circular resistive heating member zone located at the center and three resistive heating member zones located in three concentric rings outside thereof. Samples Nos. 12 through 17, 19 through 25 and 28 through 34 shown in Table 1 showed even smaller temperature difference of the wafer W of 0.43° C. or less and response time of 39 seconds or less. Samples Nos. 12 through 17, 19 through 25 and 28 through 34 are heaters 1 where outer diameter D1 of the resistive heating member zone located at the center is in a range from 20 to 40% of the outer diameter D of the outermost resistive heating member zone, outer diameter D2 is from 40 to 55% of outer diameter D, and outer diameter D3 is from 55 to 85% of outer diameter D.

The wafer heating apparatuses of samples Nos. 12 through 15 where outer diameter D1 of the resistive heating member zone located at the center is in a range from 20 to 30% of the circumscribed circle D of the resistive heating member showed small temperature difference of the wafer of 0.39° C. or less and response time of 35 seconds or less. The wafer heating apparatuses of samples Nos. 13 and 14 where outer diameter D1 is in a range from 23 to 27% of D showed small temperature difference of the wafer of 0.28° C. or less and short response time of 28 seconds or less.

The wafer heating apparatuses of samples Nos. 20 through 24 where outer diameter D2 is in a range from 41 to 53% of D showed small temperature difference of the wafer of 0.39° C. or less and response time of 34 seconds or less. The wafer heating apparatuses of samples Nos. 21 through 23 where outer diameter D2 is in a range from 43 to 49% of D showed small temperature difference of the wafer of 0.29° C. or less and response time of 28 seconds or less.

The wafer heating apparatuses of samples Nos. 28 through 34 where outer diameter D3 is in a range from 55 to 85% of D showed small temperature difference of the wafer of 0.42° C. or less and response time of 39 seconds or less. The wafer heating apparatuses of samples Nos. 30 through 34 where outer diameter D3 is in a range from 65 to 85% of D showed favorable characteristics with small temperature difference of the wafer of 0.38° C. or less and response time of 34 seconds or less. The wafer heating apparatuses of samples Nos. 31 and 32 where outer diameter D3 is in a range from 67 to 70% of D showed more favorable characteristics with small temperature difference of the wafer of 0.23° C. or less and response time of 28 seconds or less.

Samples Nos. 36 through 39 that are out of the scope of the present invention showed unfavorable results with large temperature difference of the wafer of 1.8° C. or more and long response time of 55 seconds.

EXAMPLE 3

Relationship between the wiring configuration of the resistive heating member 5 and temperature difference across the surface of the wafer W was investigated on the heater 1 made with the value of resistance of sample No. 5 of Example 1 by changing the position of the resistive heating member 5.

Specifically, in order to study the relationship between the sizes of the inner diameters D22, D33, D0 of the ring-shaped resistive heating member zones 4b, 4cd, 4eh wherein the resistive heating members 5a through 5h and temperature difference across the wafer surface, temperature difference across the wafer surface and recovery time were measured by a method similar to Example 1 while changing the ratio of the inner diameters D22, D33, D0 of the resistive heating member zone 4 to the outer diameter D of the ring-shaped resistive heating member zone 4eh that is formed at the outermost position of the plate-shaped ceramic member as the reference. The results are shown in Table 3.

TABLE 3

| Sample No. | D1/D × 100 (%) | D22/D × 100 (%) | D2/D × 100 (%) | D33/D × 100 (%) | D3/D × 100 (%) | D0/D × 100 (%) | Maximum temperature difference across wafer W surface during transition (° C.) | Recovery time (seconds) | Temperature difference across wafer (° C.) | Maximum temperature difference across wafer W surface when raising temperature (° C.) | Temperature raising time (Seconds) |
|---|---|---|---|---|---|---|---|---|---|---|---|
| 41 | 23 | 25 | 50 | 61 | 73 | 91 | 4.2 | 39 | 0.39 | 4.2 | 38 |
| 42 | 23 | 34 | 50 | 61 | 73 | 91 | 3.8 | 36 | 0.37 | 3.3 | 33 |
| 43 | 25 | 36 | 50 | 61 | 73 | 91 | 2.9 | 32 | 0.31 | 3.1 | 30 |
| 44 | 27 | 38 | 50 | 61 | 73 | 91 | 2.3 | 30 | 0.30 | 2.8 | 25 |
| 45 | 30 | 41 | 53 | 61 | 73 | 91 | 2.8 | 32 | 0.32 | 3 | 31 |
| 46 | 33 | 45 | 55 | 61 | 73 | 91 | 3.8 | 37 | 0.40 | 3.3 | 32 |
| 47 | 40 | 50 | 50 | 61 | 73 | 91 | 4.7 | 41 | 0.48 | 4.1 | 37 |
| 48 | 27 | 38 | 50 | 45 | 73 | 91 | 4.2 | 39 | 0.43 | 4.2 | 38 |
| 49 | 27 | 38 | 50 | 55 | 73 | 91 | 3.9 | 36 | 0.40 | 3.2 | 32 |
| 50 | 27 | 38 | 50 | 58 | 73 | 91 | 2.8 | 32 | 0.34 | 2.9 | 29 |
| 51 | 27 | 38 | 50 | 61 | 73 | 91 | 2.2 | 30 | 0.29 | 2.7 | 23 |
| 52 | 27 | 38 | 50 | 63 | 73 | 91 | 2.7 | 33 | 0.33 | 2.9 | 28 |
| 53 | 27 | 38 | 50 | 65 | 78 | 91 | 3.8 | 37 | 0.39 | 3.3 | 32 |
| 54 | 27 | 38 | 50 | 70 | 73 | 91 | 4.3 | 45 | 0.47 | 4.7 | 39 |
| 55 | 27 | 38 | 50 | 61 | 73 | 80 | 4.3 | 39 | 0.43 | 4.2 | 38 |
| 56 | 27 | 38 | 50 | 61 | 73 | 85 | 3.8 | 38 | 0.40 | 3.3 | 32 |
| 57 | 27 | 38 | 50 | 61 | 73 | 88 | 2.9 | 33 | 0.34 | 2.8 | 28 |
| 58 | 27 | 38 | 50 | 61 | 73 | 91 | 2.3 | 30 | 0.30 | 2.5 | 24 |
| 59 | 27 | 38 | 50 | 61 | 73 | 93 | 2.8 | 34 | 0.33 | 2.8 | 27 |
| 60 | 27 | 38 | 50 | 61 | 73 | 95 | 3.8 | 38 | 0.40 | 3.2 | 33 |
| 61 | 27 | 38 | 50 | 61 | 73 | 96 | 4.3 | 39 | 0.43 | 4.2 | 38 |

As shown in Table 3, samples Nos. 42 through 46, 49 through 53 and 56 through 60 all showed small maximum temperature difference of 3.9° C. or less during transition, short response time of 39 seconds or less, and small temperature difference across the wafer surface of 0.4° C. or less.

This is because, in samples Nos. 42 through 46, 49 through 53 and 56 through 60, the inner diameter D22 of the ring-shaped resistive heating member zone 4*b* in a range from 34 to 45% of the outer diameter D of the ring-shaped resistive heating member zone 4*eh* formed at the outermost position of the plate-shaped ceramic member 2, the inner diameter D33 of the ring-shaped resistive heating member zone 4*cd* is in a range from 55 to 65% of the outer diameter D, and the inner diameter D0 of the ring-shaped resistive heating member zone 4*eh* is in a range from 85 to 93% of the outer diameter D.

Furthermore, samples Nos. 42 through 46, 49 through 53 and 56 through 60 showed excellent characteristics with small maximum temperature difference across the surface of the wafer W of 3.3° C. or less when raising the temperature and short temperature raising time of 33 seconds or less.

Samples Nos. 43 through 45 where inner diameter D22 is in a range from 36 to 41% of outer diameter D, samples Nos. 50 through 52 where inner diameter D33 is in a range from 58 to 63% of outer diameter D and samples Nos. 57 through 59 where inner diameter D0 of the ring-shaped resistive heating member zone 4*eh* is in a range from 88 to 93% of outer diameter D all showed small maximum temperature difference of 2.90° C. or less during transition, short recovery time of 34 seconds or less, small temperature difference across the wafer surface of 0.34° C. or less, small maximum temperature difference across the surface of the wafer W of 3.1° C. or less when raising the temperature and short temperature raising time of 31 seconds or less.

Moreover, sample No. 44 where inner diameter D22 is in a range from 37 to 40% of outer diameter D, sample No. 51 where inner diameter D33 is in a range from 59 to 62% of outer diameter D and samples Nos. 58 where inner diameter D0 of the ring-shaped resistive heating member zone 4*eh* is in a range from 89 to 92% of outer diameter D all showed most preferable results with small maximum temperature difference of 2.3° C. or less during transition, short recovery time of 30 seconds or less, small temperature difference across the wafer surface of 0.30° C. or less, small maximum temperature difference across the surface of the wafer W of 2.8° C. or less when raising the temperature and short temperature raising time of 25 seconds or less.

EXAMPLE 4

A plurality of plate-shaped ceramic members of different diameters were made similarly to Example 2.

Through holes were formed at three points similarly to Example 2.

The resistive heating member 5 having thickness of 50 μm was formed similarly to Example 2. The resistive heating member 5 was disposed similarly to Example 2, with diameter of the circumscribed circle C of the four outermost resistive heating members being set to 310 mm. Then the power feeder sections 6 were fastened onto the resistive heating member 5 by brazing, thereby to make the plate-shaped ceramic members 2 having different diameters.

The bottomed metal casing and the contact member were constituted similarly to Example 1 and Example 2. The plate-shaped ceramic member was placed on the opening of the bottomed metal casing, and bolts were passed through the periphery with nuts screwed thereon while interposing a ring-shaped contact member and interposing an elastic member on the contact member side so that the plate-shaped ceramic member and the bottomed metal casing do not make direct contact with each other, so as to elastically fasten the members and make the wafer heating apparatus of Example 4.

The wafer heating apparatuses thus made were evaluated similarly to Example 1.

The results are shown in Table 4.

TABLE 4

| | Sample No. | Ratio of diameter of circumscribed circle of resistive heating member 5 to diameter of plate-shaped ceramic member 2 (%) | Temperature difference of wafer (° C.) | Response time (Seconds) |
|---|---|---|---|---|
| | 145 | 85 | 0.48 | 35 |
| ○ | 146 | 90 | 0.28 | 29 |
| ○ | 147 | 92 | 0.16 | 25 |
| ○ | 148 | 93 | 0.16 | 24 |
| ○ | 149 | 95 | 0.16 | 25 |
| ○ | 150 | 96 | 0.24 | 27 |
| ○ | 151 | 97 | 0.26 | 28 |
| | 152 | 99 | 0.42 | 32 |

The symbol ○ indicates especially excellent characteristics.

Sample No. 145 shown in Table 4 where ratio of diameter of circumscribed circle of resistive heating member to diameter of plate-shaped ceramic member was 85% showed large difference in temperature across the wafer surface of 0.48° C. and particularly slow response time of 35 seconds.

Sample No. 152 where ratio of diameter of circumscribed circle of resistive heating member to diameter of plate-shaped ceramic member was as high as 99% showed relatively large difference in temperature across the wafer surface of 0.42° C. and somewhat slow response time of 32 seconds.

Samples Nos. 146 through 151, in contrast, showed small difference in temperature across the wafer surface of 0.28° C. and short response time of 29 seconds or less, indicating that ratio of diameter of circumscribed circle of the resistive heating member to diameter of the plate-shaped ceramic member is in a range from 90 to 97% in excellent wafer heating apparatuses.

EXAMPLE 5

The plate-shaped ceramic member was made similarly to Example 1.

The paste was printed to a thickness of 20 μm, and those made by varying the ratio of the area occupied by the resistive heating member to the area of the circumscribed circle that surrounds the resistive heating member were prepared.

Performance was evaluated similarly to Example 1. The results are shown in Table 5.

TABLE 5

| | Sample No. | Ratio of the area occupied by the resistive heating member 5 to the area of circumscribed circle that surrounds the band-shaped resistive heating member 5 (%) | Temperature difference of wafer (° C.) |
|---|---|---|---|
| | 160 | 3 | 0.35 |
| ○ | 161 | 5 | 0.24 |
| ◎ | 162 | 10 | 0.19 |
| ☆ | 163 | 15 | 0.13 |
| ☆ | 164 | 20 | 0.12 |
| ◎ | 165 | 25 | 0.18 |
| ○ | 166 | 30 | 0.23 |
| | 167 | 40 | 0.34 |

As shown in the case of sample No. 160, samples where the ratio of the area occupied by the resistive heating member to the area of the circumscribed circle that surrounds the resistive heating member is lower than 5% showed somewhat large temperature difference across the wafer surface of 0.35° C. When the ratio of the area occupied by the resistive heating member to the area of the circumscribed circle that surrounds the resistive heating member exceeded 30% as in the case of sample No. 167, the wafer showed hot area of higher temperature in part thereof, and showed somewhat large value of temperature difference across the wafer surface, that was 0.34° C.

Samples where the ratio of the area occupied by the resistive heating member to the area of the circumscribed circle that surrounds the resistive heating member was kept in a range from 5 to 30%, as in the cases of samples Nos. 161 through 166, showed excellent result with small values temperature difference across the wafer surface, not larger than 0.24° C.

When the ratio of the area occupied by the resistive heating member to the area of the circumscribed circle that surrounds the resistive heating member was controlled in a range from 10 to 25%, as in the cases of samples Nos. 162 through 165, temperature difference across the wafer surface could be controlled within 0.19° C. Further, when the ratio of the area occupied by the resistive heating member to the area of the circumscribed circle that surrounds the resistive heating member was controlled in a range from 15 to 20%, as in the cases of samples Nos. 163, 164, excellent result was obtained with temperature difference across the wafer surface being decreased to within 0.13° C.

EXAMPLE 6

In Example 6, samples were made similarly to Example 1 and were evaluated similarly to Example 1, except for providing the power feeder sections and the temperature measuring elements at positions shown in FIG. 4.

Eight kinds of wafer support members were made as samples Nos. 201 through 208 with different values of the ratio of distance L1 between the arc bands to distance L4 between the linkage arc bands (L1/L4×100%).

Figure 23:
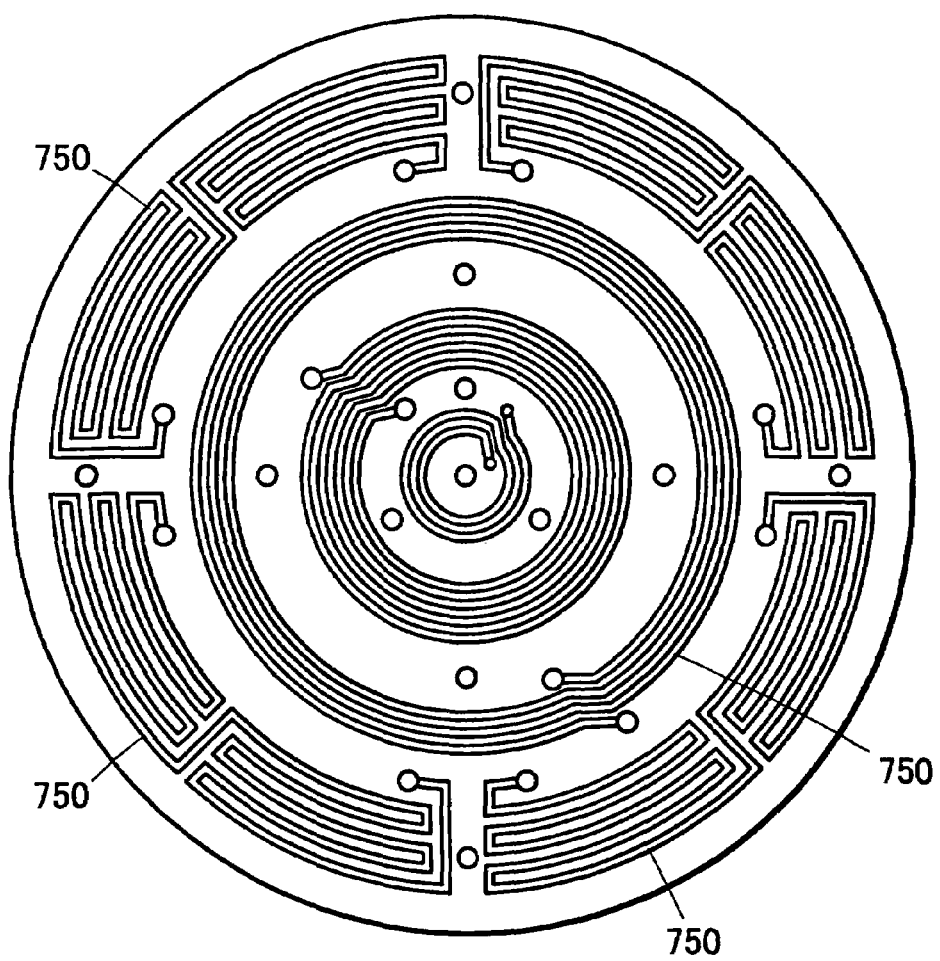
FIG. 23 is a schematic diagram showing the configuration of another resistive heating member of the prior art.
Figure 24:
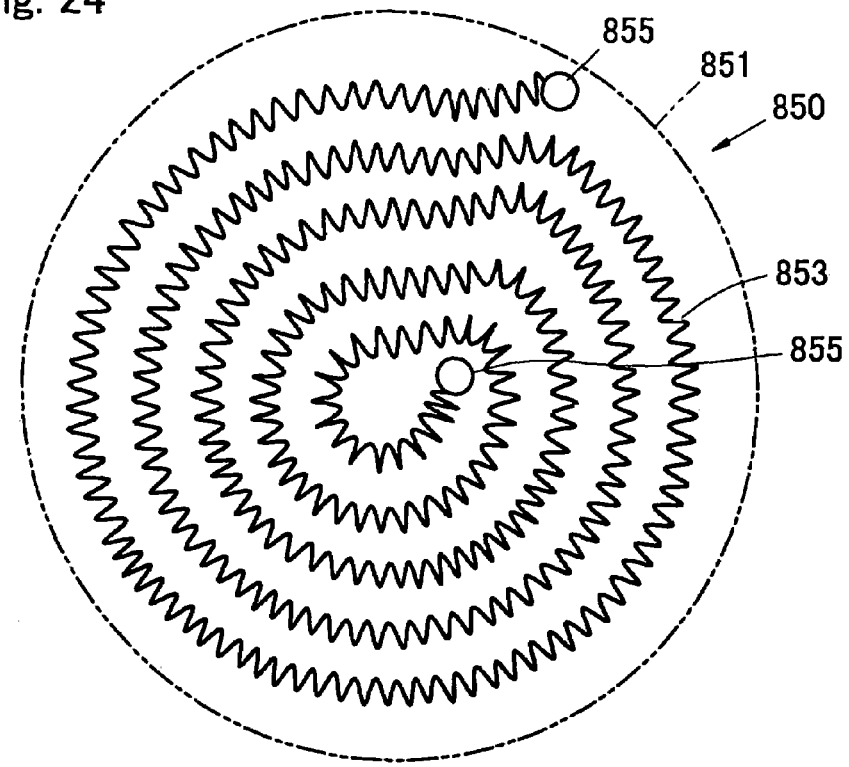
FIG. 24 is a schematic diagram showing the configuration of resistive heating member of the prior art.
Figure 25:
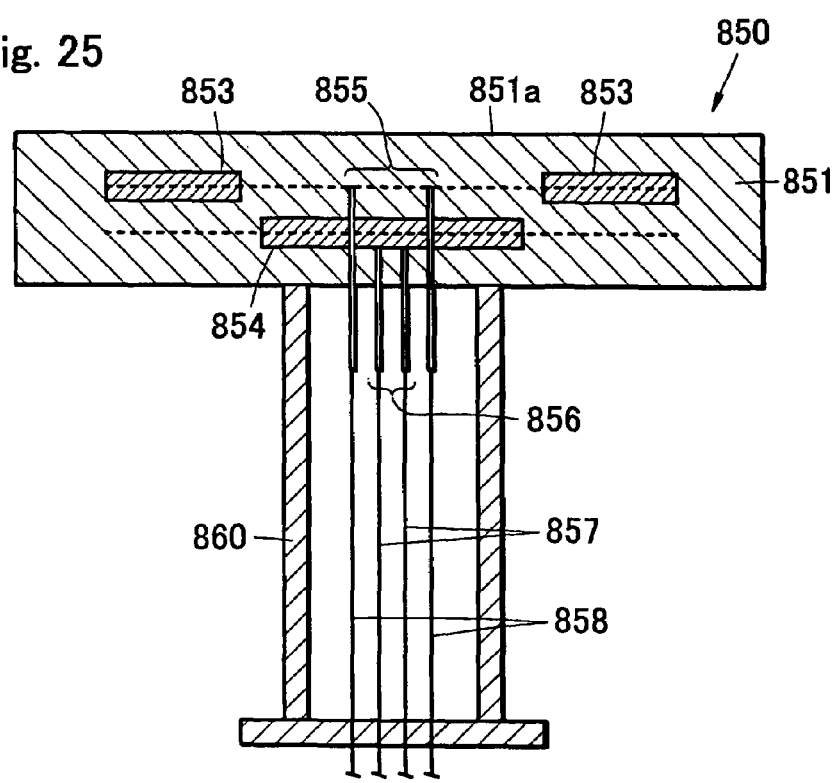
FIG. 25 is a schematic sectional view showing another ceramic heater of the prior art.

For comparison, a comparative example (sample No. 209) having the resistive heating member, the power feeder sections and the temperature measuring elements at positions shown in FIG. 23 were made and evaluated.

The results are shown in Table 6.

TABLE 6

| Sample No. | Constitution of resistive heating member zone | Form of resistive heating member and positions of power feeder sections and temperature measuring elements | L1/L4 × 100 (%) | Temperature difference of wafer (° C.) |
|---|---|---|---|---|
| 201 | Plurality of circles and fan shape | FIG. 4 | 25 | 0.49 |
| 202 | Plurality of circles and fan shape | FIG. 4 | 30 | 0.41 |
| 203 | Plurality of circles and fan shape | FIG. 4 | 40 | 0.37 |
| 204 | Plurality of circles and fan shape | FIG. 4 | 50 | 0.35 |
| 205 | Plurality of circles and fan shape | FIG. 4 | 60 | 0.36 |
| 206 | Plurality of circles and fan shape | FIG. 4 | 80 | 0.41 |
| 207 | Plurality of circles and fan shape | FIG. 4 | 90 | 0.47 |
| 208 | Plurality of circles and fan shape | FIG. 4 | 95 | 0.49 |
| * 209 | Plurality of spirals and fan shape | FIG. 12 | 120 | 1.73 |

The symbol * indicates example out of the scope of the present invention.

Sample No. 209 showed a large value of temperature difference across the wafer surface, 1.73° C., due to high L1/L4 ratio of 120%.

Samples Nos. 201 through 208, where distance between the pair of turn-back arc bands located on the same circle is smaller than the distance between arc bands that are adjacent to each other in the radial direction, showed excellent characteristic with small temperature difference of the wafer not larger than 0.5° C.

Samples Nos. 202 through 206, where L1/L4 ratio was in a range from 30 to 80%, showed more excellent characteristic with small temperature difference of the wafer not larger than 0.41° C.

EXAMPLE 7

In Example 7, samples Nos. 211 through 235 were made similarly to Example 2, except for partially changing the ratios D1/D×100%, D2/D×100% and D3/D×100%.

In Example 7, a ring-shaped empty region having width of 5% of diameter D was provided between the ring-shaped resistive heating member zones 4a, 4b with the power feeder section 6 and the through holes for lift pins being formed therein, and a ring-shaped empty region having width of 5% of diameter D was provided between the ring-shaped zones 4b, 4cd with the power feeder section 6 being formed therein. Also a ring-shaped empty region having width of 10% of diameter D was provided between the ring-shaped zones 4cd, 4eh with the wafer support pins and the power feeder sections 6 being formed therein.

Samples Nos. 211 through 235 were evaluated similarly to Example 2.

The results are shown in Table 7.

Samples Nos. 236 through 239 shown in Table 7 are comparative examples of Example 2 that provide data for comparison with the samples of Example 7.

TABLE 7

| Sample No. | Constitution of resistive heating member zone | Number of resistive heating member zones | D1/D × 100 (%) | D2/D × 100 (%) | D3/D × 100 (%) | Temperature difference of wafer (° C.) | Response time (Seconds) |
|---|---|---|---|---|---|---|---|
| 211 | Plurality of rings and fan shape | 8 | 18 | 50 | 75 | 0.49 | 45 |
| 212 | Plurality of rings and fan shape | 8 | 23 | 50 | 75 | 0.39 | 37 |

TABLE 7-continued

| Sample No. | Constitution of resistive heating member zone | Number of resistive heating member zones | D1/D × 100 (%) | D2/D × 100 (%) | D3/D × 100 (%) | Temperature difference of wafer (° C.) | Response time (Seconds) | |
|---|---|---|---|---|---|---|---|---|
| 213 | Plurality of rings and fan shape | 8 | 25 | 50 | 75 | 0.32 | 34 | |
| 214 | Plurality of rings and fan shape | 8 | 27 | 50 | 75 | 0.31 | 33 | |
| 215 | Plurality of rings and fan shape | 8 | 30 | 50 | 75 | 0.33 | 34 | |
| 216 | Plurality of rings and fan shape | 8 | 33 | 50 | 75 | 0.42 | 38 | |
| 217 | Plurality of rings and fan shape | 8 | 40 | 50 | 75 | 0.48 | 39 | |
| 218 | Plurality of rings and fan shape | 8 | 27 | 40 | 75 | 0.49 | 45 | |
| 219 | Plurality of rings and fan shape | 8 | 27 | 45 | 75 | 0.43 | 39 | |
| 220 | Plurality of rings and fan shape | 8 | 27 | 47 | 75 | 0.38 | 34 | |
| 221 | Plurality of rings and fan shape | 8 | 27 | 48 | 75 | 0.32 | 31 | |
| 222 | Plurality of rings and fan shape | 8 | 27 | 50 | 75 | 0.31 | 30 | |
| 223 | Plurality of rings and fan shape | 8 | 27 | 51 | 75 | 0.32 | 31 | |
| 224 | Plurality of rings and fan shape | 8 | 27 | 53 | 75 | 0.39 | 34 | |
| 225 | Plurality of rings and fan shape | 8 | 27 | 55 | 75 | 0.42 | 39 | |
| 226 | Plurality of rings and fan shape | 8 | 27 | 60 | 75 | 0.48 | 44 | |
| 227 | Plurality of rings and fan shape | 8 | 27 | 50 | 50 | 0.49 | 45 | |
| 228 | Plurality of rings and fan shape | 8 | 27 | 50 | 63 | 0.43 | 39 | ■ |
| 229 | Plurality of rings and fan shape | 8 | 27 | 50 | 68 | 0.38 | 34 | ■ |
| 230 | Plurality of rings and fan shape | 8 | 27 | 50 | 71 | 0.32 | 31 | ■ |
| 231 | Plurality of rings and fan shape | 8 | 27 | 50 | 73 | 0.31 | 27 | ■ |
| 232 | Plurality of rings and fan shape | 8 | 27 | 50 | 75 | 0.32 | 31 | ■ |
| 233 | Plurality of rings and fan shape | 8 | 27 | 50 | 78 | 0.37 | 34 | ■ |
| 234 | Plurality of rings and fan shape | 8 | 27 | 50 | 83 | 0.42 | 34 | ■ |
| 235 | Plurality of rings and fan shape | 8 | 27 | 50 | 90 | 0.49 | 48 | |
| * 236 | Rectangular | 8 | — | — | — | 2.40 | 63 | |
| * 237 | Conventional single ring | 5 | — | — | — | 1.80 | 55 | |
| * 238 | Fan shape | 4 | — | — | — | 2.50 | 73 | |
| * 239 | Single circle | 1 | — | — | — | 3.60 | 75 | |

The symbol * indicates example out of the scope of the present invention.

Among the heaters 1 of the present invention, the heaters 1 of samples Nos. 211 through 235 having a circular zone located at the center and zones in three concentric ring-shaped areas located outside thereof showed excellent characteristics with small temperature difference of the wafer less than 0.5° C. and response time of 48 seconds or less. Heaters 1 of samples Nos. 212 through 216, 219 through 225 and 228 through 234 in Table 7 where outer diameter D1 of the resistive heating member zone located at the center is in a range from 23 to 33% of the outer diameter D of the outermost zone, outer diameter D2 is from 40 to 55% of outer diameter D, and outer diameter D3 is from 63 to 83% of outer diameter D, showed excellent characteristics with small temperature difference of the wafer W less than 0.43° C. and response time of 39 seconds or less.

The heaters 1 of samples Nos. 213 through 215 in which outer diameter D1 of the zone located at the center is in a range from 25 to 30% of the circumscribed circle of the resistive heating member showed excellent characteristics with small temperature difference of the wafer less than 0.33° C. and response time of 34 seconds or less. The heater of sample No. 214 in which outer diameter D1 is in a range from 26 to 29% of D showed more satisfactory characteristics with small temperature difference of the wafer not larger than 0.31° C. and response time of 33 seconds or less.

The heaters of samples Nos. 220 through 224 in which outer diameter D2 is in a range from 47 to 53% of D showed satisfactory characteristics with small temperature difference of the wafer less than 0.39° C. and response time of 34 seconds or less. The heaters of samples Nos. 221 through 223 in which outer diameter D2 is in a range from 48 to 51% of D showed more satisfactory characteristics with small temperature difference of the wafer not larger than 0.32° C. and response time of 31 seconds or less.

The heaters of samples Nos. 229 through 233 in which outer diameter D3 is in a range from 68 to 78% of D showed satisfactory characteristics with small temperature difference of the wafer less than 0.38° C. and response time of 39 seconds or less. The heaters of samples Nos. 230 through 232 in which outer diameter D3 is in a range from 71 to 75% of D showed more satisfactory characteristics with small temperature difference of the wafer not larger than 0.32° C. and response time of 34 seconds or less. The heaters of samples Nos. 231 and 232 in which outer diameter D3 is in a range from 67 to 70% of D showed more satisfactory characteristics with small temperature difference of the wafer not larger than 0.23° C. and response time of 28 seconds or less.

Samples Nos. 236 through 239 that are out of the scope of the present invention, in contrast, showed large temperature difference across the wafer surface of 1.8° C. or more and slow response time of 55 seconds.

EXAMPLE 8

A plurality of disk-shaped plate-shaped ceramic members 2 measuring 3 mm in thickness and diameters in a range from 315 to 345 mm were made from sintered aluminum nitride, similarly to Example 7. Three through holes were formed in the plate-shaped ceramic member 2 at positions equi-spaced on a circle located at a distance of 60 mm from the center of the plate-shaped ceramic member 2, with diameter of the through holes being set to 4 mm.

The resistive heating members 5 were formed similarly to Example 7 and the heaters thus made were evaluated similarly to Example 7, so as to investigate the influence of the ratio of diameter of the circumscribed circle of the resistive heating members 5 to the diameter of the plate-shaped ceramic member 2 on the characteristics.

The results are shown in Table 8.

TABLE 8

| Sample No. | Ratio of diameter of circumscribed circle of the resistive heating members 5 to the diameter of the plate-shaped ceramic member (%) | Temperature difference of wafer (° C.) | Response time (Seconds) |
| --- | --- | --- | --- |
| 245 | 85 | 0.47 | 34 |
| ○ 246 | 90 | 0.31 | 31 |
| ○ 247 | 92 | 0.24 | 26 |
| ○ 248 | 93 | 0.23 | 25 |
| ○ 249 | 95 | 0.25 | 26 |
| ○ 250 | 96 | 0.29 | 31 |
| ○ 251 | 97 | 0.31 | 31 |
| 252 | 99 | 0.44 | 35 |

The symbol ○ indicates especially good characteristic.

Sample No. 245 shown in Table 8, where the ratio of diameter of circumscribed circle of the resistive heating members to the diameter of the plate-shaped ceramic member was at a low level of 85%, showed somewhat large temperature difference of the wafer, 0.47° C., and relatively slow response time of 34 seconds.

Sample No. 252 where the ratio of diameter of circumscribed circle of the resistive heating members to the diameter of the plate-shaped ceramic member was at a high level of 99%, showed somewhat large temperature difference of the wafer, 0.44° C., and relatively slow response time of 35 seconds.

Samples Nos. 246 through 251, in contrast, showed excellent characteristics with small temperature difference across the wafer surface not larger than 0.31° C. and short response time of 31 seconds or less, thus indicating that a good heater can be provided when the ratio of diameter of circumscribed circle of the resistive heating members to the diameter of the plate-shaped ceramic member is in a range from 90 to 97%.

Furthermore, samples Nos. 247 through 249, in which the ratio of diameter of circumscribed circle of the resistive heating members to the diameter of the plate-shaped ceramic member was is in a range from 92 to 95%, showed more satisfactory characteristics with small temperature difference across the wafer surface not larger than 0.25° C. and short response time of 26 seconds or less.

EXAMPLE 9

In Example 9, samples were made similarly to Example 6 by printing the paste to thickness of 20 μm and varying the ratio of the area occupied by the resistive heating member to the area of the circumscribed circle that surrounds the resistive heating member.

The samples were evaluated similarly to Example 6, with the results shown in Table 9.

TABLE 9

| Sample No. | Ratio of the area occupied by the band-shaped resistive heating member 5 to the area of the circumscribed circle C that surrounds the band-shaped resistive heating member 5 (%) | Temperature difference of wafer (° C.) |
| --- | --- | --- |
| 260 | 3 | 0.45 |
| 261 | 5 | 0.32 |
| 262 | 10 | 0.24 |
| 263 | 15 | 0.16 |
| 264 | 20 | 0.17 |
| 265 | 25 | 0.24 |
| 266 | 30 | 0.32 |
| 267 | 40 | 0.46 |

Samples having the ratio of the area occupied by the resistive heating member to the area of the circumscribed circle that surrounds the resistive heating member less than 5% such as sample No. 260 showed somewhat large temperature difference across the wafer surface, namely 0.45° C. When the ratio of the area occupied by the resistive heating member to the area of the circumscribed circle that surrounds the resistive heating member exceeded 30% as in the case of sample No. 267, the wafer showed hot area of higher temperature in part thereof, and showed somewhat large value of temperature difference across the wafer surface, 0.46° C.

Samples where the ratio of the area occupied by the resistive heating member to the area of the circumscribed circle that surrounds the resistive heating member was kept in a range from 5 to 30%, as in the cases of samples Nos. 261 through 266, showed excellent result with small values temperature difference across the wafer surface, not larger than 0.32° C.

When the ratio of the area occupied by the resistive heating member to the area of the circumscribed circle that surrounds the resistive heating member was controlled in a range from 10 to 25%, as in the cases of samples Nos. 262 through 265, temperature difference across the wafer surface could be controlled within 0.24° C. Further, when the ratio of the area occupied by the resistive heating member to the area of the circumscribed circle that surrounds the resistive heating member was controlled in a range from 15 to 20%, as in the cases of samples Nos. 263, 264, excellent result was obtained with temperature difference across the wafer surface being decreased to within 0.17° C.

EXAMPLE 10

In Example 10, such plate-shaped ceramic members as described below were made similarly to Example 1.

The sintered body of aluminum nitride was ground to make plate-shaped ceramic members 2 having disk shape measuring 3 mm in thickness and 330 mm in diameter, and plate-shaped ceramic members measuring 4 mm in thickness and 301 mm in diameter having a ring-shaped protrusion along the periphery with the middle portion being 3 mm thick.

Three through holes were formed at equi-spaced positions on a circle located at a distance of 60 mm from the center, diameter of the through holes being set to 4 mm.

Then the resistive heating members 5 having thickness of 50 μm were made by a method similar to that of Example 1.

In Example 10, the resistive heating member zone 4 was disposed in such an arrangement as one resistive heating member zone is formed in one circle at the center, a ring located outside of the former is divided into two fan-shaped resistive heating member zones and a ring located outside of the former is divided into four fan-shaped resistive heating member zones, thus providing seven resistive heating member zone in all, as shown in FIG. 10B.

The bottomed metal casing similar to that of Example 1 was used. The plate-shaped ceramic member was placed on the opening of the bottomed metal casing, and bolts were passed through the periphery while interposing a ring-shaped contact member so that the plate-shaped ceramic member and the bottomed metal casing do not make direct contact with each other, thereby making the heater.

The contact member 17 was made in ring shape with L-shaped cross section. Width of the step of the L shape was set to 5 mm, and width of the contact surface with the plate-shaped ceramic member was set to 4 mm. The contact member was made of a polybenzimidazole resin.

Then samples Nos. 301 through 304 were made by providing one inner protrusion at the center of the mount surface, three inner protrusions at a distance of 85 mm from the center, and five inner protrusions at a distance of 130 mm from the center.

Sample No. 301 was made by providing fastening holes having inner diameter of 3.5 mm located along the periphery of the plate-shaped ceramic member 2 and conical peripheral protrusions located at five equi-spaced positions with bolts 3 mm in diameter.

Sample No. 302 was made by providing fastening holes having inner diameter of 4.5 mm located along the periphery of the plate-shaped ceramic member 2 and securing cylindrical peripheral protrusions loosely at five equi-spaced positions with bolts 3 mm in diameter.

Sample No. 303 was made by providing fastening holes having inner diameter of 3 mm located along the periphery of the plate-shaped ceramic member and securing cylindrical peripheral protrusions firmly at five equi-spaced positions with bolts 3 mm in diameter.

Sample No. 304 is a heater of the prior art having ring-shaped protrusion provided along the periphery of the plate-shaped ceramic member protruding 1 mm above the mount surface.

Sample No. 305 is a heater of the prior art without inner protrusion, that has cylindrical peripheral protrusions secured loosely at five equi-spaced positions along the periphery of the plate-shaped ceramic member.

The heaters that were made as described above were evaluated by using a temperature measurement wafer 300 mm in diameter having temperature measuring resistors embedded at 29 positions. With power supply connected to each heater, the wafer W was heated from 25 to 200° C. in five minutes. After setting the temperature of the wafer W to 200° C., the wafer W was maintained until the mean temperature of the wafer W stabilized in a range of 200° C.±0.5° C. Then the wafer lift pins were moved up to remove the wafer W. After cooling the wafer W to the room temperature, the wafer was placed again on the heater. Time taken to bring the mean temperature of the wafer W within a range of 200° C.±0.5° C. was measured as the response time. After keeping the mean temperature of the wafer W at 200° C. for 30 minutes, temperature difference across the surface of the wafer W was measured.

The results are shown in Table 10.

TABLE 10

| Sample No. | Presence of isolated peripheral protrusion | Presence of ring-shaped peripheral protrusion | Presence of inner protrusion | Clearance between fastening hole and bolt (difference between inner diameter of fastening hole and bolt diameter) (mm) | Temperature difference across the wafer surface (° C.) | Response time (Seconds) |
|---|---|---|---|---|---|---|
| 301 | Present | None | Present | 0.5 | 0.31 | 32 |
| 302 | Present | None | Present | 1.5 | 0.35 | 35 |
| 303 | Present | None | Present | 0 | 0.42 | 52 |
| 304 | None | Present | Present | None | 0.41 | 63 |
| 305 | Present | None | None | 0.5 | 0.63 | 47 |

Samples Nos. 301, 302 are heaters of the present invention having isolated peripheral protrusion 304 located along the periphery of the mount surface, inner protrusion 8, and a clearance between bolt and fastening hole, wherein inner diameter of the fastening hole of the peripheral protrusion 304 is made larger than the diameter of the bolt. Samples Nos. 301, 302 show excellent characteristics with small value of temperature difference across the wafer surface, 0.31° C. and 0.35° C., and short response time of 32 and 35 seconds, respectively.

It was found that circular cross section of the profile of the peripheral protrusion parallel to the mount surface make excellent characteristics as shown by samples Nos. 301, 302.

Sample No. 303 where the cylindrical protrusion is firmly secured onto the mount surface along the periphery, in contrast, showed more heat transfer to the peripheral protrusion and relatively small temperature difference across the wafer surface 0.42° C., although slow response time of 52 seconds, thus making it impossible form uniform resist film.

Sample No. 304 where the ring-shaped protrusion is provided on the mount surface along the periphery showed relatively small temperature difference across the wafer surface of 0.41° C., although response time was as slow as 63 seconds, thus making it impossible form uniform resist film.

Sample No. 305 without inner protrusion showed large temperature difference across the wafer surface of 0.63° C., and relatively slow response time of 47 seconds.

Sample No. 301 having peripheral protrusion of conical shape showed better characteristics with smaller temperature difference across the wafer surface and shorter response time than sample No. 302 that has peripheral protrusion of cylindrical shape.

EXAMPLE 11

A plurality of disk-shaped plate-shaped ceramic members 2 measuring 3 mm in thickness and 330 mm in diameter were made similarly to Example 10. Three through holes were formed in the plate-shaped ceramic member at positions equi-spaced on a circle located at a distance of 60 mm from the center, diameter of the through holes being set to 4 mm, similarly to Example 10.

The resistive heating members 5 having thickness of 50 μm were formed similarly to Example 10 as follows. In Example 11, The resistive heating member 5 was disposed in such an arrangement as divided into circles and rings in the radial direction with a pattern formed in one circle at the center, patterns formed in two ring portion located on the outside thereof, and four patterns at the outermost position, thus providing seven patterns in all.

Samples were made by setting the diameter of the circumscribed circle C of the four outermost patterns to 310 mm, while changing the diameter of the plate-shaped ceramic member. Then the power feeder sections were fastened onto the resistive heating member by brazing, thereby to make the heater.

The bottomed metal casing similar to that of Example 10 was used. The plate-shaped ceramic member was placed on the opening of the bottomed metal casing, and bolts were passed through the periphery while interposing a L-shaped contact member and screwing nut via an elastic material placed on the contact member side so that the plate-shaped ceramic member and the bottomed metal casing do not make direct contact with each other, thereby making the heater.

Peripheral protrusion 304 having diameter of 10 mm was fastened onto the periphery by means of the bolts described above. Diameter of the inscribed circle of the peripheral protrusion 4 was set in a range from 300.0 to 315 mm.

The peripheral protrusion was made of aluminum nitride having 0.1 to 5% by weight of 96% purity alumina, mullite and yttria added thereto. Outer circumference of the peripheral protrusion was processed with a universal grinding machine and was, as required, polished with diamond abrasive particles thereby to make the peripheral protrusion 304 having the value of Ra being controlled in a range from 0.005 to 10.

Heaters having peripheral protrusions 304 of different values of heat conductivity were made as samples Nos. 321 through 329.

The heaters that were made as described above were evaluated by using a temperature measurement wafer 300 mm in diameter having temperature measuring resistors embedded at 29 positions. With power supply connected to each heater, the wafer W was heated from 25 to 200° C. in five minutes. After setting the temperature of the wafer W to 200° C., time taken for the wafer W to stabilize in the state of the mean temperature of the wafer W settled in a range of 200° C.±0.5° C. was measured as the response time. 10 minutes later, difference between the maximum value and minimum value of the wafer temperature was determined as the temperature difference across the surface of the wafer W. Then the wafer lift pins were moved up to remove the wafer W by means of a handling arm that is not shown in the drawing. After placing the wafer W from the handling arm onto the wafer lift pins, the wafer lift pins were lowered so as to place the wafer W on top of the inner protrusion while guiding the wafer W along the peripheral protrusion. 3 minutes later, the wafer lift pins were moved up again so as to remove the wafer W. This cycle was loading and unloading the wafer W was repeated 1000 times. Then particles deposited on the back surface of the wafer W in the peripheral portion 20 mm wide and the side face were counted with a particle counter manufactured by TENKOR Inc.

The results are shown in Table 11.

TABLE 11

| Sample No. | Heat capacity A of peripheral protrusion (J/K) | Material of peripheral protrusion | Heat capacity B of plate-shaped ceramic member corresponding to peripheral protrusion (J/K) | A/B | Surface roughness Ra of side face of peripheral protrusion | Minimum diameter of inscribed circle of peripheral protrusion (mm) | Maximum diameter of inscribed circle of peripheral protrusion (mm) | Temperature difference across the surface of wafer W (° C.) | Response time (Seconds) | Number of particles |
|---|---|---|---|---|---|---|---|---|---|---|
| 321 | 1.6 | 99% purity alumina | 0.63 | 2.54 | 4.5 | 300.3 | 309.0 | 0.35 | 35 | 3542 |
| 322 | 1.4 | Aluminum nitride containing 5% by weight of $Y_2O_3$ | 0.63 | 2.22 | 0.3 | 300.2 | 310.0 | 0.32 | 34 | 1874 |
| 323 | 0.65 | Aluminum nitride containing 5% by weight of $Y_2O_3$ | 0.63 | 1.03 | 0.1 | 300.5 | 302.5 | 0.14 | 21 | 957 |
| 324 | 0.83 | 99% purity alumina | 0.63 | 1.32 | 0.1 | 300.5 | 302.5 | 0.20 | 22 | 983 |
| 325 | 0.83 | 99% purity alumina | 0.63 | 1.32 | 0.3 | 300.5 | 302.5 | 0.20 | 23 | 988 |
| 326 | 0.94 | 99% purity alumina | 0.63 | 1.49 | 0.4 | 300.5 | 302.5 | 0.23 | 25 | 1352 |

TABLE 11-continued

| Sample No. | Heat capacity A of peripheral protrusion (J/K) | Material of peripheral protrusion | Heat capacity B of plate-shaped ceramic member corresponding to peripheral protrusion (J/K) | A/B | Surface roughness Ra of side face of peripheral protrusion | Minimum diameter of inscribed circle of peripheral protrusion (mm) | Maximum diameter of inscribed circle of peripheral protrusion (mm) | Temperature difference across the surface of wafer W (° C.) | Response time (Seconds) | Number of particles |
|---|---|---|---|---|---|---|---|---|---|---|
| 327 | 1.2 | 99% purity alumina | 0.56 | 2.14 | 0.2 | 300.5 | 302.5 | 0.31 | 31 | 1756 |
| 328 | 1.4 | 99% purity alumina | 0.56 | 2.50 | 0.2 | 300.5 | 302.5 | 0.34 | 34 | 1895 |
| 329 | 1.7 | 99% purity alumina | 0.56 | 3.04 | 0.3 | 300.3 | 309.0 | 0.40 | 35 | 1985 |

Table 11 shows that samples Nos. 321 through 329, where the bolts that fasten the peripheral protrusion penetrate the plate-shaped ceramic member so as to clamp the plate-shaped ceramic member and the casing together, all show small temperature difference across the surface of the wafer W of 0.4° C. or less and short temperature raising time of 35 seconds or less.

It was found that number of particles generated can be suppressed to 2000 or less when surface roughness Ra of the outer circumference of the peripheral protrusion is smaller than 3.0 as in samples Nos. 322 through 329.

Sample No. 329 shown in Table 11, in particular, showed somewhat large temperature difference across the surface of the wafer W of 0.40° C. and relatively slow response time of 35 seconds, due to the heat capacity of the peripheral protrusion as high as 1.7 (J/K).

Samples Nos. 322 through 328, where heat capacity of the peripheral protrusion is smaller than 3 times the heat capacity of plate-shaped ceramic member that corresponds to the peripheral protrusion, show small temperature difference across the surface of the wafer W of 0.34° C. or less and short response time of 34 seconds or less.

Further, samples Nos. 323 through 326, where heat capacity of the peripheral protrusion is smaller than 1.5 times the heat capacity of plate-shaped ceramic member that corresponds to the peripheral protrusion, show favorable results with small temperature difference across the surface of the wafer W of 0.23° C. or less and short response time of 25 seconds or less.

As the inner protrusion is formed to protrude 0.05 to 0.5 mm above the mount surface, while at least one inner protrusion is disposed within a range 0.5 times the diameter of the circle inscribed to the inner protrusion and at least three inner protrusions are disposed within a range 0.5 to one times the diameter of the inscribed circle in a concentric arrangement, all showed favorable results with temperature difference across the surface of the wafer W of 0.4° C. or less.

EXAMPLE 12

In Example 12, samples were made as follows.

2.0% by weight of yttrium oxide was added to aluminum nitride powder, and the mixture was put into a ball mill together with isopropyl alcohol and urethane balls and kneaded for 48 hours, thereby to prepare a slurry of aluminum nitride. After mixing with an acrylic binder, the slurry of aluminum nitride was passed through a sieve of #200 mesh to remove urethane balls and particles that have come off the ball mill wall, and was dried by spray drying in an explosion-proof drier, thereby to make granulated powder of aluminum nitride.

The powder was put into a mold 240 mm in diameter, to make a green compact having thickness of 30 mm. Grooves were formed on the green compact at the position to embed the coil-shaped resistive heating member.

The resistive heating member was formed in a shape similar to that shown in FIG. 12, where additional resistive heating member was disposed outside of the resistive heating member 405o located at the center of the plate-shaped ceramic member. Green compacts were prepared having various grooves at positions corresponding to the positions of the resistive heating member with L401 to L407 being set to 12 mm while varying d401 to d407 substantially in correspondence to FIG. 12. An annealed molybdenum coil having power feeder sections connected thereto and formed in the shape of the groove was inserted into the groove, and the granulated powder of aluminum nitride was put into the groove so as to cover the top of the coil. The granulated powder was pressed from above with a fixture formed in the groove shape. The granulated powder was placed again in the recess formed by the pressing over the groove, and was pressed again, so that the surface of the granulated powder became substantially flush with the surrounding surface of the green compact.

The green compact having the resistive heating member embedded therein was heated to 500° C. for one hour to remove the binder. The green compact from which the binder was removed was put into a carbon mold and was heated to 1800° C. while applying a pressure of 34 MPa, thereby to obtain the sintered ceramic material with the resistive heating member embedded therein.

The sintered material was ground on the circumference and the top and bottom surfaces, thereby to make the plate-shaped ceramic member. The power feeder sections were drilled and power terminals were brazed so as to make the heater.

The ceramic heater was placed in a vacuum chamber and a semiconductor wafer was placed on the mount surface. After raising the temperature at a rate of 20° C. per minute till the preset temperature was reached, the wafer was maintained at the preset temperature of 500° C. for 10 minutes. Then temperature difference across the wafer surface was measured by means of thermoviewer through a sight glass from the outside. The results of measurements are shown in Table 12.

TABLE 12

| Sample No. | (d1/L1) × 100 = (d2/L1) × 100 (%) | (d3/L3) × 100 = (d4/L3) × 100 (%) | (d5/L5) × 100 = (d6/L5) × 100 (%) | (d7/L7) × 100 (%) | Temperature difference across the wafer surface (° C.) |
|---|---|---|---|---|---|
| 401 | 28 | 28 | 20 | 20 | 2.1 |
| 402 | 40 | 40 | 30 | 30 | 1.4 |

TABLE 12-continued

| Sample No. | (d1/L1) × 100 = (d2/L1) × 100 (%) | (d3/L3) × 100 = (d4/L3) × 100 (%) | (d5/L5) × 100 = (d6/L5) × 100 (%) | (d7/L7) × 100 (%) | Temperature difference across the wafer surface (° C.) |
|---|---|---|---|---|---|
| 403 | 50 | 50 | 40 | 40 | 1.3 |
| 404 | 80 | 80 | 60 | 60 | 1.5 |
| 405 | 100 | 100 | 80 | 80 | 1.9 |
| 406 | 120 | 110 | 90 | 90 | 2.5 |
| * 407 | 130 | 130 | 130 | 130 | 5 |
| * 408 | 160 | 150 | 150 | 150 | 15 |

The symbol * indicates example out of the scope of the present invention.

Samples Nos. 401 through 406 of the present invention where distance between the pair of turn-back resistive heating member located on the same circle is smaller than the distance between the center lines of the arc bands that are adjacent to each other in the radial direction, showed favorable characteristics with small temperature difference across the surface of the wafer W not larger than 2.5° C.

Samples Nos. 402 through 405 where distance between the pair of turn-back resistive heating member located on the same circle is in a range from 30% to 80% of the distance between the center lines of the arc bands that are adjacent to each other in the radial direction, showed more favorable characteristic with small temperature difference across the surface of the wafer W not larger than 1.9° C.

Samples Nos. 407, 408 where distance between the pair of turn-back resistive heating member located on the same circle is 1.3 time or 1.5 times as large as the distance between the center lines of the arc bands that are adjacent to each other in the radial direction, showed cold spot appearing between adjacent arcs and temperature difference across the surface of the wafer as large as 5° C. or 15° C., and could not be used as the ceramic heater for the latest semiconductor manufacturing apparatus.

EXAMPLE 13

In Example 13, ceramic heaters having the same groove for the resistive heating member as that of the sample No. 405 of Example 12 and the outermost pitch of the coil being adjusted were made similarly to Example 12.

The ceramic heater was placed in a vacuum chamber, and the temperature was raised from 20° C. to 600° C. at a rate of 20° C. per minute. Temperature difference across the mount surface was measured by means of thermoviewer when the temperature was crossing 500° C. point during heating. The results are shown in Table 13.

TABLE 13

| Sample No. | Pitch of resistive heating member except for outermost one (mm) | Pitch of outermost resistive heating member (mm) | Temperature difference across the surface of the mount surface when passing 500° C. (° C.) |
|---|---|---|---|
| 411 | 4.8 | 3.4 | 13 |
| 412 | 4.8 | 3.7 | 14 |
| 413 | 4.8 | 4.1 | 16 |
| 414 | 4.8 | 4.4 | 18 |
| 415 | 4.8 | 4.7 | 21 |
| 416 | 4.8 | 4.8 | 34 |

Samples Nos. 411 through 415 where pitch of the outermost coil-resistive shaped resistive heating member of the concentric configuration is smaller than the pitch of the resistive heating member located inside thereof show excellent characteristic with temperature difference across the mount surface not larger than 21° C.

EXAMPLE 14

Figure 13:
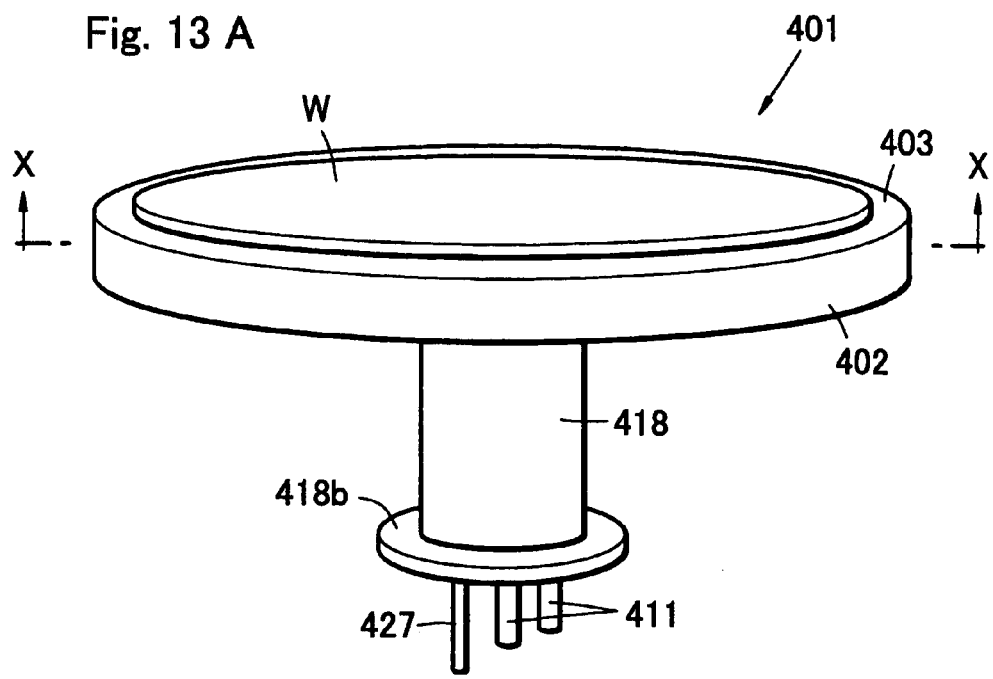
FIG. 13A is a schematic perspective view showing the constitution of the ceramic heater according to the variation of the present invention.
FIG. 13B is a schematic sectional view taken along lines X-X of FIG. 13A.
Figure 13:
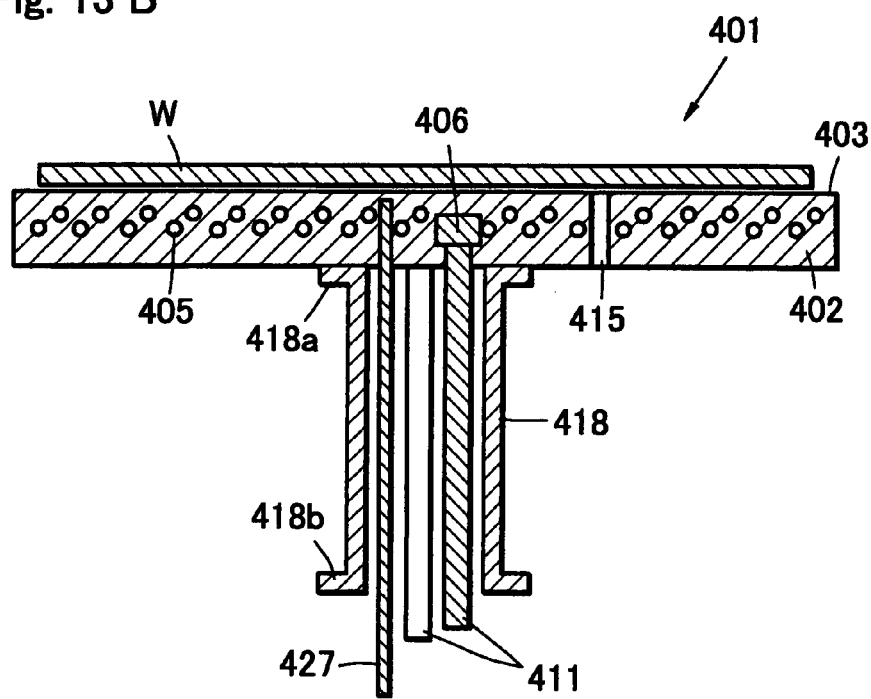

In Example 14, plate-shaped ceramic members were made with varying coil pitches of the resistive heating member by a method similar to that of Example 12, and ceramic heaters were made by joining a cylindrical support member on the surface opposite to the mount surface by diffusion welding as shown in FIG. 13. The heater was placed in a vacuum chamber with a wafer placed on the mount surface, and the temperature difference of the mount surface during transition was measured similarly to Example 13. The results are shown in Table 14.

TABLE 14

| Sample No. | Pitch of spiral coil located inside of support member (mm) | Pitch of spiral coil located outside support member (mm) | Pitch of outermost resistive heating member (mm) | Temperature difference across the surface of the mount surface when passing 500° C. (° C.) |
|---|---|---|---|---|
| 431 | 1.9 | 4.8 | 3.8 | 15 |
| 432 | 2.2 | 4.8 | 3.8 | 14 |
| 433 | 2.9 | 4.8 | 3.8 | 15 |
| 434 | 3.3 | 4.8 | 3.8 | 16 |
| 435 | 4.1 | 4.8 | 3.8 | 17 |
| 436 | 4.8 | 4.8 | 3.8 | 23 |

Samples Nos. 431 through 435, where cylindrical support member 418 was joined on the other principal surface of the plate-shaped ceramic member 402 and coil pitch of resistive heating member located inside of the cylindrical support member 418 is smaller than the coil pitch of resistive heating member located outside of the cylindrical support member 8, show excellent characteristic with temperature difference across the mount surface not larger than 17° C. when the temperature was crossing 500° C. point during heating.

Sample No. 436, in which coil pitch of the resistive heating member located inside of the cylindrical support member 418 is the same as the coil pitch of the resistive heating member located outside of the cylindrical support member 418, show somewhat larger temperature difference across the surface of the wafer of 23° C. when the temperature was crossing 500° C. point during heating. These results show that temperature difference across the mount surface becomes larger in the case of ceramic heaters having the cylindrical support member joined onto the plate-shaped ceramic member.

EXAMPLE 15

In Example 15, ceramic heaters 401 were made by joining a cylindrical support member 8 while varying configuration of embedding the resistive heating member 405 similarly to Example 13.

Of the configuration Q of the resistive heating member 405 embedded in the plate-shaped ceramic member 402, the resistance density (R1/S1) per unit area of the resistive heating member 405a in a region Q1 located inside of the cylindrical support member 418 that was joined and the resistance density (R2/S2) per unit area of the resistive heating member 405b in a region Q2 located outside of the cylindrical support member 418 were measured, with the results of 0.019 Ω/cm² and 0.015 Ω/cm², respectively, indicating that resistance (R1/S1) was 1.27 times the value of resistance (R2/S2).

Then after polishing one of the principal surfaces of the plate-shaped ceramic member 402 thus obtained to form the mount surface 3 having mean roughness (Ra) of 0.1 μm and forming two recesses that communicate with the resistive heating member 405 on the other principal surface of the plate-shaped ceramic member 402, power terminals 405 made of Fe—Co—Ni alloy are brazed in the recess using silver-copper solder, thereby to make the heater 401.

The cylindrical support member 418 made of the same ceramic material of aluminum nitride as the plate-shaped ceramic member 402 having the flange 8a measuring 70 mm in outer diameter and 8 mm in width was joined on the bottom surface of the ceramic heater 400 by diffusion welding. This heater 400 was used as sample No. 441.

As a comparative example, a ceramic heater (sample No. 442) was made by joining the cylindrical support member 418 on a plate-shaped ceramic member of which resistance densities R1/S1 and R1/S1 are both 0.015 $\Omega/cm^2$.

AC voltage of 200 V was applied to the heater made described above, so as to heat the mount surface 3 at a rate of 20° C. per minute to a preset temperature of 700° C. After maintaining this temperature for 10 minutes, temperature of the mount surface 3 was measured with a radiation thermometer (product name: Thermoviewer). Results of measurement are shown in Table 15.

TABLE 15

| Sample No. | Resistance density (R1/S1) on the inside of cylindrical support member | Resistance density (R2/S2) on the outside of cylindrical support member | (R1/S1)/(R2/S2) | Temperature difference across the wafer surface at 700° C. (° C.) |
|---|---|---|---|---|
| 441 | 0.019 | 0.015 | 1.27 | 3 |
| 442 | 0.015 | 0.015 | 1.00 | 6 |

Resistance density R1/S1 on the inside of the cylindrical support member 418 is calculated from the area S1 of the plate-shaped ceramic member 402 within the cylindrical support member 418 joined thereto and resistance R1 of the region encompassed within the cylindrical support member 418. Resistance density R2/S2 on the outside of the cylindrical support member 418 is calculated from the area S2 outside of the cylindrical support member 8 and resistance R2 of the region outside of the cylindrical support member 418. Temperature difference across the wafer surface can be controlled within 3° C. with mean temperature being 700° C., maximum temperature being 702° C. and minimum temperature being 699° C., when the wafer is placed on the mount surface 3 of the sample No. 441 of which resistance density (R1/S1) is larger than resistance density (R2/S2). Thus high uniformity of heating can be achieved with the temperature variation controlled within 0.5% of the preset temperature of 700° C.

Sample No. 442 for comparison is a ceramic heater made by a method similar to that of the example with the same heating pattern as shown in FIG. 15A, except for embedding a resistive heating member of which resistance is not adjusted in the ceramic member. AC voltage of 200 V was applied to this heater to cause the mount surface 3 to heat. The mount surface 3 showed maximum temperature of 703° C. and minimum temperature being 697° C., with the temperature variation of 1% of the preset temperature of 700° C.

EXAMPLE 16

In Example 16, values of resistance density R1/S1 per unit area of the resistive heating member 405a in the region Q1 located on the inside of cylindrical support member 8 and resistance density R2/S2 per unit area of the resistive heating member 405b in the region Q2 located on the outside of cylindrical support member 418 are made different in the ceramic heater 400 of Example 15. Similarly to Example 14, temperature difference across the wafer surface was measured when the temperature was crossing 500° C. point during heating up to 600° C.

After raising the temperature at a rate of 20° C. per minute from room temperature to 700° C. and maintaining at this temperature for 10 minutes, the temperature was lowered quickly. While repeating this temperature cycle, presence of gas leakage from the joint interface between the plate-shaped ceramic member 402 and the cylindrical support member 8 was checked thereby to evaluate the durability of the heater 400.

Gas leakage was checked at intervals of 10 temperature cycles. Gas leakage from the joint interface was detected by a helium leak tester at the room temperature. The results are shown in Table 16.

TABLE 16

| Sample No. | Resistance density (R1/S1) on the inside of cylindrical support member | Resistance density (R2/S2) on the outside of cylindrical support member | (R1/S1)/(R2/S2) | Number of temperature cycles before gas leaks from joint interface | Temperature difference across the wafer surface when passing 500° C. (° C.) |
|---|---|---|---|---|---|
| 451 | 0.015 | 0.015 | 1.00 | 1160 times | 31 |
| 452 | 0.0157 | 0.015 | 1.05 | 2010 times | 19 |
| 453 | 0.017 | 0.015 | 1.13 | 2500 or more times | 12 |
| 454 | 0.019 | 0.015 | 1.27 | 2500 or more times | 11 |
| 455 | 0.021 | 0.015 | 1.40 | 2500 or more times | 12 |
| 456 | 0.0225 | 0.015 | 1.50 | 2160 times | 17 |

Thus it can be seen that durability against temperature cycles can be increased with less probability of gas leakage, by controlling the resistance density (R1/S1) in a range from 1.05 to 1.5 times the resistance density (R2/S2). It was also found that especially excellent characteristic can be achieved with durability to 2500 temperature cycles by controlling the resistance density (R1/S1) in a range from 1.13 to 1.4 times the resistance density (R2/S2).

Samples Nos. 452 through 456 which showed temperature difference of 20° C. or less across the mount surface when crossing 500° C. demonstrated 2000 or more durable temperature cycles, indicating that those having smaller temperature difference across the mount surface experiences less thermal stress and has higher durability.

What is claimed is:

1. A heater comprising
a plate-shaped member having a first principal surface which is a mount surface whereon an object to be heated is placed,
a second principal surface,
a plurality of resistive heating members provided therein or on the second principal surface and a plurality of resistive heating member zones each having one of the resistive heating members,
the resistive heating member zones further comprising a circular central resistive heating member zone, first resistive heating member zones in which a first ring-shaped resistive heating member zone positioned outermost and concentric with the circular central resistive heating member zone is divided equally by a plurality of first boundaries in the radial direction, and second resistive heating member zones in which a second ring-shaped resistive heating member zone positioned inside of the first ring-shaved resistive heating member zone is divided equally by a plurality of second boundaries in the radial direction,
wherein, the first boundaries and the second boundaries are not aligned on one line;
wherein one of the resistive heating members is formed in a continuous band having at least two arc bands located on one of two concentric circles of different radii, at least one arc band located on the other circle, and linkage arc bands each of which connects the arc band located on the one circle and the arc band located on the other circle, said linkage arc bands being located adjacent to each other; and
wherein the distance between the adjacent linkage arc bands is smaller than the distance between the arc band located on the one circle described above and the arc band located on the other circle.

2. The heater according to claim 1; wherein the distance between the adjacent linkage arc bands is set in a range from 30% to 80% of the distance between the arc bands.

3. The heater according to claim 1; a third resistive heating member zone having one of the resistive heating members is formed between the second resisting heating member zone and the circular central resistive heating member zone.

4. The beater according to claim 1; wherein the number of divisions of the second ring-shaped resistive heating member zone and the number of divisions of the first ring-shaped resistive heating member zone are different.

5. The heater according to claim 3; wherein the resistive heating member provided in the central resistive heating member zone and the resistive heating member provided in the third ring-shaped resistive heating member zone are connected in parallel.

6. The heater according to claim 3; wherein a through hole is provided between the central resistive heating member zone and the first ring-shaped resistive heating member zone so as to penetrate the plate-shaped member.

7. The heater according to claim 1; comprising three or more peripheral protrusions provided along the periphery of the mount surface and inner protrusions that are lower than the peripheral protrusions in height, the inner protrusions being provided inside of the peripheral protrusions, wherein the peripheral protrusions are held so as to be movable at least in one of the radial direction of the plate-shaped member and a direction perpendicular thereto.

8. The heater according to claim 7; further comprising power terminals for supplying electric power to the resistive heating member, a cooling nozzle for cooling the plate-shaped member and an opening, a casing that covers the power terminals and the other surface of the plate-shaped member and clamp bolts that clamp the peripheral protrusions onto the plate-shaped member, wherein the clamp bolts penetrate through the plate-shaped member from one surface to the other surface so as to fasten the casing.

9. The heater according to claim 8; wherein a periphery of the plate-shaped member is pressed by clamp fittings.

10. A wafer heating apparatus having a heater according to claim 1.

* * * * *